United States Patent [19]

Bashark

[11] Patent Number: 5,564,831
[45] Date of Patent: Oct. 15, 1996

[54] METHOD AND APPARATUS FOR DETECTING THE TEMPERATURE OF AN ENVIRONMENT

[75] Inventor: Larry T. Bashark, St. Joseph Township, Berrien County, Mich.

[73] Assignee: Whirlpool Corporation, Benton Harbor, Mich.

[21] Appl. No.: 185,743

[22] Filed: Jan. 24, 1994

Related U.S. Application Data

[60] Continuation of Ser. No. 796,615, Nov. 22, 1991, abandoned, which is a division of Ser. No. 460,269, Jan. 2, 1990, Pat. No. 5,101,575, which is a continuation-in-part of Ser. No. 392,368, Aug. 11, 1989, Pat. No. 5,130,624, and a continuation-in-part of Ser. No. 392,473, Aug. 11, 1989, Pat. No. 5,237,256, and a continuation-in-part of Ser. No. 397,755, Aug. 23, 1989, Pat. No. 5,038,091, and a continuation-in-part of Ser. No. 460,260, Jan. 2, 1990, Pat. No. 5,006,778.

[51] Int. Cl.⁶ .......................... G01K 7/22; G01K 13/08; F26B 21/10
[52] U.S. Cl. .......................... 374/141; 374/183; 374/170; 34/493
[58] Field of Search .......................... 374/141, 183, 374/170; 34/493, 549, 554

[56] References Cited

U.S. PATENT DOCUMENTS

| | | | |
|---|---|---|---|
| 3,643,346 | 2/1972 | Lester | 34/554 |
| 4,022,170 | 5/1977 | Crall et al. | 123/415 |
| 4,194,478 | 3/1980 | Sumiyoshi et al. | 123/452 |
| 4,195,415 | 4/1980 | Livings et al. | 34/549 |
| 4,211,201 | 7/1980 | Sumiyoshi et al. | 123/452 |
| 4,799,176 | 1/1989 | Cacciatore | 364/557 |
| 4,933,535 | 6/1990 | Zabinski | 219/497 |
| 5,041,800 | 8/1991 | Long et al. | 310/315 |

Primary Examiner—Diego F. F. Gutierrez
Attorney, Agent, or Firm—Stephen D. Krefman; Robert O. Rice

[57] ABSTRACT

A method and apparatus for providing a temperature reading to a micro-computer without the use of a digital to analog converter. An apparatus and method is provided for measuring the temperature of an environment by comparing the current flow through a thermistor with the current flow through a known resistance. In the preferred embodiment, the temperature of the exhaust air stream of a dryer is measured by alternately supplying current through the thermistor disposed in the exhaust air stream and through the known resister to the inverting input of a comparator, a full wave rectified signal is supplied to the non-inverting input of the comparator and the width of the volt pulse produced at the output of the comparators is monitored for determining the temperature of the exhaust air stream.

5 Claims, 31 Drawing Sheets

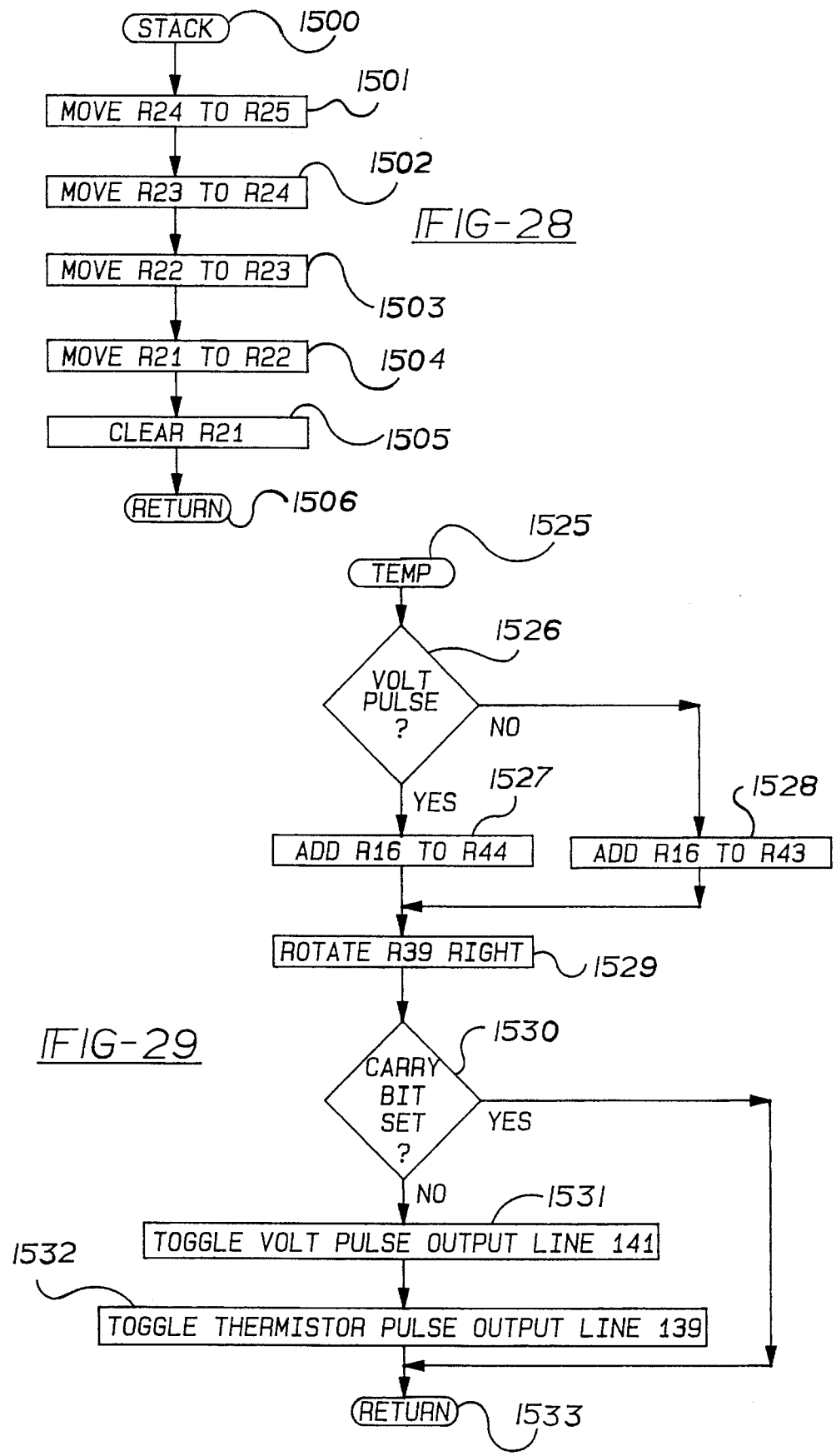

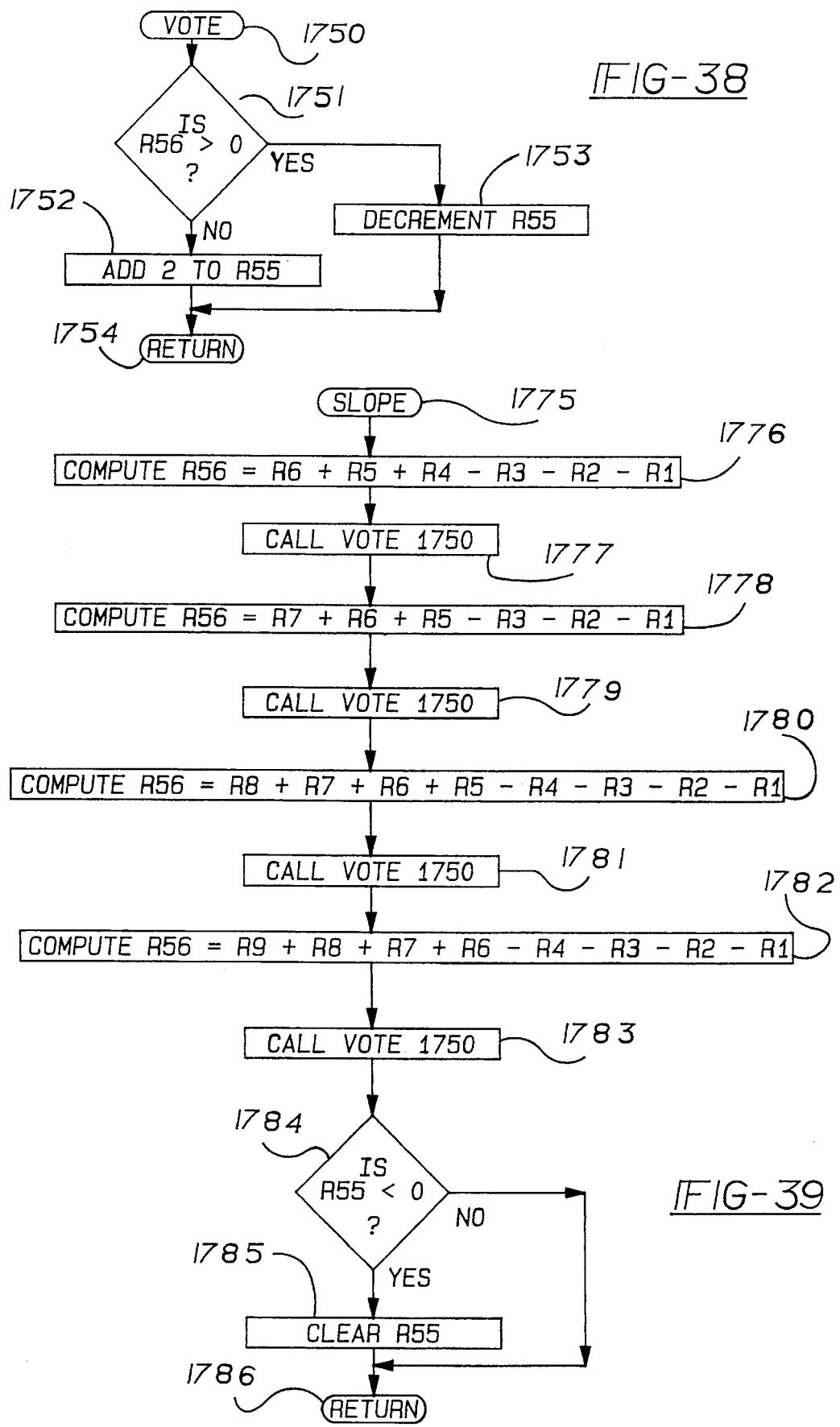

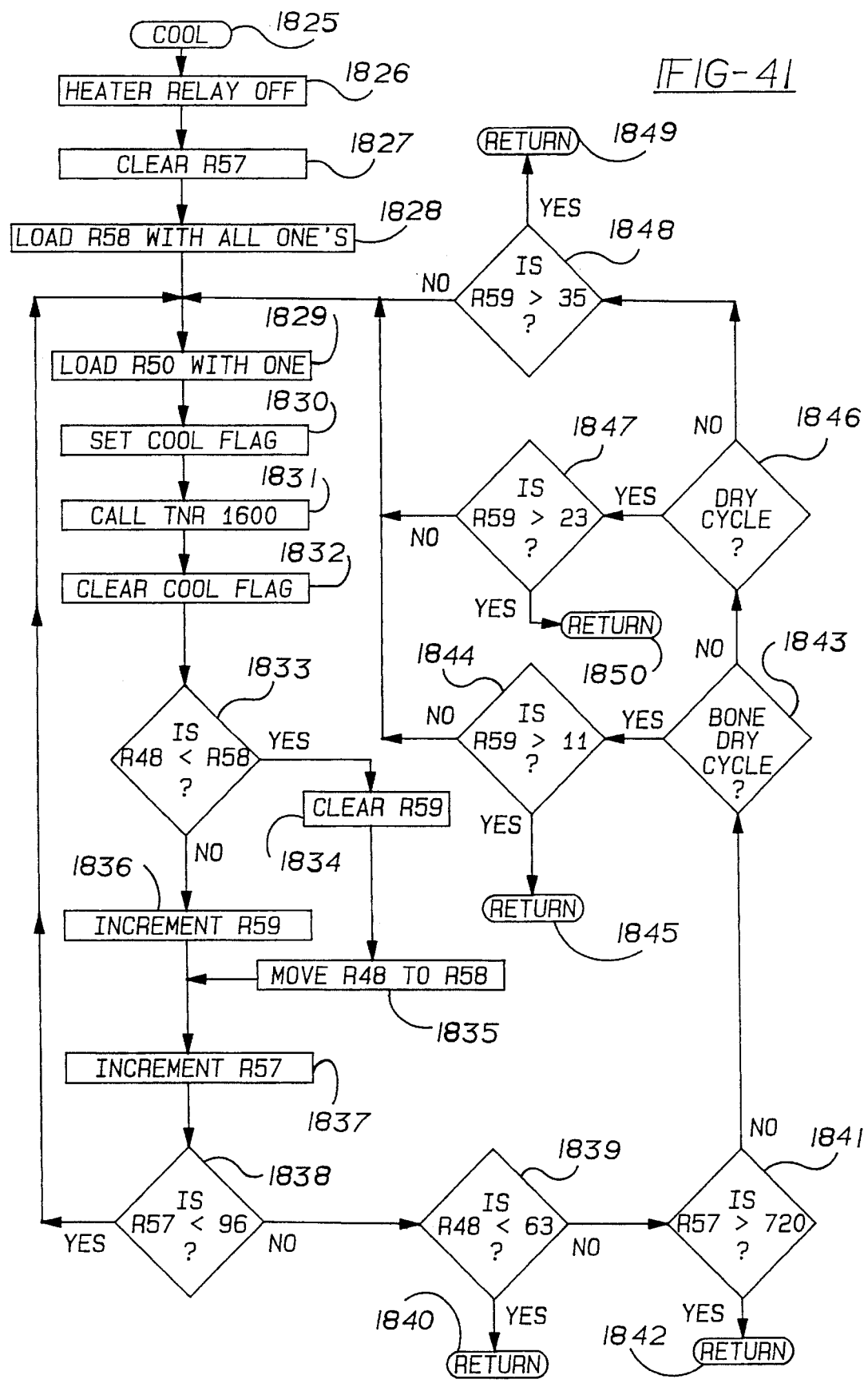

METHOD AND APPARATUS FOR DETECTING THE TEMPERATURE OF AN ENVIRONMENT

CROSS REFERENCE TO RELATED APPLICATIONS

This is a continuation of application Ser. No. 07/796,615 filed on Nov. 22, 1991, now abandoned; which is a division of application Ser. No. 07/460,269 filed on Jan. 2, 1990, now U.S. Pat. No. 5,101,575; which is a Continuation-in-Part (CIP) of application Ser. No. 07/392,368 filed on Aug. 11, 1989, now U.S. Pat. No. 5,130,624; and a CIP of application Ser. No. 07/392,473 filed Aug. 11, 1989, now U.S. Pat. No. 5,237,256; and a CIP of application Ser. No. 07/397,755 filed on Aug. 23, 1989, now U.S. Pat. No. 5,038,091; and a CIP of application Ser. No. 07/460,260 filed on Jan. 2, 1990, now U.S. Pat. No. 5,006,778.

BACKGROUND OF THE PRESENT INVENTION

1. Field of the Invention

The present invention relates to a system diagnostics and control system for an apparatus having an induction motor and a heater and more particularly to a control for a clothes dryer having a split phase induction motor wherein operations of the dryer are controlled in response to phase angles of the motor and in response to one or more temperature sensors.

2. Description of the Prior Art

A control system for motors and for various appliances with motors is shown in U.S. Pat. No. 4,481,786, issued Nov. 13, 1984, and entitled ELECTRONIC CONTROL FOR A DOMESTIC APPLIANCE (Bashark I). The control system employs a ferrite core sensor having a primary winding that is formed of two turns of the run winding of the motor, typically an AC induction drive motor. The sensor has a single turn secondary winding that forms a sense winding coupled to a motor phase monitoring circuit. The sense winding provides a signal representing a polarity change in the run winding current. The current polarity change signal is used by the motor phase monitoring circuit to provide a voltage compensated motor phase angle pulse to a microcomputer for the appliance to control various operations of the appliance.

In particular, Bashark I teaches a control for a dryer wherein a digital representation of the motor phase angle pulse is used by the microcomputer to monitor the operation of the motor under the loading created by the clothes being tumbled in the dryer drum. The motor phase angle representation is used by the microcomputer to calculate a clothes tumble number by summing the absolute difference between given sums of the phase angle representations which are then used to generate a control signal at a given tumble number threshold for terminating the operation of the motor.

Bashark I also teaches that the same or a similar control circuit may be used to monitor the motor of other appliances, such as an air conditioner, a dishwasher, an automatic washer, a refrigerator and to provide other types of information about the operation of these appliances. However, the disclosure in Bashark I was limited to monitoring only motor characteristics and was further limited in the types of information obtained from analyzing the phase angle information and the types of functions controlled as a result of obtaining the phase angle information. Furthermore, Bashark I used only the single motor sensor and did not suggest how additional information could be obtained from other sensors advantageously interacting with the motor phase angle sensor. The present invention is directed to providing these advantageous features to the control as well as providing various additional improvements to motor sensors and controls generally.

It is known to use various single purpose sensors to monitor the condition of a dryer or the clothes load within the drum of the dryer. For example, it is known to detect a blocked lint filter using fluid pressure measurements, as shown for example in U.S. Pat. No. 3,286,508, or by detecting the passage of light through the filter, as shown for example in U.S. Pat. No. 3,484,772.

It is also known to use various single purpose sensors to monitor the dryness of the clothes load in a dryer. For example, it is known to detect dryness by detecting the conductivity of the clothes using a pair of electrode sensors, as shown for example in U.S. Pat. No. 3,593,571, or by discharging a capacitor into the clothes, as shown for example in U.S. Pat. No. 4,422,247. Still another technique is to measure exhaust air temperature, as taught by U.S. Pat. No. 3,203,679. This dryness information is either used directly or indirectly to control the length of a drying cycle or the energization of the heater. In U.S. Pat. No. 4,385,452, for example, a microcomputer seeks a preset number of consecutive "dry" readings from the sensor before it will act to regulate the drying cycle.

Still other sensors and controls are known in the art for controlling dryers. In U.S. Pat. No. 3,507,052, a dryer control is described which senses a load tumbling pattern and uses this information to set the speed of the motor so as to provide an optimum tumbling pattern. In U.S. Pat. No. 3,874,089, a dryer control is described which senses the energization of the heater and uses this information to control the motor.

Each of these prior art designs uses a single type of sensor to monitor a single characteristic and to control a single function of the dryer. None of these references provide a control circuit that is adapted for monitoring the function of the motor and the heater using a single circuit to monitor several diverse characteristics of the operation of the dryer and provide complete control of the dryer operation.

DESCRIPTION OF RELATED APPLICATIONS

In U.S. Pat. No. 5,130,624 issued Jul. 14, 1992 entitled ELECTRONIC CONTROL FOR AN AUTOMATIC WASHING MACHINE WITH A REVERSING PSC MOTOR (Bashark II), a control system for an apparatus having a permanent split capacitance motor was disclosed using phase angle information obtained by a ferrite core sensor monitoring at least one winding of the motor when the motor is deactivated so as to determine loading information about the apparatus. In the preferred embodiment, the apparatus disclosed is an automatic washer having a basket which is reciprocally driven during an agitation cycle by alternatively operating the motor in a clockwise direction and in a counterclockwise direction. The basket is also continuously driven in a single direction by the motor during a spin cycle.

In particular, information about the clothes load is obtained by monitoring the zero crossings of alternating current in a winding of the motor. In order to sense zero crossings of alternating current in a winding of the PSC motor, a ferrite core transformer sensor is employed having a primary winding that includes at least one turn of a motor winding and a secondary winding at which the the current zero crossing signal is generated. In the preferred embodiment, two ferrite core transformer sensors are used, one monitoring a first motor winding and one monitoring a second motor winding.

The control system senses zero crossings whether the motor is currently on or off. When the motor is off, the residual current, that is, the current generated by the continuing motion of the motor, is substantially unaffected by the line voltage. It is during the hesitation period, after the motor has driven the basket and has been cycled off, that braking action occurs. The duration of residual alternating current during the hesitation period is inversely proportional to the breaking force on the motor and the breaking force is, in turn, an indication of the size of the clothes load in the basket. Thus, the control can provide a representation of the size of the clothes load, which can be used to regulate various operations of the washer, such as the amount of water needed, cycle time, whether or not to agitate during fill.

The control system in Bashark II also improved on the control of Bashark I by providing improved control circuitry and logic and by teaching the control of several additional operations of the automatic washer.

In U.S. Pat. No. 5,237,256 issued Aug. 17, 1993 entitled ELECTRONIC CONTROL FOR AN AUTOMATIC WASHING MACHINE WITH A REVERSING PSC MOTOR (Bashark III), the same control system as disclosed in Bashark II is used to monitor a permanent split capacitance motor while it is actually operating under its own power. In particular, the motor is monitored using a ferrite core sensor while it is driving the basket of an automatic washer to determine when the motor has reached operating speed or to detect the amount of dither in its operation. This information provides a representation of clothes load during a spin cycle, which is then used to regulate the duration of spin and to detect off-balance conditions.

In particular, the control uses the phase angle representation to detect a characteristic increase in the motor phase angle to determine the motor start time, that is, the amount of time that it has taken for the motor to reach operating speed. An auto-referencing technique is employed by which the motor start time is auto-referenced to the minimum sum of two consecutive phase angle representations. From the motor start time, the electronic control determines the size of the load in the basket and then determines the spin time from the size of the load.

The electronic control further employs an auto-referencing technique to detect an unbalanced load condition in the basket. The control compares the motor phase angle samples taken from either positive or negative line half cycles, which provides a representation of the amount of dither experienced by the motor.

An additional patent application was drafted but not filed entitled ELECTRONIC CONTROL FOR AN APPLIANCE (Bashark IV) because the claims intended for such application were included in Bashark II and III.

In U.S. Pat. No. 5,038,091, issued Aug. 6, 1991, and entitled ELECTRONIC CONTROL FOR AN APPLIANCE (Bashark V), a control circuit very similar to the control circuit disclosed in Bashark II through IV is disclosed for monitoring an inductance motor to detect the onset of stall of the motor. The control uses the ferrite core sensor to monitor the operation of an apparatus to detect a characteristic change in the phase angle measurements indicative of the onset of stall and uses this information to regulate the operation of the apparatus. The control responds to the detection of the onset of stall by temporarily increasing torque, by shutting down the motor, or by providing user information indicative of the timing of the occurrence.

As in Bashark II and in Bashark III, the control logic used in Bashark IV is auto-referenced. The onset of stall is detected by detecting when the phase angle reaches a level substantially equal to a previously measured locked motor phase angle or, alternatively, when the phase angle measurements exceed the maximum phase angle measurements set earlier in the same operating cycle.

In particular, Bashark V provides a refuse compactor with an inductance motor reciprocably driving a ram into a refuse containing refuse to be compacted. The electronic treats the detection of the onset of stall as the detection of the onset of compaction. The control provides a choice of compaction cycles that provide different full bag weights, depending on the indicator of onset chosen and depending on the response chosen. For example, a higher compaction force than is otherwise available from the motor is obtained by temporarily energizing the start winding of the motor when the onset of stall is detected, thereby providing increased torque at the time when the most work is being done by the compactor. A comparatively lower torque level is obtained by stopping the motor when the onset of stall is detected by one of the two methods disclosed.

The fullness of the refuse receptacle is determined by measuring the time that the motor has been operating prior to the detection of the onset of stall. A full bag or empty bag condition can also be detected and signalled to the operator when the time period is extremely short or long.

In U.S. Pat. No. 5,006,778 issued Apr. 9, 1991 entitled MOTOR DIAGNOSTICS AND ELECTRONIC CONTROL FOR A CLOTHES DRYER (Bashark VI) filed concurrently with the present application on Jan. 2, 1990, a control circuit very similar to the control circuit disclosed in Bashark II through V is disclosed for monitoring an inductance motor to detect a non-cyclical change in the load experienced by a motor. The control uses the ferrite core sensor to monitor the operation of an apparatus to detect a characteristic change in the phase angle measurements indicative of non-cyclical change and compensates for the effect of cyclical changes. The control this information to regulate the operation of the apparatus. The control responds to the detection of the non-cyclical change by shutting down the motor, by varying the operation of other systems, or by providing user information indicative of the timing of the occurrence.

As in the earlier applications, the control logic used in Bashark VI is auto-referenced. The non-cyclical change in loading conditions is detected by a voting process detecting whether the slope of the last six, seven, eight or nine clothes tumbles numbers is increasing or decreasing, respectively and, immediately after each computation, voting for or against the clothes load being dry in accordance with whether the computed slope is negative or positive, respectively.

In particular, Bashark VI provides a dryer with an inductance motor rotatably driving a drum containing wet clothes to be dried. The electronic control treats the detection of the change in load conditions as the detection of drying, since dry clothes tumble differently than wet clothes. The dryness of the clothes is determined by measuring the phase angle of a winding of the motor and the clothes are considered to be dry when the variation in phase angle due to clothes tumbling is no longer decreasing.

The present application (Bashark VII), now U.S. Pat. No. 5,101,515 issued Apr. 7, 1992 uses a circuit and logic similar to that disclosed in Bashark II through VI to monitor the operation of an apparatus having a motor and heater and to control the operation of the apparatus in response to the heater current information. In particular, the control is used to operate a clothes dryer and is therefore further modified from the disclosures of Bashark II through V to provide several novel features uniquely advantageous for the operation of a clothes dryer. A divisional application was filed and issued Jan. 25, 1994 as U.S. Pat. No. 5,281,956.

Since the preferred embodiment of the inventions claimed in Bashark VI and in the present application are identical, the disclosures of these two applications are nearly identical.

OBJECTS OF THE PRESENT INVENTION

It is a primary object of the present invention to provide a method and an apparatus for monitoring the functioning of a heater by monitoring the current through the heater.

It is another object of the present invention to provide a control for a heater responsive to the detection of current in the heater.

It is yet another object of the present invention to provide a method and an apparatus for monitoring the functioning of an appliance having a motor and a heater by monitoring the current through the heater.

It is still another object of the present invention to provide a control for a motor and a heater in an appliance responsive to the detection of current in the heater.

It is another object of the present invention to provide a method and an apparatus for monitoring the functioning of an appliance having a motor and a heater by monitoring the current through the heater and the current through a winding of the motor using a single sense winding and a single control.

It is yet another object of the present invention to provide a control for a motor and the heater responsive to the detection of current in the heater and the phase angle of the motor.

It is still yet another object of the present invention to provide a dryer control providing a clothes cooldown period with controlled moisture regain as per the user dryness selection.

It is a further object of the present invention to provide a dryer having a sensor capable of detecting numerous diagnostic conditions at the start of each cycle, or throughout each cycle, such as heater ground fault, 208 or 240 VAC service voltage identification, heater open/short circuit, open door, heater box thermostat cycling, and, restricted air flow.

It is yet a further object of the present invention to provide a temperature sensing means directly readable by a microprocessor without requiring an analog-to-digital converter.

These and the many other objects, features, and advantages of the present invention will become apparent to those skilled in the art when the present application is read in conjunction with the drawings appended hereto.

SUMMARY OF THE PRESENT INVENTION

The present invention provides a novel method and an apparatus for monitoring and controlling the operation of a motor and a heater of an appliance having a motor and a heater and more particularly provides a method and apparatus for monitoring the heater and drum motor of a clothes dryer to control the operation of the dryer such as to dry the clothes in the drum to a preselected dryness level.

A sensor is provided for monitoring the operation of the heater. The control of the present invention regulates the operation of the heater or a motor or both in response to the information. The control further serves several diagnostic functions by detecting such conditions as a heater ground fault, a heater open/short circuit, heater box thermostat cycling, and restricted air flow.

The heater sensor preferably consists of a ferrite core sensor and single sense winding threaded through the ferrite core sensor to provide an input line to the control.

The present invention further provides a method and apparatus for providing a temperature reading to a microcomputer without use of a digital to analog converter. More particularly, the present invention provides a means for measuring the temperature of the exhaust air stream by measuring the temperature using a thermistor and comparing the current with the current flow through a known resistance.

In the preferred embodiment, the exhaust temperature is measured by alternately supplying current through the thermistor and through the known resistor to the inverting input of a comparator and a full wave rectified signal to the non-inverting input of the comparator and monitoring the width of the volt pulse produced at the output of the comparator. The sampling preferably occurs throughout the drum revolution while the calculation of the temperature occurs approximately once per revolution.

In the preferred embodiment, the present invention also provides a control circuit for monitoring a motor to detect a non-cyclical change in the load experienced by the motor. The control uses this information to regulate the operation of the apparatus, responding to the detection of the non-cyclical change by shutting down the heater and/or the motor, by varying the operation of other systems, or by providing user information indicative of the timing of the occurrence. The control uses a second ferrite core sensor to monitor the operation of an apparatus to detect a characteristic change in the phase angle measurements indicative of non-cyclical change and compensates for the effect of cyclical changes. The non-cyclical change in loading conditions is detected by a voting process detecting whether the slope of the last six, seven, eight or nine clothes tumbles numbers is increasing or decreasing, respectively and, immediately after each computation, voting for or against the clothes load being dry in accordance with whether the computed slope is negative or positive, respectively.

The control of the present invention is adapted for a clothes dryer having an inductance motor rotatably driving a drum containing wet clothes to be dried. The electronic control treats the detection of the change in load conditions as the detection of drying, since dry clothes tumble differently than wet clothes. The control further provides such information as the service voltage identification, and drum acceleration.

BRIEF DESCRIPTION OF THE DRAWINGS

FIG. 28 is a flow chart for the STACK routine called by the tumble number routine four times per drum revolution, to adjust the data stack of the last five drum sector sums and to clear the last drum sector sum in preparation for the next sample.

FIG. 29 is a flow chart for the TEMP routine called by the tumble number routine once per each line half cycle to accumulate the sum of each volt or thermistor pulse number for one complete drum revolution, and, to toggle two dedicated microcomputer output lines in a predetermined and repetitive sequence to facilitate comparison of an unknown NTC thermistor resistor to a known circuit resistor.

FIG. 38 is a flow chart for the VOTE routine called four times by the SLOPE routine to vote for or against the clothes load being dry by adding or subtracting from a dry count maintained in data memory based on whether the slope of the last six, seven, eight or nine clothes tumbles numbers is increasing or decreasing, respectively.

FIG. 39 is a flow chart for the SLOPE routine called by the TEST routine to compute the slope of the last six, seven, eight or nine clothes tumble numbers on the tumble number data stack, and to call the VOTE routine immediately after each computation to vote for or against the clothes load being dry in accordance with whether the computed slope is negative or positive, respectively.

FIG. 41 is a flow chart for the COOL routine called by the MAIN program after the TEST routine has determined that the clothes load is dry, or, after the DAMP routine has determined that the clothes load is damp dry for a damp dry cycle selection, to provide a clothes cooldown period with the motor ON and the heater element OFF.

DETAILED DESCRIPTION OF THE PREFERRED EMBODIMENTS

1. Description of the Dryer Hardware

Figure 1:
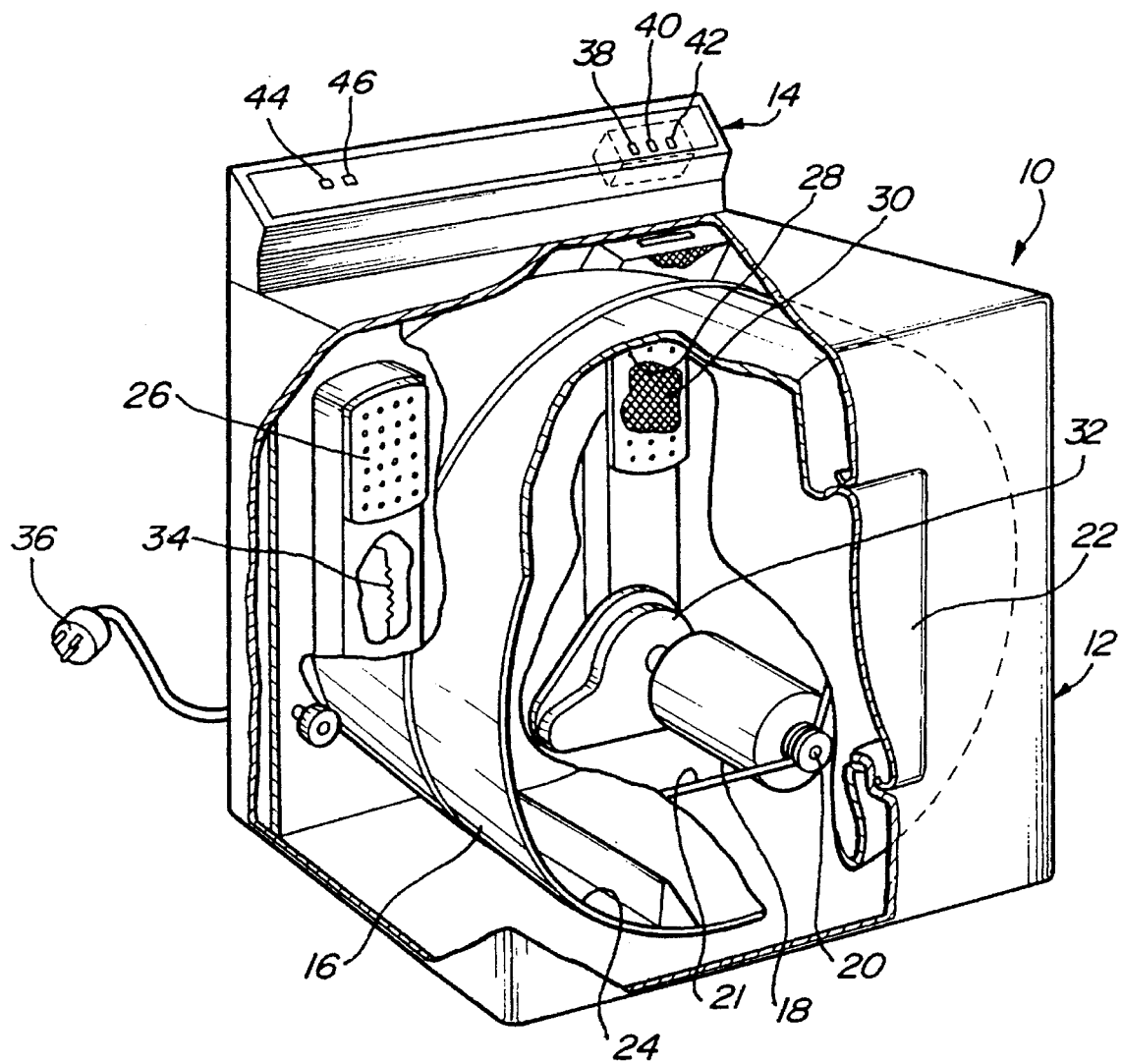
FIG. 1 is a partly cutaway perspective view of a domestic clothes dryer employing the diagnostics and controls of the present invention.

Refer now to the drawings wherein an exemplary automatic clothes dryer 10 controlled by a electronic controller 100 using control logic 1000 according to the present invention is illustrated. In the drawings, like reference numerals refer to like components throughout except that "R" is used for resistors in circuit diagrams of FIGS. 2 through 7 while it is used for data registers in the flow charts of FIGS. 12 through 41.

The mechanical components of the clothes dryer 10 are well known in the art and are therefore not shown in any great detail. As shown in FIG. 1, the clothes dryer 10 has a cabinet 12 including a control console 14. Within the cabinet 12 is rotatably mounted a drum 16 which is rotatably driven about a horizontal axis by a motor 18, typically an induction motor, through a suitable drive system 20, typically including a belt 21. A front door 22 formed in the front of the cabinet 12 provides selective access to the clothes treatment zone 24 defined by the interior of the drum.

The drum 16 is provided with a an inlet aperture 26 and an outlet aperture 28 having a removable lint screen 30. A supply of air is circulated by a fan 32 driven by the motor 18. A heater 34 is selectively energized by a control logic circuit to selectively temperature condition the air supplied by the the fan. The motor and the heater are selectively supplied with power by the control 100 from a 208 VAC or 220 VAC power source by means of a three-wire pigtail 36. As is well known in the art, a supply of temperature controlled air is circulated by a fan 32 past a heater 34 through the inlet aperture 26 into the clothes treatment zone 24 in the drum 16 and subsequently through the outlet aperture 28 and the lint screen 30. The preferred dryer includes an idler pulley, not shown, to take up slack in the belt drive, especially during motor starting.

The control console 14 includes a start button 38, a dryness selector 40, and a temperature selector 42 to permit the user to start a drying cycle and to select the parameters of the drying cycle. As is well known, these controls may alternatively be combined on a single cycle selection timer. In the preferred embodiment, the dryness selector 40 permits selection between "damp dry", "dry", and "bone dry" settings and the temperature selector 42 permits selection between a "high" temperature, a "low" temperature setting and an air dry setting. The control console 14 also includes indicators such as a check lint screen LED 44 and a check exhaust system LED 46.

The control 100 of the present invention, shown in detail in FIGS. 2 through 7 and described later herein, monitors the operation of the motor 18 and the heater 34 to determine the parameters of the drying cycle and to detect certain fault conditions during the operation of the dryer.

2. Theory of the Control Circuitry

In the preferred embodiment of the present invention, the motor 18 is an induction motor. The wattage consumed by an induction motor is the motor current times the voltage times the power factor. The power factor is the cosine of the angle by which the motor current lags the motor voltage. This phase lag, or phase angle, is nonlinear, and, inversely related to the motor load torque. When the motor load torque is low, the power factor is small, and, the motor phase angle is large. Conversely, when the motor load torque is high, the power factor is large, and, the corresponding motor phase angle is small.

For a load torque within the normal motor operating range of the motor and with small deviations about an average value, motor phase samples can be assumed to be linear and inversely related to the instantaneous motor torque. The present invention provides a means of obtaining one independent sample of the motor phase angle per each service voltage half cycle and processing this information with a microcomputer to detect various conditions within a domestic clothes dryer including motor starting, drum acceleration, a broken drum drive belt, an empty clothes drum, or, when the clothes have reached a user selected state of dryness.

Since the heater 34 is a resistive load, the alternating current passing through the heater is in phase with the alternating voltage across the element. If the installation service voltage is a true 240 VAC source, the heater current will also be in phase with the 120 VAC motor voltage. However, if the installation service voltage is a 208 VAC source, the heater current will lead or lag the 120 VAC motor voltage by thirty electrical degrees depending upon the polarity of the dryer three-wire pigtail 36. The present invention identifies the installation service voltage as a 208 or 240 VAC source by monitoring the phase relationship between the heater current and the motor voltage. Furthermore, the present invention monitors the ON/OFF condition of the heater element once per each service voltage half cycle.

ON/OFF heater element information, in concert with the motor phase samples, can be used to detect numerous diagnostic conditions including heater ground fault detection, motor start detection, drum acceleration detection, heater box thermostat cycling, and restricted air flow detection.

When the motor is OFF at the start of a cycle, ground fault current flowing from a broken or sagging heater element through the cabinet to the neutral wire can be detected by briefly toggling the heater relay prior to starting the motor.

Counting heater box thermostat cyclings in combination with knowing the heater voltage (i.e., the heater wattage), provides a means of detecting restricted air flow conditions as may be caused by a blocked lint screen or a blocked exhaust duct.

Smooth, unvarying motor phase samples provides an indication that the motor load is constant, a condition which exists only when the dryer drum belt is broken, or not properly installed, provided that comparisons are made between motor phase samples taken under the same conditions of alternating voltage polarity, blower position, and exhaust air temperature sampling circuit modes.

A non-starting motor can be inferred if the motor phase samples immediately after activation of the motor relay do not show a characteristic increase which normally occurs when the motor centrifugal switch cuts-out the auxiliary winding within a preset time limit.

Excessive motor centrifugal switch cycling during the dryer drum acceleration period can be inferred when motor phase samples drop below a threshold established during motor starting.

An open or short circuit condition in either the motor or the heater circuit is detected by the presence of sensor signals when a circuit should be open, or the absence of sensor signal when a circuit should be closed.

The control 100 provides an improved means of detecting when the clothes load is dry by processing the motor phase information in a manner which measures variation in motor torque due to any minute difference in the way that the clothes load is tumbling from one drum revolution to the next revolution while substantially ignoring cyclical, repetitive variation due to uneven drum rotational friction. Wet clothes tumble rougher than dry clothes with corresponding effect on motor torque variation. When the variation in motor torque due to clothes tumbling is no longer decreasing, the clothes load is dry. If an initial clothes tumble sample is below a preset threshold, it can be inferred that the drum 16 does not contain any wet rotating clothes items.

The control 100 of the present invention further provides a means of comparing the unknown value of a thermistor resistor to a known circuit resistor without requiring an analog to digital converter. The technique involves toggling two dedicated microcomputer output lines as a signal to a volt pulse width information indicative of the known resistance value circuit; accumulating volt pulse and thermistor pulse width information, indicative of the unknown resistance value in microcomputer data memory throughout a temperature sampling period; and, using a microcomputer program to compare the accumulated volt and thermistor pulse widths.

3. Details of the Control Circuit

Figure 2:
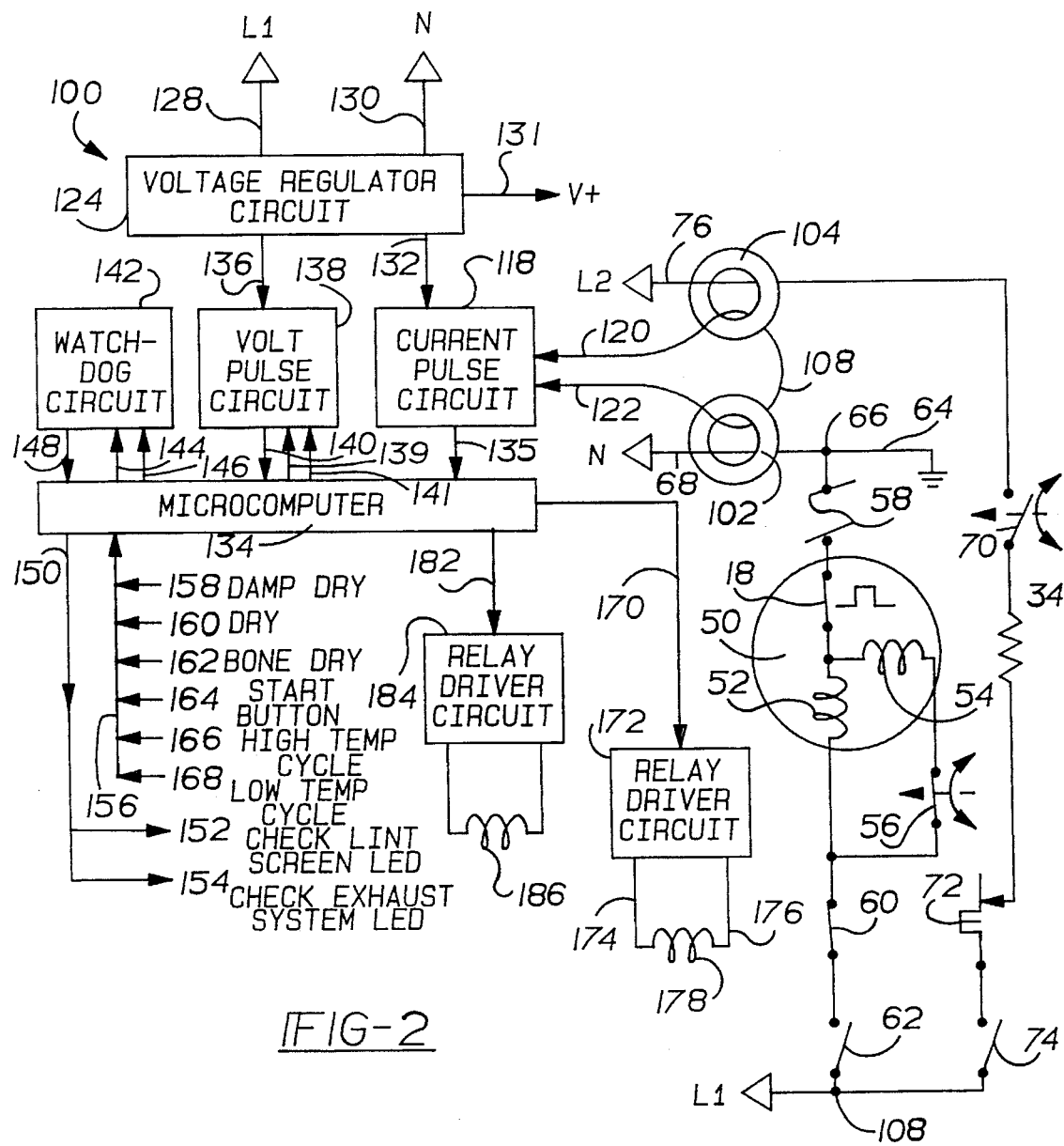
FIG. 2 is a schematic circuit showing a domestic dryer control with a split phase induction drive motor, centrifugal switch, thermal fuse, door switch, motor relay, neutral ground return wire, two ferrite core sensors, resistive heater element, heater box safety thermostat, heater relay, three-wire 208/240 VAC electrical service, voltage regulator circuit, watchdog circuit, volt pulse circuit, current pulse circuit, microcomputer, two relay driver circuits, and, various microcomputer inputs and outputs according to the present invention.

Refer now to FIG. 2 showing a schematic circuit of a clothes dryer control 100 according to the present invention. The schematic includes an induction motor 18 and motor circuit connected between the neutral N and first hot side L1 of an alternating service source. The service between L1 and neutral N is always 120 VAC, while the service between L1 and L2 may be either 208 or 240 VAC.

The motor 18 includes a thermal protector 50, a main winding 52 and an auxiliary winding 54. The exemplary motor 18 is a 4-pole fractional horsepower split phase induction motor with a normally closed centrifugal switch contact 56 wired in series with the auxiliary winding 54. A thermal fuse 58 is wired in series with the motor 18 and is physically located in the exhaust air stream. A door switch 60 is wired in series with the motor 18 and located near the dryer door 22. The door switch 60 is closed when the door is closed. A normally open motor relay contact 62 is also wired in series with the motor 18.

The motor relay 62 is connected to the first hot side L1 of the service voltage. A ground fault current return wire 64 is connected to the motor circuit at point 66. The motor 18 current along with any ground fault current 64 is connected to the service voltage neutral N by wire 68. Wire 68 is also the single turn primary winding for a first ferrite core sensor 102.

The schematic includes a resistive heater 34 and heater circuit connected between the first and second hot sides L1 and L2 of the alternating service sources. A normally open centrifugal switch contact 70 is wired in series with the heater 34.

A safety thermostat 72 is wired in series with the heater 34 and located on the heater box enclosure. A normally open heater relay contact 74 is wired in series with the heater 34 and connected to the first hot side L1 of the service voltage. The normally open centrifugal switch contact 70 interrupts continuity of the heater circuit whenever the motor 18 is not rotating, and, is connected to the second hot side L2 of the service voltage by wire 76. The wire 76 is also a single turn primary winding for a second ferrite core sensor 104. A single turn sense winding 108 is threaded through both ferrite core sensors 102 and 104 without regard to relative polarity, and, connected to a current pulse circuit 118 at points 120 and 122.

As shown in FIG. 2, the motor control circuit 100 is provided with power from the AC source via a voltage regulator circuit 124 by electrical leads 128 and 130 from L1 and N. Note that hot side L1 and Neutral side N is the same leg of 120 VAC service voltage that is used to power the motor 18. The voltage regulator circuit 124 is used to generate a regulated source of DC voltage V+ on electrical line 131 appropriate for the microcomputer 134 and other electronics. The voltage regulator circuit 126 also provides provides a full-wave rectified signal voltage 136 to a volt pulse circuit 138 and a filtered, but unregulated DC bias voltage 132 to a current pulse circuit 118.

The volt pulse circuit 138 provides a binary volt pulse signal 140 to the microcomputer 134 at the rate of one volt pulse per line voltage zero-crossing. Dedicated NMOS output lines 139 and 141 from the microcomputer 134 to the volt pulse circuit 118 are used to define a fixed or floating reference voltage, respectively, to facilitate comparison of an unknown thermistor resistor to a known resistor for exhaust air temperature measurement as will be explained later herein.

The current pulse circuit 118 provides a binary current pulse signal 135 to the microcomputer 134. A watchdog circuit 142 provides a binary RESET signal 148 to the microcomputer 134. The microcomputer 134 provides a binary status signal 144 and a binary volt pulse echo signal 146 to the watchdog circuit 142. Binary output lines 150 from the microcomputer 134 may be required for various console indicators such as a check lint screen light emitting diode 152 or a check exhaust system light emitting diode 154. Additional binary inputs lines 156 to the microcomputer 134 are also provided. A damp dry input 158 is LOW when the user has selected the "damp dry" dryness selection. A dry input 160 is LOW when the user has selected the "dry" dryness selection. A bone dry input 162 is LOW when the user has selected the "bone dry" dryness selection. A "less dry" dryness selection is implied when inputs 47, 48 and 49 are all HIGH.

A momentary start button input 164 is LOW when the user is pressing the start button 38. A high temperature input 166 is LOW when the user has selected the high temperature heat dry cycle. A low temperature input 168 is LOW when the user has selected the low temperature heat dry cycle. An air dry cycle selection is implied when neither input 166 or 168 is LOW.

Binary output 170 of microcomputer 134 is connected to the relay driver circuit 174. The relay driver circuit 172 is used to control the coil 96 of the motor relay 62. Similarly, binary output 182 of microcomputer 134 is connected to relay driver circuit 184. The relay driver circuit 184 is used to control the coil 186 of the heater relay 74.

It will be apparent to those skilled in the art that an external crystal or ceramic resonator circuit is used in conjunction with the microcomputer 134, in accordance with manufacturer specification, to define the internal clock cycles and timing functions. In the exemplary embodiment the microcomputer 134 is a Texas Instruments TMS7040 which has an 8-bit word size and the external crystal is a five megahertz ceramic resonator.

Figure 3:
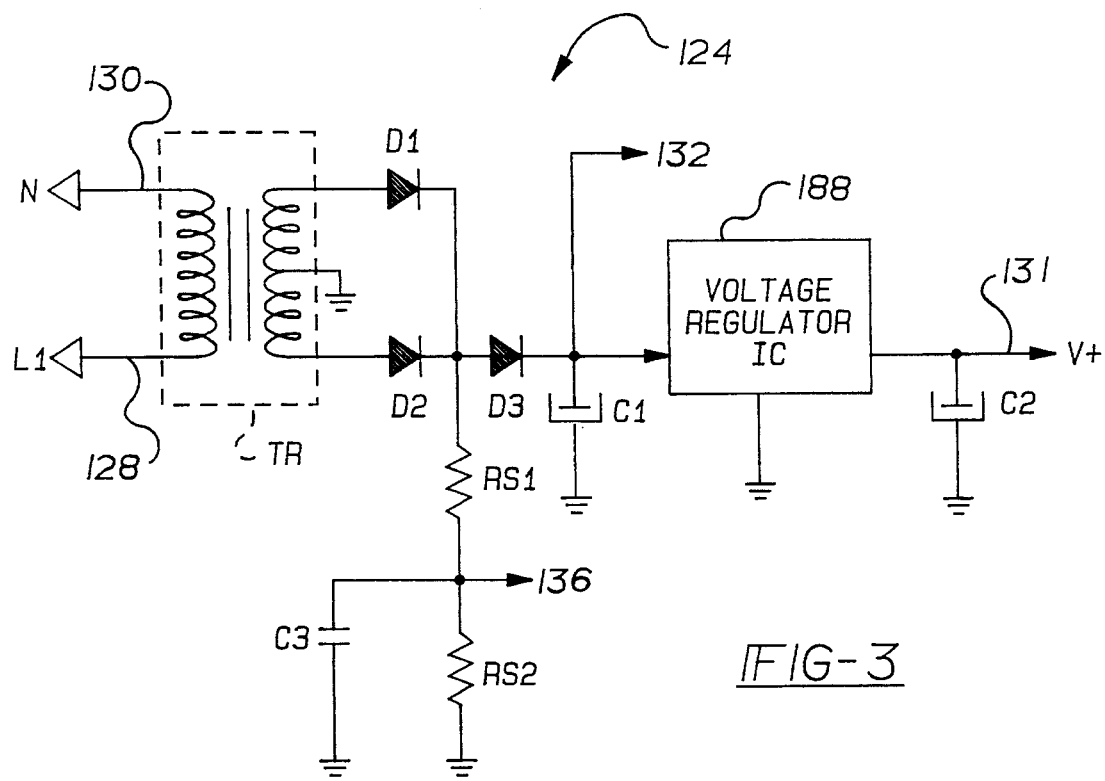
FIG. 3 is a circuit diagram for the voltage regulator circuit of FIG. 2.

The details of the voltage regulator circuit 124 are shown in FIG. 3. The voltage regulator circuit 124 uses the 120 volt service alternating voltage between neutral N and L1 as an input and generates a regulated DC voltage for all electronic circuits, a full-wave rectified signal voltage for the volt pulse circuit 138 and an unregulated DC bias voltage for the current pulse circuit 118.

A center-tapped step down transformer is used with diodes D1 and D2 to develop a 120 Hz, full-wave rectified voltage waveform. Capacitor C1 is a pre-filter and capacitor C2 is a post-filter for the voltage regulator integrated circuit 188. Diode D3 isolates the pre-filtered DC voltage at the input to the voltage regulator 188 from the full-wave rectified signal at the cathodes of D1 and D2. Resistors RS1 and RS2 form a voltage divider circuit and provide a sufficient load to forward bias diodes D1 or D2. High frequency noise transduced from the primary to the secondary of transformer TR is filtered by bypass capacitor C3.

There are three outputs from the voltage regulator circuit 124. The V+ output 131 is a regulated DC voltage for the microcomputer 134 and other electronic circuits. A filtered, but unregulated DC voltage 132 is available to bias the sensitivity of the current pulse circuit 118 for the effect of variation in service voltage on the magnitude of the signal from the ferrite core sensors 102 and 104. A full-wave rectified signal voltage 136 is developed for the volt pulse circuit 138. In the exemplary embodiment V+ is five volts.

Figure 4:
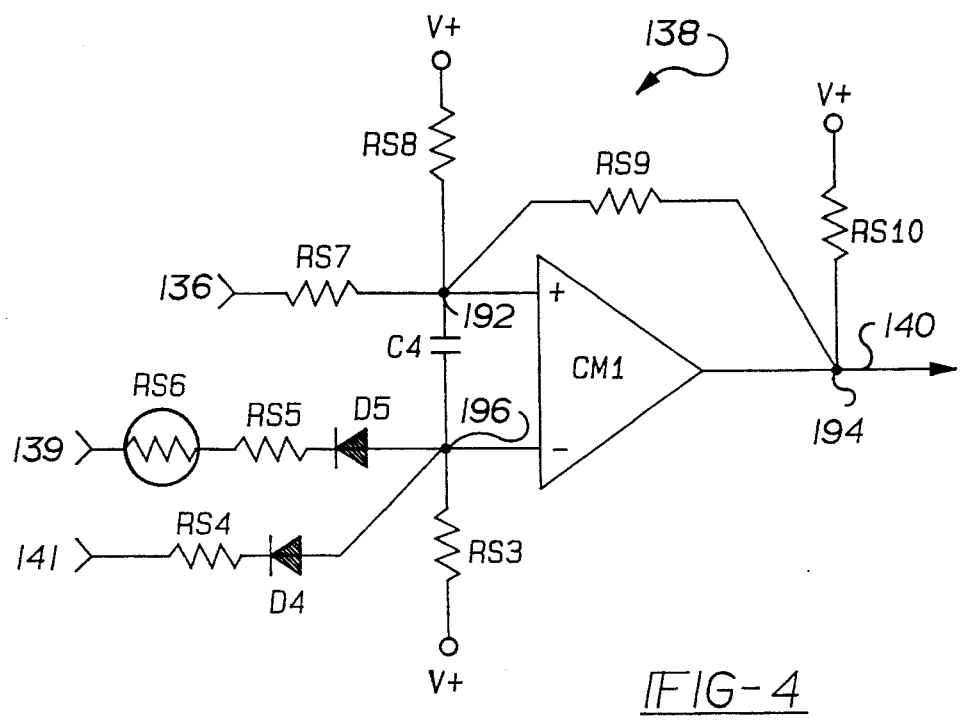
FIG. 4 is a circuit diagram for the volt pulse circuit of FIG. 2.

The details of the volt pulse circuit 138 are shown in FIG. 4. The volt pulse circuit receives a full-wave voltage signal input from the voltage regulator circuit 124 and generates a volt pulse train wherein each binary volt pulse straddles the service voltage zero-crossings. The volt pulse circuit 138 comprises resistors RS3, RS4, RS5, RS7, RS8, RS9 and RS10, thermistor RS6, diodes D4 and D5, a capacitor C4 and a comparator CM1 which is supplied with voltage V+ from the voltage regulator circuit 124.

Inputs 139 and 141 to the volt pulse circuit 138 are dedicated microcomputer 134 NMOS output lines. During normal operation, that is, whenever the microcomputer 134 is not being RESET, one output 139 or 141 is always LOW and the other output 139 or 141, is always HIGH, respectively. In this fashion, therefore, means for alternately supplying a source of DC power to known resistor RS4 and thermistor RS6 is provided.

When microcomputer 134 output 141 is LOW and output 139 is HIGH, the resistor divider RS3 and RS4 both of which having a known resistance value, is used to define a constant DC voltage threshold at the inverting input 196 of comparator CM1. The 120 Hz, full-wave signal 136 from the voltage regulator circuit 124 is applied to the noninverting input 192 of comparator CM1 through the resistor divider RS7 and RS8. A resistor RS9 is connected from the output 194 to the noninverting input 192 of comparator CM1 to provide hysteresis and thereby stabilize transitions of the volt pulse signal 140. A pull-up resistor RS10 is connected at 194 to V+ from the output 140 of comparator CM1. A capacitor C4 filters any remaining high frequency noise across the inputs of comparator CM1.

Conversely, when microcomputer 134 output 139 is LOW and 141 is HIGH, resistor divider RS3 and the series combination of resistor RS5 having a known resistance value and thermistor resistor RS6 having an unknown resistance value define a floating DC voltage threshold at the inverting input 196 of comparator CM1. Resistor RS5 helps to linearize the resistance versus temperature curve of the negative temperature coefficient of resistance thermistor RS6.

By toggling between outputs 139 and 141 in a prescribed sequence and monitoring the width of the resulting volt pulses over a defined sample period, it is possible to compare the sum of resistors RS5 and RS6 to the known value of resistor RS4. If the thermistor RS6 is located in exhaust air stream, it becomes possible to accumulate the volt pulses, say, throughout one drum revolution, and compute the exhaust air temperature once per drum revolution.

Figure 5:
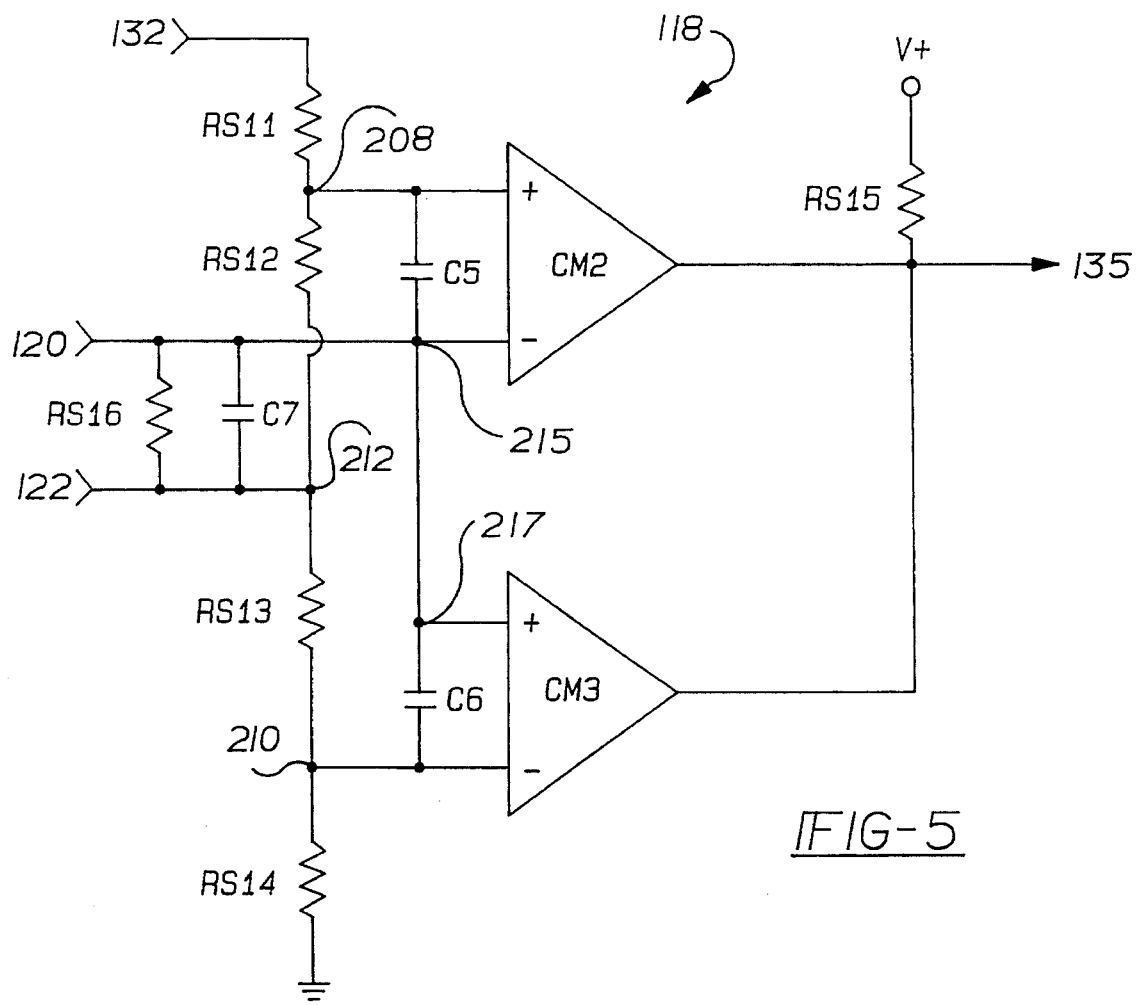
FIG. 5 is a circuit diagram for the current pulse circuit of FIG. 2.

The current pulse circuit 118 is shown in detail in FIG. 5. The current pulse circuit uses two voltage comparators CM2 and CM3 to convert the induced voltage spikes S from the ferrite core sensors 102 and 104 to a binary current pulse output signal 135. Comparator CM2 responds to the positive induced voltage spikes and comparator CM3 responds to the negative induced voltage spikes. The outputs of comparators CM2 and CM3 form a logical "wired OR" connection such that either comparator is capable of pulling the output 135 to the circuit ground, or logical ZERO state.

More specifically, the output of both comparators CM2 and CM3 is connected to V+ by the pull-up resistor RS15. The unregulated DC bias voltage 132 from the voltage regulator circuit 124 is applied across the series resistor divider network comprising resistors RS11, RS12, RS13 and RS14. This has the effect of increasing the sensitivity of both comparators CM2 and CM3 when the line voltage is low and rate of change of the current of the motor 18 and heater 34 in the vicinity of a current zero-crossing is also low. The preferred circuit thereby compensates the sensitivity of the ferrite cores 102 and 104, and, the current pulse circuit 118 for the effect of service voltage variation on the current through the motor 18 or heater 34. However, resistor RS11 may also be connected to V+ if such compensation is not desired.

The common connection 208 between resistors RS11 and RS12 is connected to the noninverting input of comparator CM2. The common connection 210 between resistors RS13 and RS14 is connected to the inverting input of comparator CM3. The common connection 212 between resistors RS12 and RS13 is connected to one end 122 of the sense winding 108 of the ferrite cores 102 and 104. The other end 120 of the sense winding 108 is connected to inverting input 215 of comparator CM3 and the noninverting input 217 of comparator CM3.

A capacitor C7 is wired in parallel with the lines 120 and 122, and, is used to filter high frequency noise on the signal voltage of the ferrite cores 102 and 104. Much of the high frequency noise originates from service lines L1 to N, or, L1 to L2 and is coupled in a capacitive manner from the primary winding 68 and 76 to the secondary winding 108 of ferrite cores 102 and 104. The use of single-turn primary windings 68 and 76 and secondary winding 108 on ferrite cores 102 and 104 minimizes such capacitive coupled noise. A further reduction, or elimination, of this noise could be achieved through the use of a nickel tape-wound cores 102 and 104 rather than ferrite cores 102 and 104 because nickel tape-wound cores have a natural high frequency cutoff. However, the preferred circuit uses ferrite cores 102 and 104 for cost considerations.

A resistor RS16 is wired in parallel with the ferrite core signal lines 120 and 122 to provide a continuity path which forces the output 135 of the current pulse circuit 118 HIGH in the unlikely event that the sense winding 108 becomes open-circuited, or, that terminals 120 or 122 become disconnected. The control interprets missing current pulses 135 the same as an OPEN circuit for the motor 18 or heater 34. Hence, a cycle will be aborted in the event that the sensor circuit becomes OPEN. Capacitors C5 and C6 filter any remaining high frequency noise across the inputs of comparators CM2 and CM3, respectively.

When the voltage across inputs 120 and 122 is zero, resistors RS12 and RS13 bias comparators CM2 and CM3, respectively, such that the outputs are HIGH and the current pulse is absent. When a positive induced voltage spike occurs, such that terminal 120 is temporarily positive with respect to terminal 122, the input voltage exceeds the DC bias voltage across resistor RS12 of comparator CM2 and the output of comparator CM2 pulls the output 135 of the current pulse circuit 118 LOW. Similarly, when a negative induced voltage spike occurs, such that terminal 120 is temporarily negative with respect to terminal 122, the input voltage exceeds the DC bias voltage across resistor RS13 of comparator CM3 and the output of comparator CM3 pulls the output 135 of the current pulse circuit 118 LOW. Thus, the current pulse circuit 118 responds to either positive or negative induced voltage spikes from either ferrite core sensor 102 and 104.

The output 135 of the current pulse circuit 118 is supplied to the microcomputer 134 as an interrupt signal to cause the microcomputer 134 to read the present value of the timer, or, to set a flag to indicate the arrival of a current pulse. A pulse train of induced ferrite core voltage spikes Sh1, Sh2 and Sh3, and, Sm1, Sm2 and Sm3, and, corresponding current pulses Ih1, Ih2 and Ih3, and Im1, Im2 and Im3 are shown in FIGS. 9d and 9e.

Figure 9A:
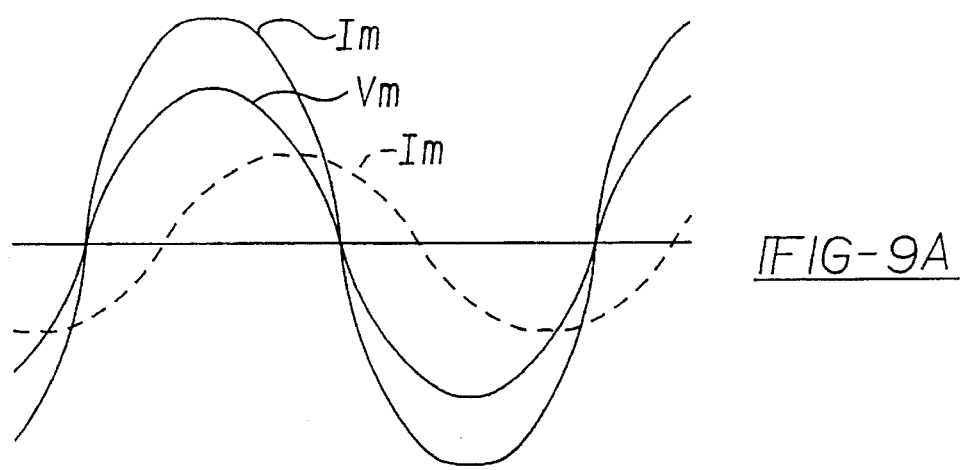
FIGS. 9a, 9b, 9c, 9d and 9e are graphical representations of the various waveforms and pulses which are present in the circuits of FIGS. 2, 3, 4 and 5 when the dryer of FIG. 1 is connected to a true 240 VAC electrical service.
Figure 9B:
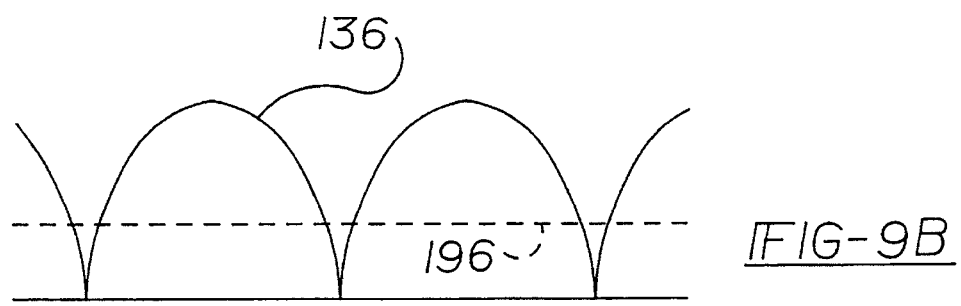
Figure 9C:
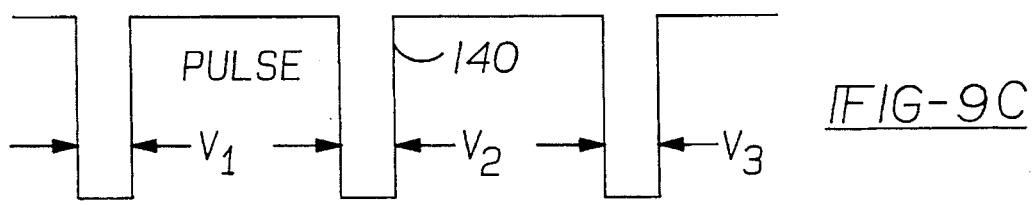
Figure 9D:
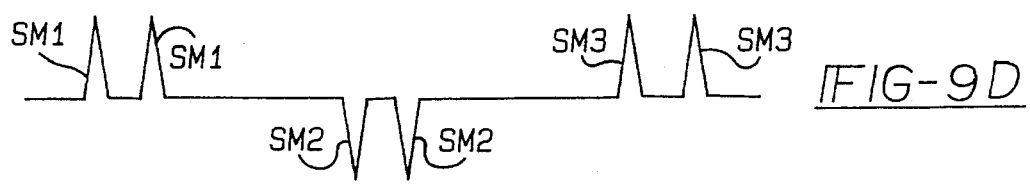
Figure 9E:
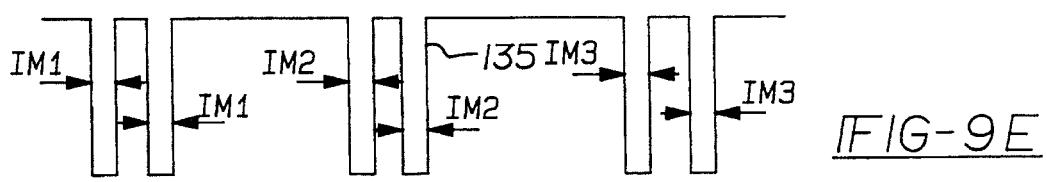
Figure 10A:
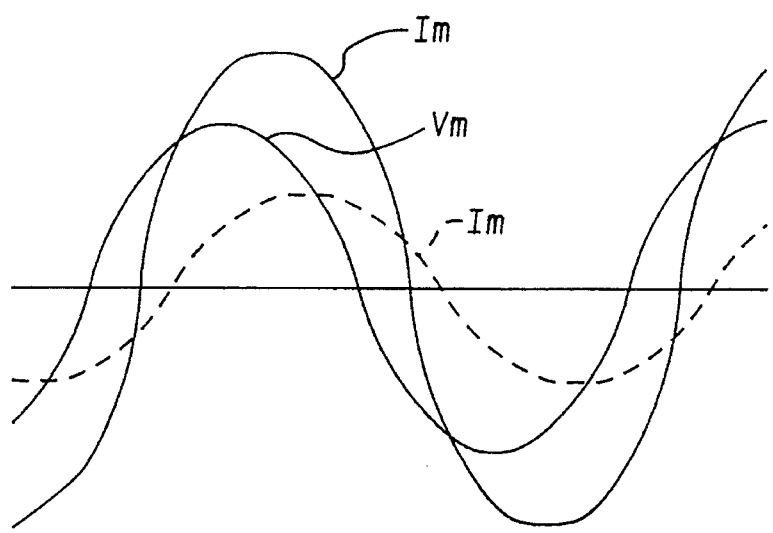
FIGS. 10a, 10b, 10c and 10d are graphical representations of the various waveforms and pulses present in the circuits of FIGS. 2, 3, 4, and 5 when the dryer of FIG. 1 is connected to a 208 VAC electrical service for the situation wherein the heater current lags the motor voltage by thirty electrical degrees.
Figure 10B:
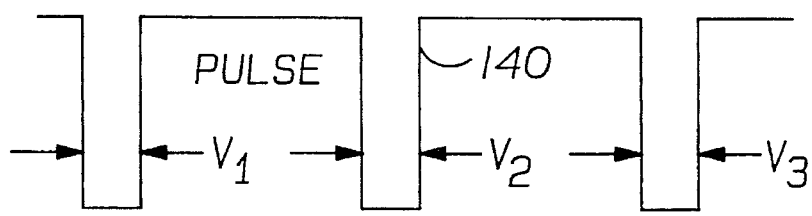
Figure 10C:
Figure 10D:
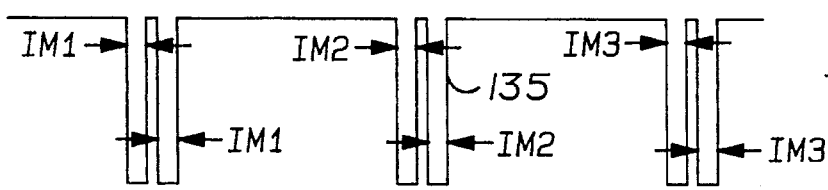

FIG. 9a shows the alternating voltage Vm across the motor 18, or, service lines L1 and N, current Im of the motor 18, and, the current Ih of the heater 34 for the case where the service voltage is a true 240 VAC source. The full-wave signal 136 from the voltage regulator circuit 124 and the DC threshold voltage 196 of the volt pulse circuit 136 is shown graphically in FIG. 9b. The volt pulse train 140 at the output of comparator CM1 of the volt pulse circuit 138 is shown graphically in FIG. 9c. Each volt pulse V1, V2 or V3 represents the time during which the voltage 136 is less than the threshold voltage 196. The volt pulses V1, V2 and V3 occur at twice the line voltage frequency regardless of whether the motor 18 is ON or OFF. For a 60 Hz power source, there are 120 volt pulses per second. The width of each volt pulse may vary according to the amplitude of the line voltage and, hence, the full-wave rectified waveform 136, which determines the steepness or slope of the waveform in the vicinity of the zero value. If the alternating voltage Vm is higher than normal, the full wave voltage 136 will be higher than normal and, consequently, the resulting volt pulses V1, V2, V3, etc. will be narrower than normal because the waveform of the voltage 136 is below the DC threshold voltage 196 for a lower percentage of the time of each half cycle. Conversely, if the alternating voltage Vm is lower than normal, the full wave voltage 136 will be lower than normal, and, the resulting volt pulses V1, V2, V3, etc. will be wider than normal because waveform of the voltage 136 is below the DC threshold voltage 196 for a higher percentage of the time of each half cycle.

Hence, the width if each volt pulse V1, V2, V3, etc. is inversely related to the service voltage Vm across L1 and N regardless of which microcomputer output line 139 or 141 is LOW. Now, when microcomputer 134 output line 141 is LOW and output line 139 is HIGH, the DC threshold voltage 196 is constant, and, the resulting volt pulses are inversely related to the service voltage Vm. Conversely, when microcomputer 134 output line 141 is LOW and 139 is HIGH, the DC threshold voltage 196 is floating in response to variation in the NTC thermistor RS6 resistance, which responds to the exhaust air temperature. Thus, the resulting volt pulses V1, V2, V3, etc. are both inversely related to the service volt-age Vm, and, inversely related to the exhaust air temperature In accordance with Faraday's law of voltage induction, the electromotive force, or voltage, induced across the sense winding 108 is proportional to the rate of change of the magnetic flux in each ferrite core 102 and 104. However, the cores 102 and 104 quickly saturate immediately following each motor 18 or heater 34 current zero-crossing, respectively. Thus, a sharp voltage spike is generated across terminals 120 and 122 of the sense winding 108 whenever the current passing through the motor 18 or the heater 34 reverses polarity, or, passes through a zero-crossing. When the motor 18 and the heater 34 are ON, each core 102 or 104 generates a train of alternating positive and negative voltage spikes at a rate of one pulse per each line half cycle, or, 120 pulses per second with a 60 Hz source. It should be noted that the magnitude and sharpness of each spike is proportional to the rate of change of the current flowing through the primary winding 68 or 76 at the time of zero-crossing. However, it is the timing relationships between the line voltage across leads L1 and N, and, the motor 18 or heater 34 current zero-crossings which is utilized in the present invention, and not the magnitude of the current of the motor 18 or heater 34 and not the magnitude of the induced voltage spikes. The induced voltage spikes for the first three zero-crossings of the current Ih of the heater 34 and the current Im of the motor 18 are shown in FIG. 9d as voltage spikes Sh1, Sh2 and Sh3, and, Sm1, Sm2 and Sm3, respectively.

The preferred parts for ferrite cores 102 and 104 are shield bead #2643000801 and torroid #5977000302 both manufactured by the Fair-Rite Products Corporation of Wallkill, N.Y. The smaller the inside dimension of the core 102, and, the longer the length dimension of the core 102 parallel to the primary winding 68, the larger the magnitude of the induced voltage across the secondary winding 108. With core 104 the magnitude of the heater current Ih is so large that obtaining sufficient induced voltage magnitude is less of an issue than is the ability to slide the core 104 over a wire 76 carrying the heater current Ih. Hence, a core 104 with a larger inside diameter dimension is selected. The peak magnitude of the induced voltage spikes Sh1, Sh2, Sh3, Sm1, Sm2 and Sm3 is about 40 millivolts. The cores 102 and 104 are preferably located on a printed circuit board near the current pulse circuit 118 and other electronics to avoid the use of connectors with the small sense winding 108. However, either or both of cores 102 and/or 104 may be be located remote from the electronics.

Figure 8A:
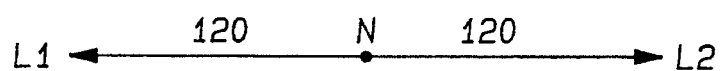
FIGS. 8a and 8b are graphical representations of the amplitude and phase relationships between the neutral N and the HOT L1, L2 and L3 sides of the electrical service voltage for a true 240 VAC and a 208 VAC service, respectively.
Figure 8B:
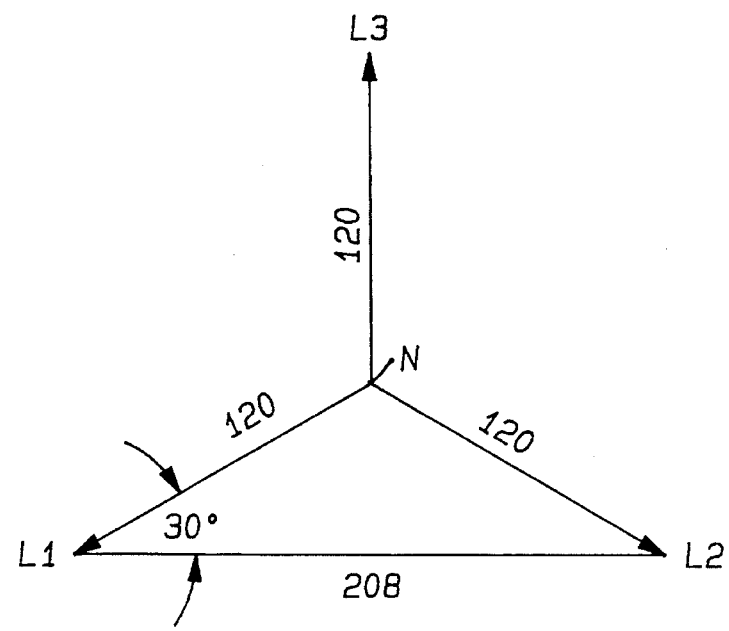

A graphical representation of the amplitude and phase relationship between the neutral side N and the hot sides L1 and L2 of a true 240 VAC service is shown in FIG. 8a. The voltage from L2 to neutral N is exactly 180 electrical degrees out of phase with the voltage from side L1 to neutral side N. Hence, the voltage from side L1 to side L2 is 120 plus 120, or 240 VAC. Since the heater current is in phase with the heater voltage, the current through the heater 34 is in phase with the voltage of the motor 18 when the dryer 10 is plugged into a true 240 VAC service. A graphical representation of the amplitude and phase relationship between the neutral side N and the hot sides L1, L2 and L3 of a three phase 208 VAC service is shown in FIG. 8b. Each hot side L1, L2 or L3 to neutral side N is 120 VAC, and, each hot side is separated by 120 electrical degrees in phase from the other two hot sides. Note that the points L1-N-L2 define a 30-120-30 degree triangle. If the legs from hot side L1 to neutral side N and L2 to neutral side N are 120 VAC, than the leg from hot side L1 to hot side L2 is 208 VAC. The voltage across the heater 34 from hot side L1 to hot side L2 either leads or lags the voltage from hot side L1 to neutral side N by thirty electrical degrees, depending on the polarity of the service leads. Since the heater current is in phase with the heater voltage, the current through the heater 34 either leads or lags the voltage across the motor 18 by thirty electrical degrees when the dryer is plugged into a 208 VAC service. The present invention uses this principal to detect whether the dryer 10 is powered by a 240 VAC or a 208 VAC source.

FIGS. 10a, 10b, 10c, 10d are graphical representations of the various waveforms and pulses present in the circuits of FIGS. 2, 4, and 5 when the dryer 10 is plugged into a 208 VAC electrical service for the case wherein the 3-wire dryer pigtail happens to be connected to the service receptacle such that the heater current Ih lags the motor voltage Vm by thirty electrical degrees. Note that the voltage spikes Sh1, Sh2 and Sh3 from ferrite core 104 due to the heater current zero-crossings and the resulting heater current pulses Ih1, Ih2 and Ih3 lag the respective volt pulses V1, V2 and V3.

Figure 11A:
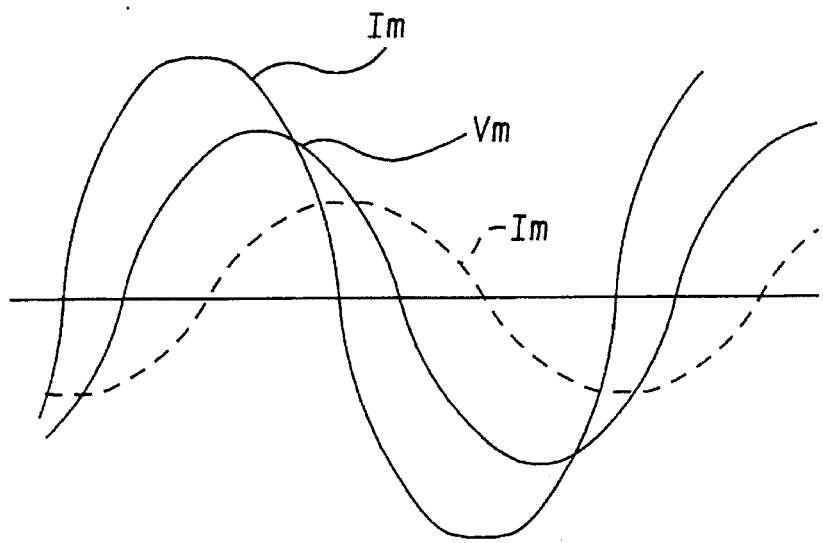
FIGS. 11a, 11b, 11c and 11d are graphical representations of the various waveforms and pulses present in the circuits of FIGS. 2, 3, 4, and 5 when the dryer of FIG. 1 is connected to a 208 VAC electrical service for the situation wherein the heater current leads the motor voltage by thirty electrical degrees.
Figure 11B:
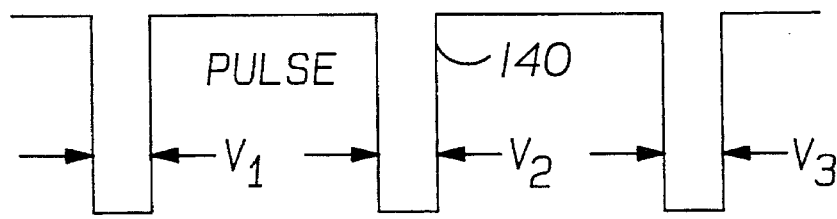
Figure 11C:
Figure 11D:
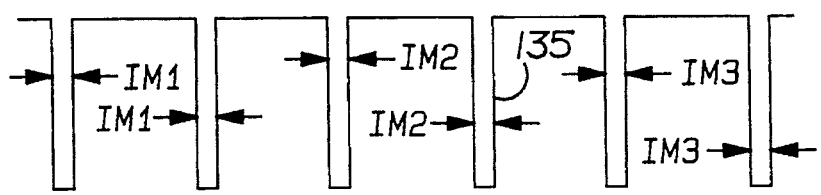

FIGS. 11a, 11c and 11d are graphical representations of the various waveforms and pulses present in the circuits of FIGS. 2, 4 and 5 when the dryer is plugged into a 208 VAC electrical service for the case wherein the 3-wire dryer pigtail happens to be connected to the service receptacle such that the heater current Ih leads the motor voltage Vm by thirty electrical degrees. Note that the voltage spikes Sh1, Sh2 and Sh3 from the ferrite core 104 due to the heater current zero-crossings and the resulting heater current pulses Ih1, Ih2 and Ih3 lead the respective volt pulses V1, V2 and V3. A VOLT routine 1460, explained later, is called by the microprocessor 134 at the start of each cycle to identify the service voltage as 240 or 208 VAC, and, to the determine whether the heater current leads or lags the motor voltage when the service voltage is 208 VAC.

It will be apparent to those skilled in the art that a systematic bias could be introduced in the motor phase data from odd or even numbered line half cycles due to component differences between RS12 and RS13, or, between comparators CM2 and CM3. Similarly, a systematic bias could be introduced in the motor phase data due to occasional asymmetry in the positive and negative half cycles of the service voltage, say, due to a silicon controlled rectifier load, from another appliance, which draws power unevenly from alternate line half cycles. Rather than ignoring this potential bias, or, employing costly component matching techniques, the preferred embodiment eliminates the effect of the above systematic biases through the exclusive use of microcomputer 134 soft-ware programs which either use sufficient data memory to make motor phase comparisons without mixing data from odd and even numbered line half cycles, or, make decisions from data which include an equal number of motor phase samples from positive and negative line voltage half cycles.

Figure 6:
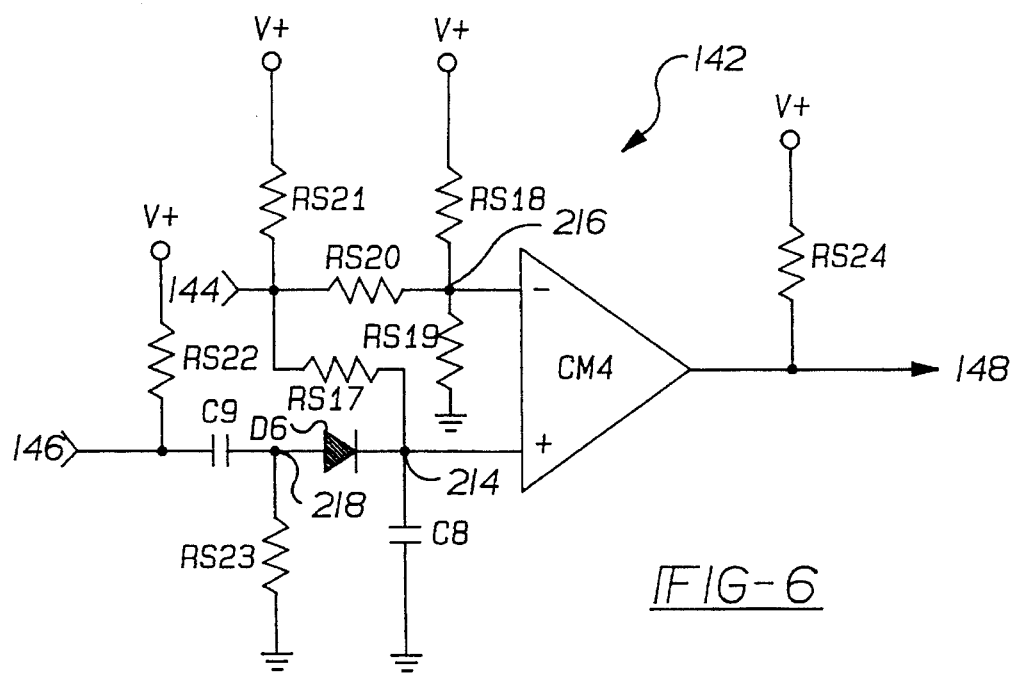
FIG. 6 is a circuit diagram for the watchdog circuit of FIG. 2.

The watchdog circuit is shown in FIG. 6. The watchdog circuit 142 provides a hard-wired RESET signal to the microcomputer 134 whenever the microcomputer 134 fails to echo the volt pulse signal 140 to the watchdog circuit 142 for a preset period of time. The watchdog circuit 142 also resets the microcomputer 134 during the initial powerup period.

More specifically, input 144 to the watchdog circuit 142 is a dedicated status output from the microcomputer 134 which is HIGH whenever the microcomputer 134 is being RESET and LOW at all other times via microcomputer 134 software. All microcomputer 134 outputs including output line 144 are HIGH whenever the microcomputer 134 is RESET. Resistor RS24 is a pullup resistor at the output of comparator CM4 for the RESET signal 148 to the microcomputer 134. The microcomputer 134 is being RESET when the comparator CM4 output 148 is LOW. Resistor RS21 is a pull-up resistor for the status input 144. When the microcomputer 134 is being RESET, the status input 144 is HIGH and capacitor C8 charges toward V+ through resistors RS17 and RS21. At all other times the status input 144 is LOW and capacitor C8 is discharging toward circuit ground through RS17.

The common connection 214 between resistor RS17 and capacitor C8 is wired to the noninverting input of comparator CM4 and the cathode of diode D6. The resistor divider RS18 and RS19 defines a DC voltage threshold at the inverting input 216 of comparator CM4. Resistor RS20 is connected from the status input 144 to the inverting input 216 of comparator CM4. Resistor RS20 provides feedback which ensures overall circuit 142 stability when the RESET signal 148 is removed and the microcomputer status input goes from HIGH to LOW. Capacitor C9 is connected from the volt pulse echo input 146 to the anode of diode D6. Resistor RS22 is a pullup resistor for the microcomputer 134 volt pulse echo output 146. A current path from the connection 218 between capacitor C9 and diode D6 to circuit ground is provided by resistor RS23. Under normal operating conditions a volt pulse train 140 comprising 120 volt pulses per second is received by the microcomputer 134 and programming is used to echo the volt pulse 140 to the watchdog circuit 142 via watchdog circuit input 146. Energy from the positive voltage transition at the trailing edge of each volt pulse echo signal is coupled by capacitor C9 and diode D6 to charge capacitor C8.

Should either the volt pulse circuit 138 or the microcomputer 134 become inoperative, the volt pulse echo signal will remain either in the HIGH or the LOW state and capacitor C8 will discharge through resistor RS17 toward circuit ground. When the voltage at the noninverting input 214 of comparator CM4 drops below the DC threshold voltage at the inverting input 216, the comparator CM4 output will switch from HIGH to LOW and a RESET signal 148 will be sent to the microcomputer 134. If the dryer happens to be in a clothes drying cycle, the cycle will be aborted. Upon recognizing receipt of a RESET signal, all microcomputer 134 output lines, including the watchdog status input 144, will go HIGH, and, capacitor C8 will charge toward V+ through resistors RS17 and RS21. Feedback resistor RS20 will provide a somewhat higher DC threshold at the inverting input 75 of comparator CM4. When the capacitor C8 has charged sufficiently to cause the voltage at the noninverting input 74 of comparator CM4 to exceed the DC threshold 216 at the inverting input, the comparator CM4 output will go LOW, the microcomputer 134 status input 144 to the watchdog circuit 142 will go LOW via programming, and, the microcomputer 134 will be restored to normal operation.

A dryer cycle will begin the next time that the user presses the start button 38. On initial powerup the status input 144 is HIGH and the comparator CM4 output 148 remains LOW until the capacitor C8 has charged sufficiently to cause the voltage at the noninverting input 214 to comparator CM4 to exceed the DC threshold 216 at the inverting input. Hence, the microcomputer 134 will be RESET on powerup.

Figure 7:
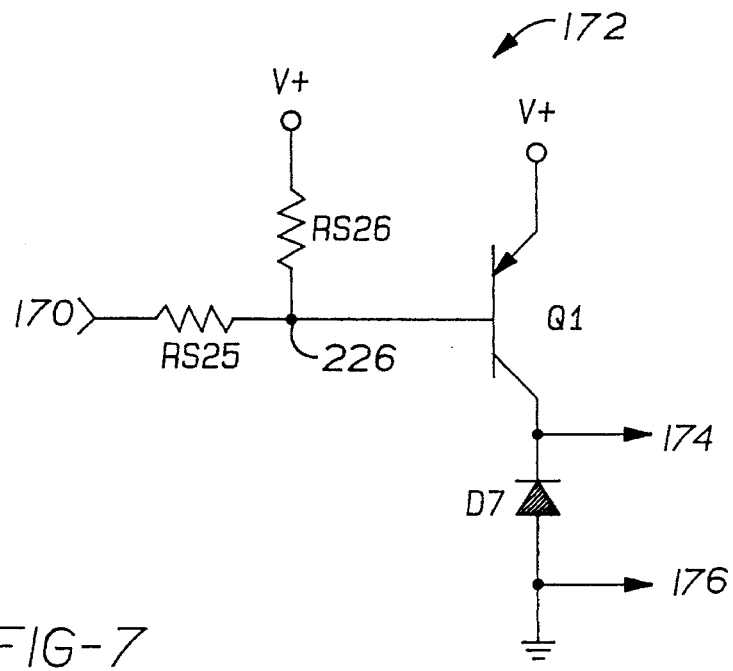
FIG. 7 is a circuit diagram for the motor and heater relay driver circuits of FIG. 2.

The relay driver circuit 172 is shown in FIG. 7. The preferred circuit uses a PNP transistor Q1 inverter to provide sufficient current gain to drive a DC relay coil from the binary microcomputer 134 output signal 170.

More specifically, resistor RS26 is connected from the base of PNP transistor Q1 to V+ and resistor RS25 is connected from the binary microcomputer 134 output 170 to the base of transistor Q1. The emitter of PNP transistor Q1 is directly connected to V+. The collector of transistor Q1 is connected from one end 174 of the DC relay coil 178 and the cathode of diode D7. The anode of diode D7 is connected to circuit ground. The other end 176 of the DC relay coil 178 is also connected to circuit ground. Diode D7 is a flyback diode which dissipates the stored magnetic energy of the relay coil when the PNP transistor Q1 turns OFF. When the binary microcomputer 134 output line 170 is LOW, sufficient base drive current is provided through resistor RS25 to forward bias transistor Q1, energize the relay coil 178 and close the motor relay contact 62. When the binary microcomputer 134 output line 170 is HIGH, transistor Q1 is in the OFF or blocking state, the relay coil is not energized and the motor relay 62 is open.

Although the values of the components shown in FIGS. 3, 4, 5, 6, 7 and 8 may be selected to meet individual circuit requirements in a manner known to those skilled in the art without departing from the inventive concept disclosed herein, an exemplary embodiment of these circuits can be realized wherein the comparators CM1, CM2, CM3 and CM4 are each one-quarter of an LM339 quadruple comparator package, the voltage regulator integrated circuit 188 is a 7805 five volt regulator IC, and wherein the remaining components have the following values:

| COMPONENT | VALUE(OHMS/MICROFARADS) |
| --- | --- |
| RS1 | 1.2K |
| RS2 | 1K |
| RS3 | 15k |
| RS4 | 3.3k |
| RS5 | 1k |
| RS6 | NTC thermistor 10k @ 77F |
| RS7 | 10K |
| RS8 | 100K |
| RS9 | 680K |
| RS10 | 5.6K |
| RS11 | 10K |
| RS12 | 22 |
| RS13 | 22 |
| RS14 | 1k |
| RS15 | 5.6K |
| RS16 | 100 |
| RS17 | 100K |
| RS18 | 3.9K |
| RS19 | 1K |
| RS20 | 10K |
| RS21 | 6.8K |
| RS22 | 3.3K |
| RS23 | 1.5K |
| RS24 | 5.6k |
| RS25 | 1.5k |
| RS26 | 10k |
| C1 | 1500 |
| C2 | 33 |
| C3 | 0.02 |
| C4 | 0.0047 |
| C5 | 0.01 |
| C6 | 0.01 |
| C7 | 0.68 |
| C8 | 0.47 |
| C9 | 0.15 |
| C10 | 0.02 |

4. Description of the Control Logic

Detailed flow charts are disclosed which show how the microcomputer processes the motor phase and heater information to detect various clothes dryness and dryer diagnostic conditions. Further additional supervisory flow charts for the programmed microcomputer are disclosed which show how these computed parameters may be utilized to automatically control the cycle of any dryer 10 with an induction motor 18 and an electric resistance heater 34.

It is emphasized at the outset that the present invention does not use phase control. It is the natural motor phase angle that is being sampled. The ferrite core sensors are used to provide timing signal spikes in response to motor or heater current zero-crossings, not in response to the magnitude of the motor or heater current.

Flow charts for the logic 1000 for a programmed microcomputer are illustrated in FIGS. 12 through 41 which show how the microcomputer 134 of FIG. 2 may be dedicated during one portion of each line half cycle to monitor timing relationships between the volt and current pulses with crystal controlled clock cycles as well as the presence or absence of heater current. Through the speed of the microcomputer, all data processing and/or decision making is complete before the arrival of any current pulse information for the next line half cycle. The flow charts also show how the microcomputer 134 processes the motor phase, heater cycling, and thermistor resister information to determine dryer operational information and to automatically control dryer operation.

Figure 12:
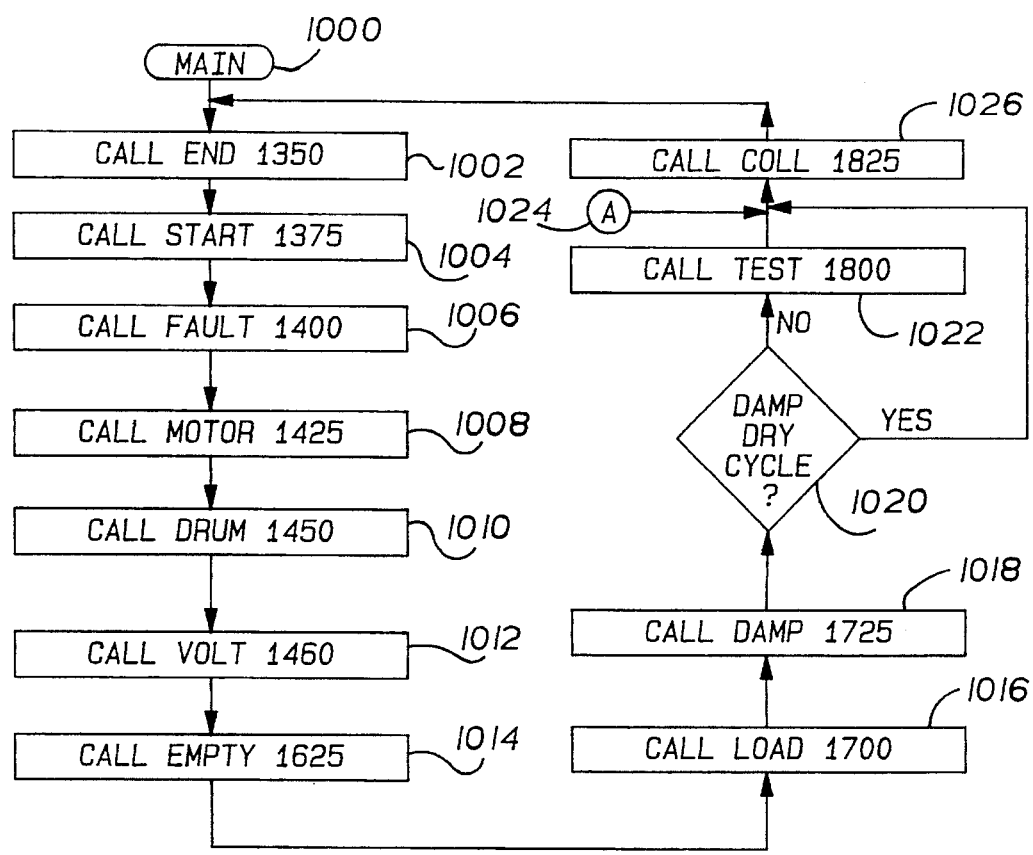
FIG. 12 is a flow chart for the MAIN program domestic dryer cycle according to the present invention.

A flow chart for the MAIN program 1000 is shown in FIG. 12. The MAIN program 1000 provides a complete clothes drying cycle with a sequence of diagnostics at the start of each cycle, and, a clothes cooldown period at the end of each cycle. The MAIN program 1000 loops back after the completion of each cycle to wait for the user to initiate the next cycle. Electrical power is removed from the motor 18 and heater 34 circuits between cycles, however, the microcomputer 134 circuit is powered at all times including between cycles.

More specifically, the MAIN program 1000 calls the END routine 1350 at program step 1002 to powerdown all outputs from the previous cycle.

The START routine 1375 is called at step 1004 to loop until the user has released the start button 38 from the previous cycle, and, presses the start button to initiate the next cycle.

The FAULT routine 1400 is called at step 1006 to toggle the heater relay 74 and abort the cycle if a heater ground fault condition is detected by ferrite core 104.

The MOTOR routine 1425 is called at step 1008 to activate the motor relay 74, monitor the motor phase angle during each line half cycle, and, abort the cycle if the motor fails to start within a prescribed time limit.

The DRUM routine 1450 is called at step 1100 to monitor any motor centrifugal switch 56 cycling during the period of acceleration of the drum 16 and abort the cycle if the motor 18 is struggling to accelerate the rotating dryer drum.

The VOLT routine 1460 is called at step 1012 to activate the heater relay 74 and abort the cycle if the heater circuit is OPEN. The VOLT routine 1460 is used to identify the service voltage as 240 or 208 VAC, and, to further identify whether the heater current leads or lags the motor voltage if the service voltage is 208 VAC.

The EMPTY routine 1625 is called at step 1014 to sample a clothes tumble number and abort the cycle if the drum 16 is empty. The LOAD routine 1700 is called at step 1016 to loop to the tumble number routine TNR 1600 a sufficient number of times to "load" the stack of the last nine clothes tumble numbers with good data.

The DAMP routine 1725 is called at step 1018 to establish a damp dry threshold and return to the MAIN program 1000 with the clothes load at a damp dry condition suitable for ironing. Decision step 1020 branches to step 1026 if the user has selected the damp dry cycle. Otherwise, the program falls through decision step 1020 to program-step 1022. Program step 1022 calls the TEST routine 1800. The TEST routine 1800 returns to the MAIN program 1000 when the clothes tumble numbers are no longer decreasing in accordance with the user cycle selection.

The COOL routine 1825 is called at step 1026 to terminate the cooldown period when the exhaust air temperature is no longer decreasing.

The MAIN program 1000 then calls the END routine 1350 to powerdown the present cycle and the START routine 1375 to await the start of the next cycle. The cycle is advanced to the cooldown period at point "A" 1024 by the BELT routine 1225 if a broken belt occurs during the heat dry period, the STAT routine 1250 if the heater box safety thermostat 72 trip count exceeds a limit defined by the VOLT routine 1460, or, if the NEXT routine 1675 has determined that an overall cycle time limit has expired.

Figure 13:
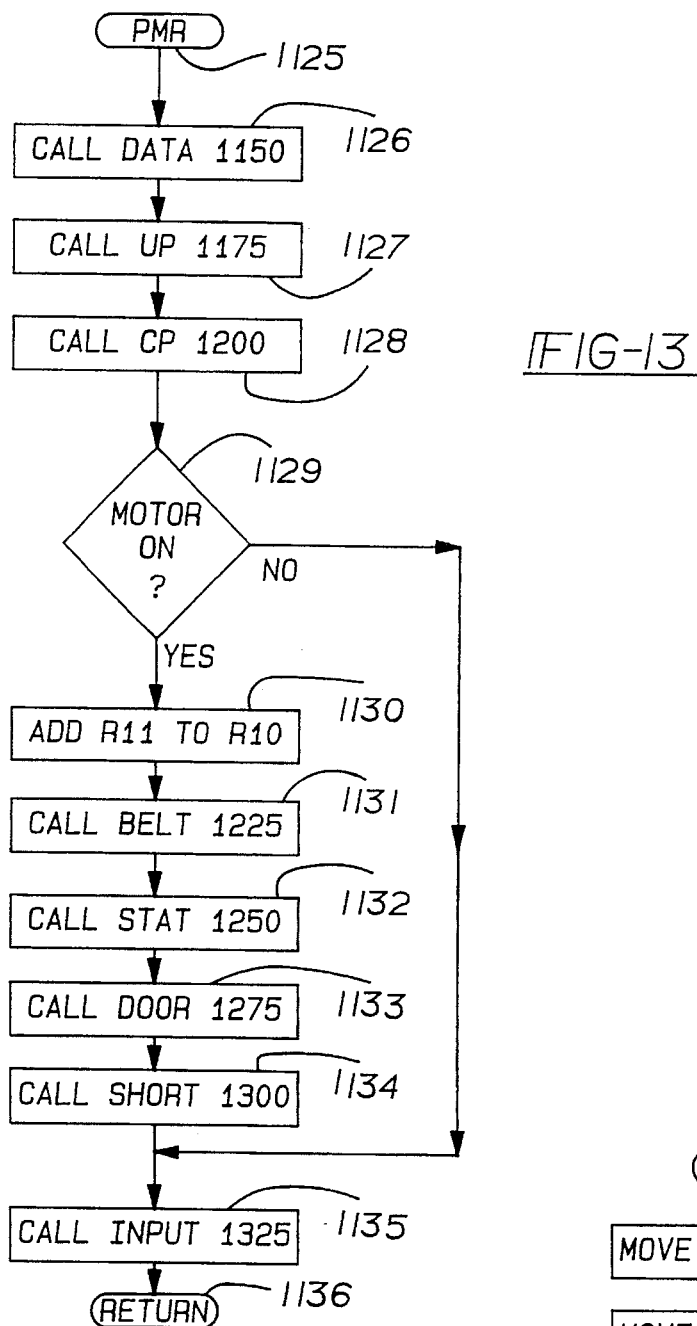
FIG. 13 is a flow chart for the phase monitoring routine to monitor whether heater current is present, and, to sample the motor phase angle.

A flow chart for the phase monitoring routine PMR 1125 is shown in FIG. 13. The phase monitoring routine PMR 1125 is called by the START routine 1375 to mark time for one half of a line cycle, and, by the FAULT routine 1400, MOTOR routine 1425, DRUM routine 1450, VOLT routine 1460 and tumble number routine TNR 1600 to monitor whether heater current is present, and, to sample the lagging phase angle of the motor 18.

More specifically, the phase monitoring routine PMR 1125 calls the DATA routine at program step 1126 to adjust the data stack of the last five motor phase numbers and prepare to accumulate the sum of the last two motor phase numbers. The volt pulse routine VPR 1175 is called at step 1127 to monitor the width of the next volt pulse, and, to set flags in accordance with the possible occurrence of a heater current pulse. The current pulse routine CPR 1200 is called at step 1128 to sample the motor phase angle, and, to set flags upon the occurrence of current pulses of the heater 34 and motor 18. Decision step 1129 branches to step 1135 if output line 170 of the microcomputer 134 is HIGH. That is, decision step 1129 branches to step 1135 if the driver circuit 17 of the motor relay 62 is not activated. Otherwise, the program falls through decision step 1129 to program step 1130.

Program step 1130 completes a process started by the DATA routine 1150 to compute the sum of the last two motor phase numbers in data memory register R10. Specifically, the last motor phase number in register R11 is added to the second last motor phase number in register R11 so that the new number in data memory register R10 is the sum of the last two motor phase numbers. Of course, the phase monitoring routine PMR 1125 must be called on at least two consecutive line half cycles with the motor relay 62 closed before the data in register R10 will be usable.

The BELT routine is called at step 1131 to compare the last and the fifth last motor phase numbers over a prescribed sample period for the purpose of determining if the motor 18 is running too smoothly, an indication that the drive belt is broken or detached. If a broken belt is detected during the initial cycle startup sequence or during the heat dry period, the BELT routine 1225 terminates the cycle or advances the cycle to the cooldown period, respectively. Otherwise, the BELT routine 1225 returns to the phase monitoring routine PMR 1125 at program step 1132. The STAT routine 1250 is called at program step 1132 to detect and count each cycling of the heater box safety thermostat 72 and to advance the cycle to the cooldown period if the trip count exceeds a threshold defined by the VOLT routine 1460. Otherwise, the STAT routine 1250 returns to the phase monitoring routine PMR 1125 at program step 1133.

The DOOR routine 1275 is called at program step 1133 to abort the cycle if the circuit of the motor 18 is OPEN for on sixteen consecutive passes. Such an open circuit can occur if the door switch 60 is open, the motor relay contact 62 fails to close, the motor thermal protector 50 trips, or, the thermal fuse 58 blows. Normally, the DOOR routine 1275 returns to the phase monitoring routine PMR 1125 at program step 1134.

The SHORT routine 1300 is called at program step 1134 to abort the cycle if the heater circuit is conducting when the heater relay 74 is supposed to be open. Normally, the SHORT routine 1300 returns to the phase monitoring routine PMR 1125 at program step 1135. The INPUT routine 1325 is called at program step 1135 regardless of whether the motor 18 is ON to provide a software debounce algorithm for all input switches. The phase monitoring routine PMR 1125 returns to the calling program at step 1136 with the last through the fifth last motor phase numbers in data memory registers R1 through R5, respectively, and, the sum of the last two motor phase numbers in register R10. Also, the first current pulse flag, two current pulse flag, and, early current pulse flag are SET or CLEAR in accordance with conditions defined in more detail elsewhere.

Figure 14:
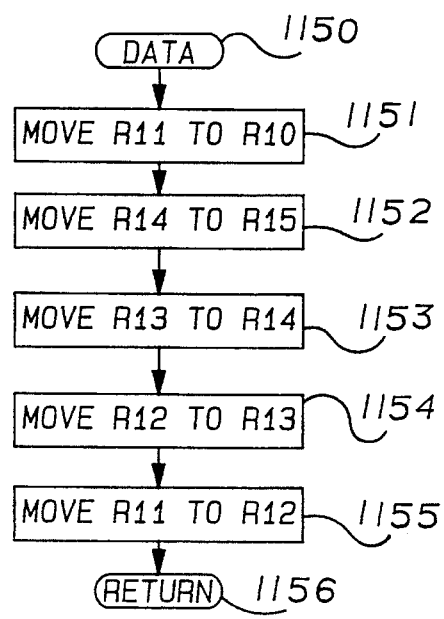
FIG. 14 is a flow chart for the DATA routine called once per each line half cycle by the phase monitoring routine of FIG. 12 to adjust a data memory stack of the last five motor phase numbers so as to prepare to accumulate the sum of the last two motor phase numbers in a data memory register.

A flow chart for the DATA routine 1150 is shown in FIG. 14. The DATA routine 1150 is called once per each line half cycle by the phase monitoring routine PMR 1125 to adjust a data memory stack of the last five motor phase numbers, and, to prepare to accumulate the sum of the last two motor phase numbers in register R10.

More specifically, the DATA routine 1150 moves the most recent motor phase number in register R11 to register R10 in preparation for the subsequent computation of the sum of the last two motor phase numbers in register R10. Data memory registers R14, R13, R12 and R11 contain the fourth, third, second and first last motor phase numbers, respectively. After the phase monitoring routine PMR 1125 samples the next motor phase number, the numbers presently in registers R14, R13, R12 and R11 will become the fifth, fourth, third and second last motor phase numbers, respectively. The purpose of the DATA routine is to adjust this data stack of the last five motor phase numbers in preparation for the next sample. Specifically, the old fourth last motor phase number in register R14 becomes the new fifth last motor phase number in register R15 at program step 1152. Similarly, the old third last motor phase number in register R13 becomes the new fourth last motor phase number in register R14 at step 1153. And, register R12 is moved to register R13 at step 1154. Finally, register R11 is moved to register R12 at step 1155. The DATA routine 1150 returns to the phase monitoring routine PMR 1125 at step 1156 with data memory register R11 available to store the result of the next motor phase sample.

Figure 15:
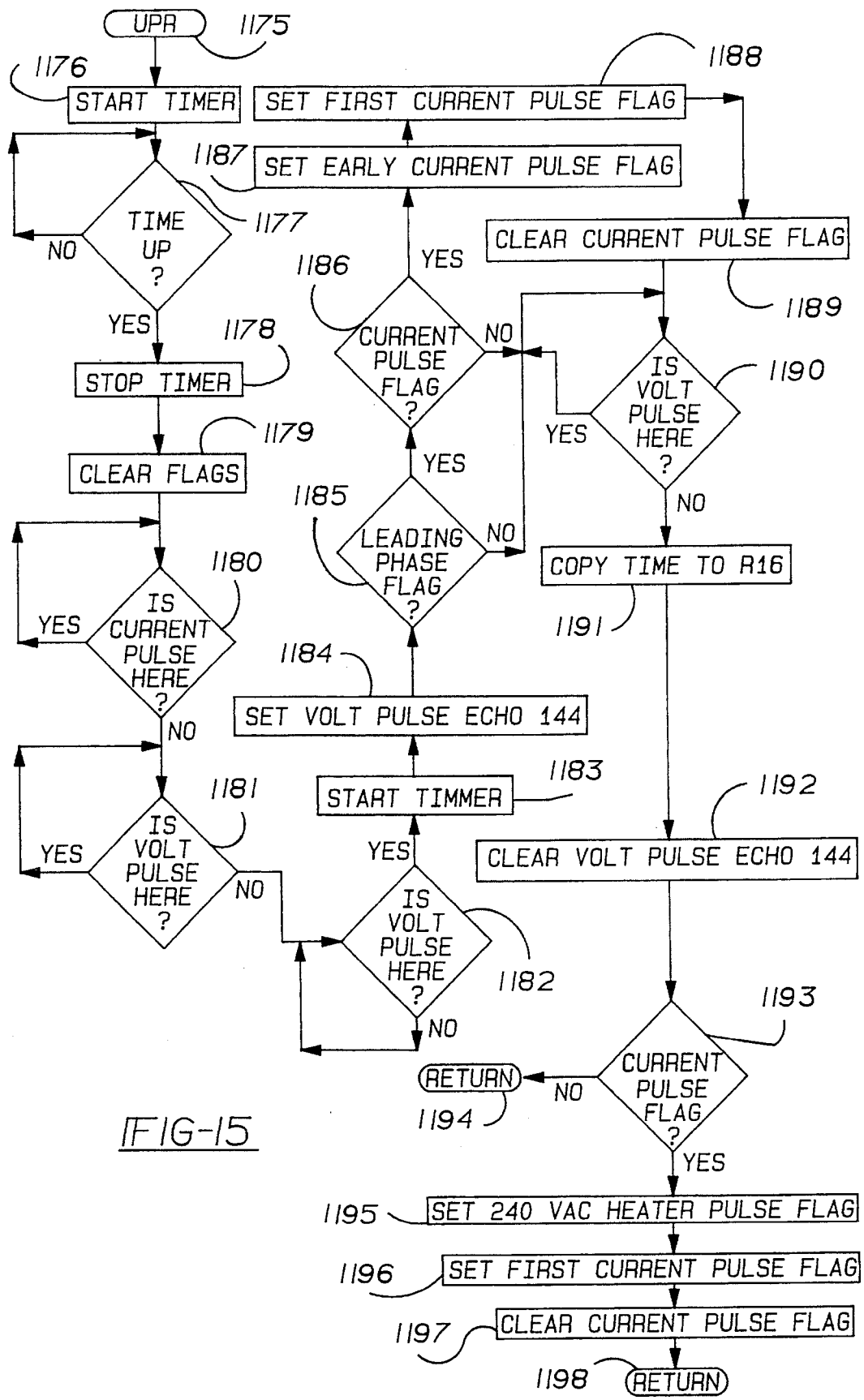
FIG. 15 is a flow chart for the volt pulse routine called once per each line half cycle by the phase monitoring routine to start a timer at the leading edge of the next volt pulse, monitor the width of the next volt pulse and to set flags in accordance with the possible occurrence of a heater current pulse.

A flow chart for the volt pulse routine VPR 1175 is shown in FIG. 15. The volt pulse routine VPR 1175 is called once per each line half cycle by the phase monitoring routine PMR 1125 to use a microcomputer 134 crystal controlled timer to monitor the width of the volt pulse, and, to set flags in accordance with the possible occurrence of a current pulse of the heater 34.

More specifically, the volt pulse routine uses program steps 1176 and 1177 to avoid getting started in the wrong portion of a line half cycle, especially, the very first time that the phase monitoring routine PMR is called. Specifically, the timer is started, or, if already running, allowed to continue, at program step 1176. Decision step 1177 loops back upon itself until a preset minimum time has elapsed since the timer was last started. After satisfying the minimal elapsed time criterion, the program falls through decision step 1177 to step 1178 whereupon the time is stopped. The first current pulse flag, two current pulse flag, early current pulse flag and 240 VAC heater pulse flag are all cleared at program step 1179. These flags use one bit of an 8-bit data memory register and can be cleared in one step. Also, a current pulse interrupt flag in the microcomputer 134 input/output status register is cleared at step 1179. Decision step 1180 loops back upon itself if a current pulse 135 happens to be present. When the current pulse output line 135 is HIGH, the program falls through decision step 1180 to decision step 1181. Decision step 1181 loops back upon itself if a volt pulse 140 happens to be present. It is important to begin the next volt pulse and motor phase sample at the leading edge of the next full volt pulse, not in the middle of a volt pulse.

The program falls through decision step 1181 to decision step 1182 as soon as the volt pulse output line 140 is HIGH. Usually, on all except the very first pass through the phase monitoring routine PMR 1125 following a microcomputer 134 RESET signal on line 148, the program falls directly through decision steps 1177, 1180 and 1181 to decision step 1182. Decision step 1182 loops back upon itself until the arrival of leading edge of the next volt pulse on line 140 whereupon the program falls through decision step 1182 via a program interrupt to step 1183. The crystal controlled timer of the microcomputer 134 is initialized and started at step 1183. With a 5 megahertz ceramic resonator, the Texas Instruments TMS7040 microcomputer timer "ticks" once every 3.1 microseconds.

The volt pulse echo microcomputer 134 output line 71 is driven LOW at step 1184 as a signal to the watchdog circuit 142. Decision step 1185 branches to decision step 1190 if the leading phase flag is clear. The leading phase flag is set by the FAULT routine 1400 at the beginning of each cycle to allow detection of a leading heater current pulse on a 208 VAC service. The leading phase flag is cleared by the VOLT routine 1460 if the service has been identified to be 240 VAC, or, 208 VAC with a lagging heater current pulse. Otherwise, the program falls through decision step 1185 to decision step 1186. Decision step 1186 branches to decision step 1190 if a microcomputer input/output control register flag indicates that a current pulse has not occurred since the flags were cleared at step 1179. Otherwise, an early current pulse has occurred as is the case when the heater 34 is ON with a 208 VAC service having a leading polarity, and, the program falls through decision step 1186 to step 1187. The early current pulse flag is set at step 1187. The first current pulse flag is set at step 1188. And, the current pulse flag at the microcomputer input/output register is cleared at step 1189. Decision step 1190 loops back upon itself until the volt pulse output line 140 goes HIGH whereupon the program falls through decision steps 1190 to step 1191. The elapsed time on the microcomputer timer is copied to register R16 at program step 1191 without stopping the timer. The volt pulse echo output line 146 is driven HIGH at step 1192 as a signal to the watchdog circuit 142.

The input/output register current pulse interrupt flag of microcomputer 134 is checked at decision step 1193 to determine whether or not a heater current pulse occurred during the volt pulse. If a current pulse did not occur, the program branches to step 1194 to return to the phase monitoring routine PMR 1125. Otherwise, a current pulse did occur during the volt pulse and the program falls through to step 1195. The 240 VAC heater current pulse flag is set at step 1195 and the first current pulse flag is set at step 1196. The input/output register current pulse flag of microcomputer 134 is cleared at step 1197 and the program returns to the phase monitoring routine PMR 1125 at step 1197. Hence, the volt pulse routine VPR 1175 returns to the phase monitoring routine PMR 1125 with a number inversely related to the magnitude of the voltage across hot line L1 and neutral line N in register R16 namely, the 240 VAC heater pulse flag set if a current pulse has occurred during the volt pulse, the early current pulse flag set if a current pulse has occurred before the arrival of the volt pulse, and, the first current pulse flag set if either of the other two flags are set.

Figure 16:
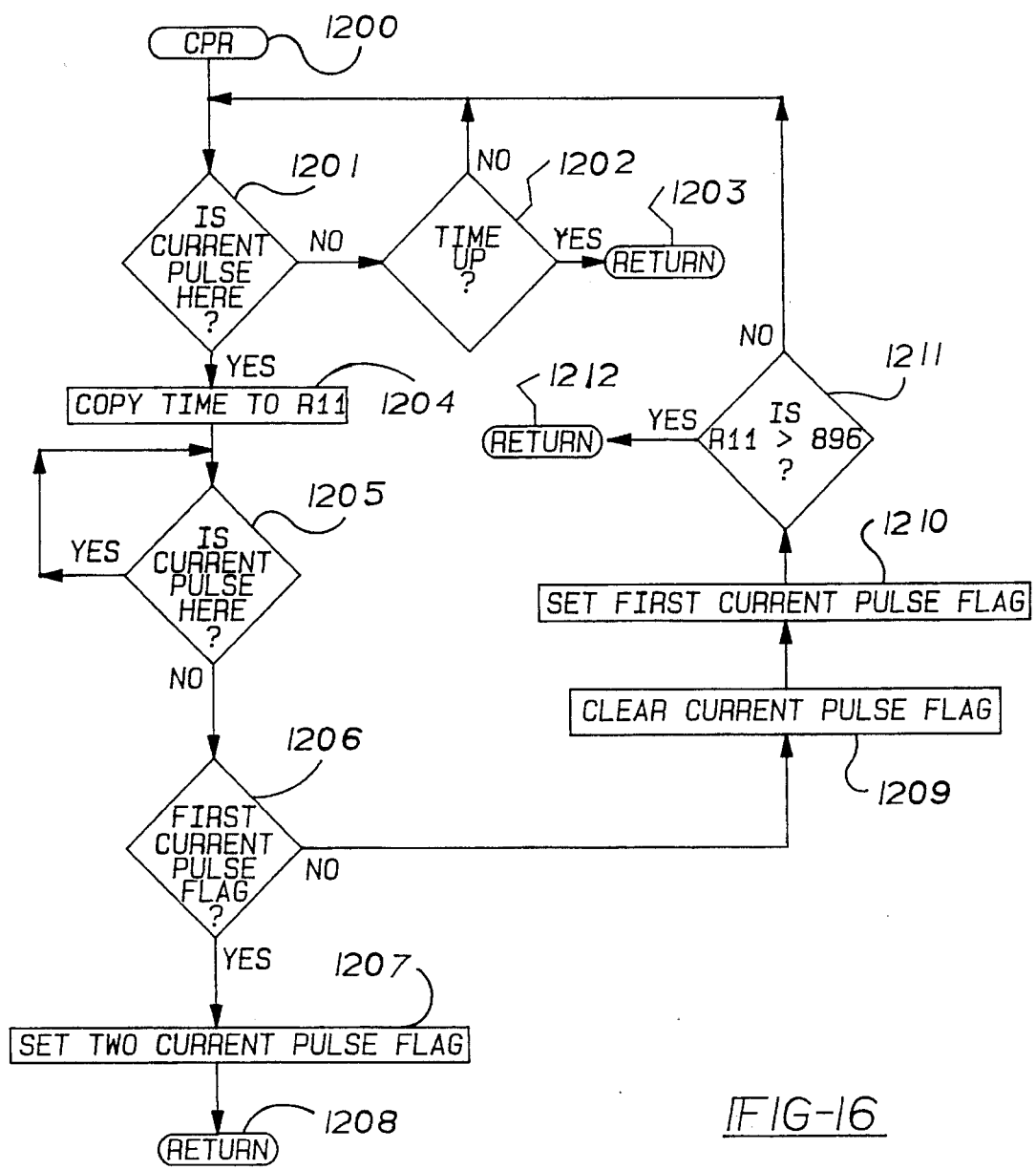
FIG. 16 is a flow chart for the current pulse routine called once per each line half cycle by the phase monitoring routine to sample the lagging motor phase angle, to set flags upon the occurrence of a first or second current pulse, and to mark the elapsed time at the arrival of the motor current pulse.

A flow chart for the current pulse routine CPR 1200 is shown in FIG. 16. The current pulse routine CPR 1200 is called once per each line half cycle by the phase monitoring routine PMR 1125 to set flags upon the occurrence of a first or second current pulse, and, to mark the elapsed time in register R11 at the arrival of the motor current pulse.

More specifically, the current pulse routine CPR 1200 loops between decision steps 1201 and 1202 until either a current pulse arrives, or, a time limit has expired, whichever occurs first. Specifically, decision step 1201 branches to decision step 1202 if the current pulse output line 135 is HIGH. Decision step 1202 branches back to decision step 1201 if the elapsed time in the timer is less than a predefined time limit. The time limit is sufficiently long to allow for a motor 18 current pulse of a maximum allowable phase angle. Otherwise, the program falls through decision step 1202 to return to the phase monitoring routine PMR 1125 at step 1203. When a current pulse does arrive, the program falls through decision step 1201 to step 1204 wherein the elapsed time on the microcomputer 134 timer is copied to register R11 without stopping or affecting the operation of the timer. Decision step 1205 loops back upon itself until the current pulse output 135 goes HIGH whereupon the program falls through to decision step 1206.

Decision step 1206 branches to step 1207 if the first current pulse flag is set. In other words, decision step 1206 branches to step 1207 if the most recent current pulse was the second current pulse of this sampling period. The two current pulse flag is set at step 1207 and the program returns to the phase monitoring routine PMR 1125 at step 1208. Note that the second and last current pulse was a current pulse of motor 18. Otherwise, the program falls through decision step 1206 to step 1209.

The current pulse flag of the input/output register of the microcomputer 134 is cleared at step 1209. The first current pulse flag is set at step 1210. Decision step 1211 branches back to the phase monitoring routine PMR 1125 at step 1212 if the elapsed time is large enough as to indicate that the last current pulse must have been from the motor 18 current and not the heater current. Otherwise, it is still possible that a motor current pulse will be forthcoming and the program falls through decision step 1211 to continue looping through decision steps 1201 and 1202.

Eventually, the current pulse routine returns to the phase monitoring routine PMR 1125. If the motor 18 is ON, the first current pulse flag will be set and the last motor phase number will be in register R11. If both the motor 18 and the heater 34 are ON, the two current pulse flag will be set. An exception to this rule occurs during operation of the FAULT routine 1400 wherein the first current pulse flag indicates the presence of a heater ground fault current passing through the neutral side N along wire 68.

Figure 17:
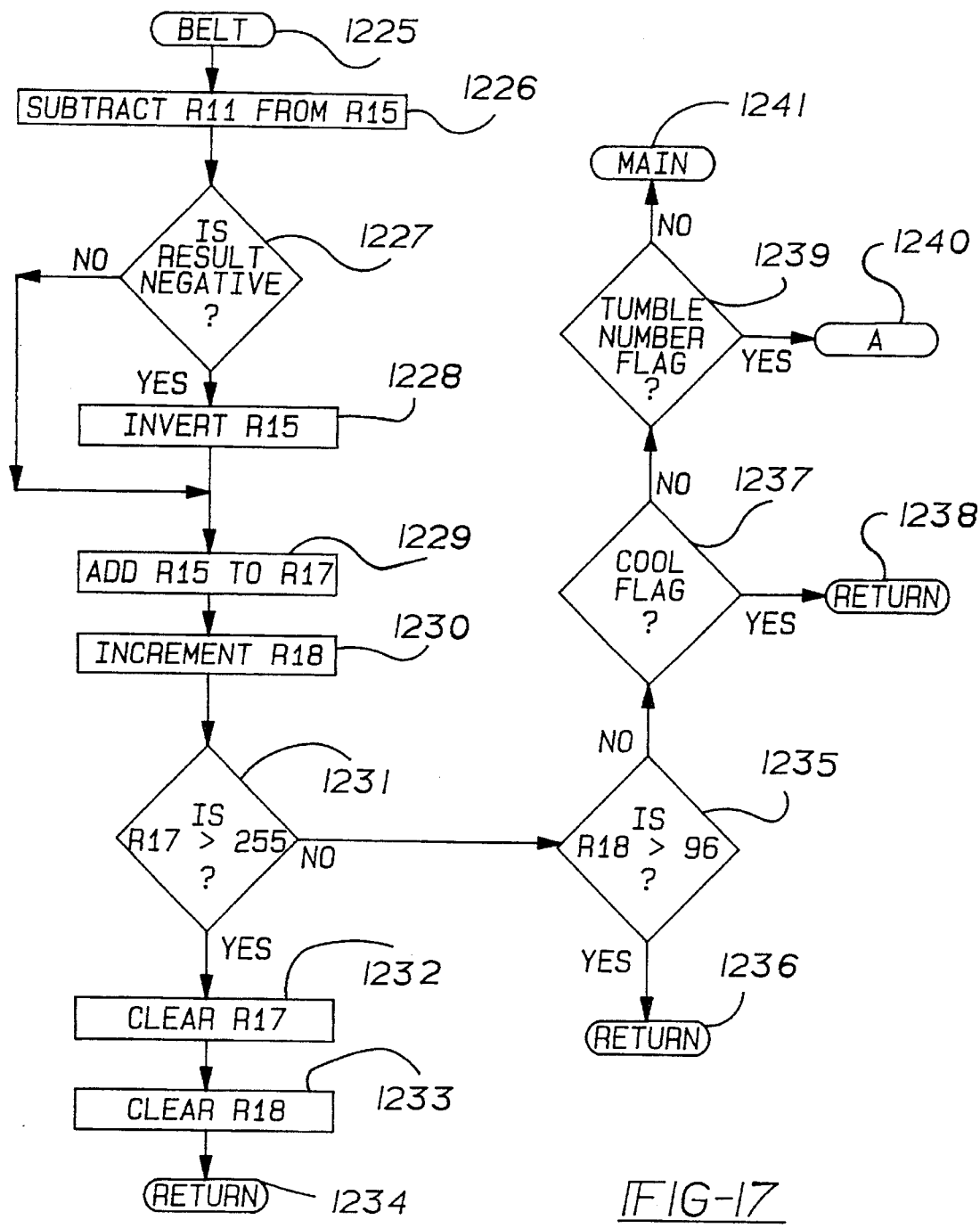
FIG. 17 is a flow chart for the BELT routine called once per each line half cycle by the phase monitoring routine whenever the motor is ON to detect a broken belt condition and initiate appropriate action.

A flow chart for the BELT routine 1225 is shown in FIG. 17. The BELT routine 1225 is called once per each line half cycle by the phase monitoring routine PMR 1125 whenever the motor 18 is ON, that is, whenever the output line 170 of the microcomputer 134 is LOW. The BELT routine 1225 compares the dither between the last and the fifth last motor phase number for a prescribed sample period and declares the dryer belt to be broken if the motor 18 is running too smoothly. The cycle is terminated, advanced to the cooldown period, or, not affected if a broken belt is detected at the start of a cycle, during a cycle, or, during the cooldown period, respectively.

More specifically, the last motor phase number in register R11 is subtracted from the fifth last motor phase number in register R15 at step 1226. It is necessary to compare motor phase numbers from the same positive or negative line voltage half cycle to avoid introducing systematic error due to possible line voltage asymmetry. Also, it is desirable to compare data taken with the motor 18 and blower fan 32 in approximately the same position. Since the exemplary motor 18 has four poles and a synchronous speed of 1800 RPM, there are approximately four line half cycles per motor revolution. Also, as will be described later, the sequence of volt and thermistor pulses repeats every four line half cycles. Decision step 1227 falls through to step 1228 if the subtraction performed at step 1226 resulted in a negative result. The result in register R15 is inverted at step 1228. Otherwise, the program branches directly to step 1229. At step 1229 the absolute value of the difference between the last and the fifth last motor phase number in register R15 is added to a sum of differences in register R17.

The comparison count in register R18 is incremented at step 1230. In other words, the BELT routine 1225 is accumulating a number in register R17 related to the amount of dither in the motor torque over a sample duration accumulating in register R18. Decision step 1231 terminates the present sample and initiates a new sample by falling through to step 1232 if the dither, or sum of differences, in register R17 is sufficiently large as to indicate that the belt has not broken and the motor 18 is experiencing the normal load torque dither that is associated with a rotating drum 16. Otherwise, the program branches to decision step 1235 to determine if the sample period is complete. If the comparison count in register R18 less than ninety-six, the sample time is below the broken belt threshold, and the program returns to the phase monitoring routine PMR 1125 at step 1236.

However, if the sample is completed with the sum of differences in register R17 below a preset threshold, the belt is broken, or detached, and the program falls through to decision step 1237. A variety of actions, or nonactions, are taken in response to a broken belt depending on where in the cycle a broken belt is detected. Decision step 1237 branches to step 1238 to return to the phase monitoring routine PMR 1125 if the cycle is in the cooldown period. In other words, a broken belt is ignored if the belt breaks during the cooldown period because the heater 34 is OFF, the blower fan 32 is still pulling air through the system, and, there is no fire hazard. Otherwise, the program falls through decision step 1237 to decision step 1239. The tumble number flag is set by the EMPTY routine 1625 at the time in each cycle when the heater 34 is usually activated. Decision step 1239 branches from point "A" at step 1240 to point "A" at step 1024 of the MAIN program 1000 if a broken belt is detected at a time in the cycle when the heater box is likely to be hot and a potential fire hazard exists. Thus, the cycle is advanced to the cooldown period if a broken belt occurs during the cycle when residual heat from the heater box could potentially start a fire. Otherwise, the program falls through decision step 1239 to step 1241 wherein the cycle is terminated by branching to the MAIN program 1000 at step 1002. Thus, if the belt is already broken at the start of a cycle, the cycle will be terminated within about one second while the user is still within the vicinity of the dryer. In this case the heater 34 has not been ON and there is no reason to suspect the existence of a fire hazard.

Figure 18:
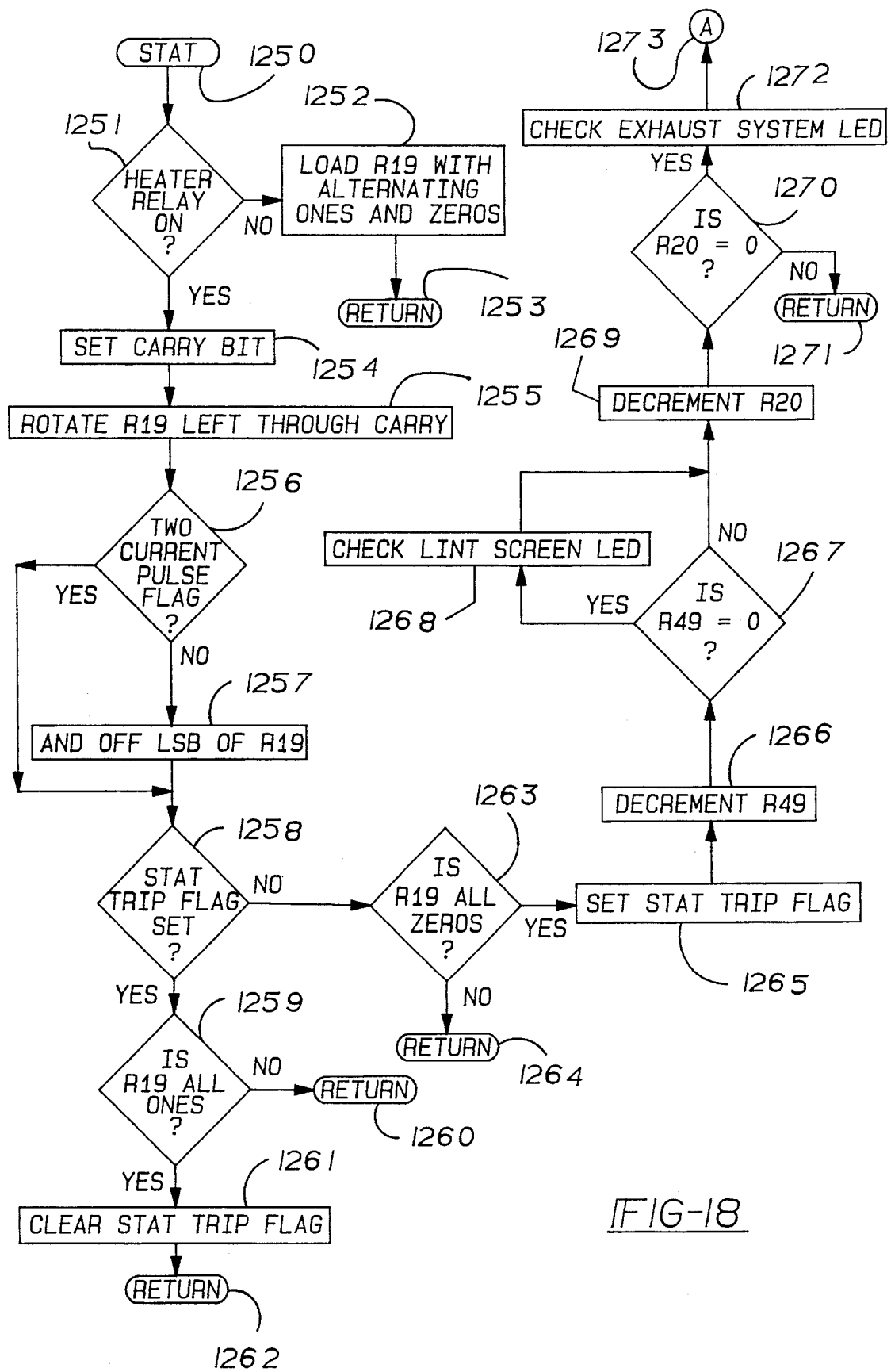
FIG. 18 is a flow chart for the STAT routine called once per each line half cycle by the phase monitoring routine whenever the motor is ON to detect and count each cycling of the heater box safety thermostat.

A flow chart for the STAT routine 1250 is shown in FIG. 18. The STAT routine 1250 is called by the phase monitoring routine PMR 1125 once per each line half cycle whenever the motor 18 is ON, that is, whenever the output line 170 of the microcomputer 134 is LOW. The STAT routine 1250 detects and counts each cycling of the heater box safety thermostat and controls a check lint screen console light emitting diode, and, a check exhaust system console light emitting diode in accordance with trip count thresholds established at the start of each cycle by the VOLT routine 1460.

More specifically, the STAT routine 1250 branches from decision step 1251 to step 1252 if the heater relay 74 is not ON. An 8-bit data memory register R19 is loaded with alternating ONEs and ZEROs at step 1252 and the program returns to the phase monitoring routine PMR 1125 at step 1253. Otherwise, if the heater relay is ON, the program falls through to step 1254. Register R19 is a sample register for safety thermostat 72 which prevents counting a single safety thermostat trip more than once due to switch bounce. The carry bit of the microcomputer 134 is set at step 1254, and, register R19 is rotated to the left through the carry bit at step 1255. This loads the least significant bit of register R19 with a ONE. If register R19 is all ONES, the heater 34 is ON. The "stat trip flag" will be set. If register R19 is all ZEROs, the heater 34 is OFF. The stat trip flag will be cleared. If register R19 is anything other than all ONES or all ZEROs, the status of the heater 34 is uncertain and the status of the "stat trip flag" will not be altered. Specifically, decision step 1256 branches to decision step 1258 if the two current pulse flag is set. In other words, decision step 1256 branches to decision step 1258 if the heater 34 was ON during the present phase monitoring routine PMR 1125 line half cycle sample period. Otherwise, the heater element was OFF and the program falls through to step 1257 wherein the least significant bit of register R19 is cleared.

Decision step 1258 branches to decision step 1263 if the stat trip flag is CLEAR. In other words, decision step 1258 branches to decision step 1263 if the heater box safety thermostat 72 is not OPEN. Otherwise, if the stat trip flag is SET, the program falls through to decision step 1259 to determine whether the safety thermostat 72 has RESET. Decision step 1259 returns to the phase monitoring routine PMR 1125 at step 1260 if register R19 is not all ONES, in other words, if the safety thermostat 72 has not RESET. Otherwise, the safety thermostat 72 has RESET and the program falls through to step 1261. The stat trip flag is cleared at step 1261 and the program returns to the phase monitoring routine PMR at step 1262.

Decision step 1263 determines whether the safety thermostat 72 has tripped, or OPENED. If register R19 is not all ZEROs, the safety thermostat 72 has not tripped, and, the program returns to the phase monitoring routine PMR 1125 at step 1264. Otherwise, if register R19 is all ZEROs, the safety thermostat 72 has tripped and the program falls through to step 1265. The stat trip flag is set at step 1265, and, the lint screen trip threshold is decremented at step 1266. The lint screen trip threshold was established at the start of the cycle by the VOLT routine 1460 in accordance with the heater 34 wattage defined by a 208 or 240 VAC service voltage. Decision step 1267 branches to step 1268 if the lint screen trip threshold in register R49 has decremented to zero. The check lint screen LED output 152 of microcomputer 134 is driven LOW at step 1268 to warn the user to check the lint screen 30.

It should be noted that the number of trips of safety thermostat 72 required to establish this condition depends upon the heater voltage, that is, upon the wattage of the heater 34. More trips are required with a true 240 VAC service than with a 208 VAC service. Otherwise, if the lint screen trip threshold is not zero, the program falls through to step 1269. Similarly, the safety thermostat trip threshold in register R20 is decremented at step 1269, and, decision step 1270 returns to the phase monitoring routine PMR 1125 at step 1271 if the safety thermostat trip threshold has not decremented to zero. Otherwise, if the safety thermostat trip threshold has decremented to zero, the program falls through to step 1272. The safety thermostat trip threshold in register R20 is larger than the lint screen trip threshold in register R49, and, was also established by the VOLT routine 1460 at the start of a cycle in accordance with the heater 34 voltage. A major dryer restricted air flow condition which could potentially be a fire hazard has been established when the safety thermostat 72 has tripped a sufficient number of times as to cause the trip threshold in register R20 to be decremented to zero. The check exhaust system LED output line 154 of microcomputer 134 is driven LOW at step 1272, and, the program branches from point "A" at step 1273 to point "A" at step 1024 of the MAIN program 1000 to advance the cycle to the cooldown period to prevent a fire hazard.

Figure 19:
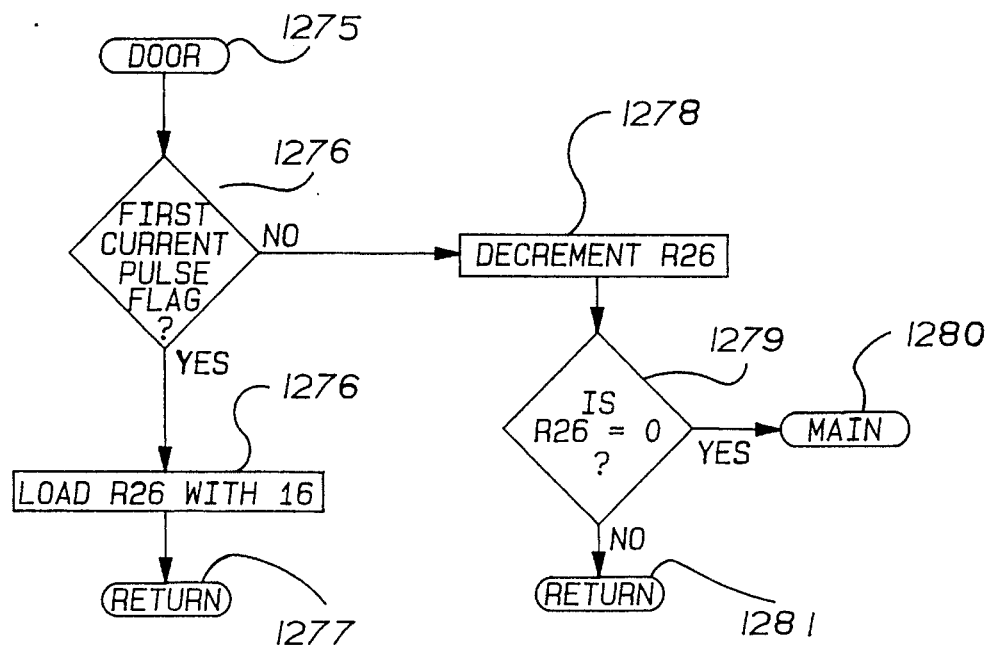
FIG. 19 is a flow chart for the DOOR routine called once per each line half cycle by the phase monitoring routine whenever the motor is ON to abort the present cycle if an open circuit is detected anywhere in the motor circuit.

A flow chart for the DOOR routine 1275 is shown in FIG. 19. The DOOR routine 1275 is called once per each line half cycle by the phase monitoring routine 1125 whenever the motor 18 is ON, that is, whenever the output line 170 of microcomputer 134 is LOW. The DOOR routine 1275 aborts the cycle if an open circuit exists anywhere in the motor 18 circuit, such as, an open dryer door switch 60, thermal fuse 58, motor thermal protector 50, or, motor relay 62. More specifically, decision step 1276 branches to step 1278 if the first current pulse flag is CLEAR. Otherwise, the motor 18 circuit has proper continuity, and, the program falls through to step 1276. The open door count in register R26 is loaded with sixteen at step 1276 and the program returns to the phase monitoring routine PMR 1125 at step 1277. The motor 18 circuit will not be declared to be OPEN until the motor current pulse has failed to appear on sixteen consecutive line half cycles. This allows sufficient time for the motor relay contact 62 to make after the relay coil 178 has been energized. The open door count in register R26 is decremented at step 1278. Decision step 1279 branches from step 1280 to the MAIN program 1000 at step 1002 if to terminate the cycle if the open door count in register R26 has decemented to zero. Otherwise, the program returns to the phase monitoring routine PMR 1125 at step 1281.

Figure 20:
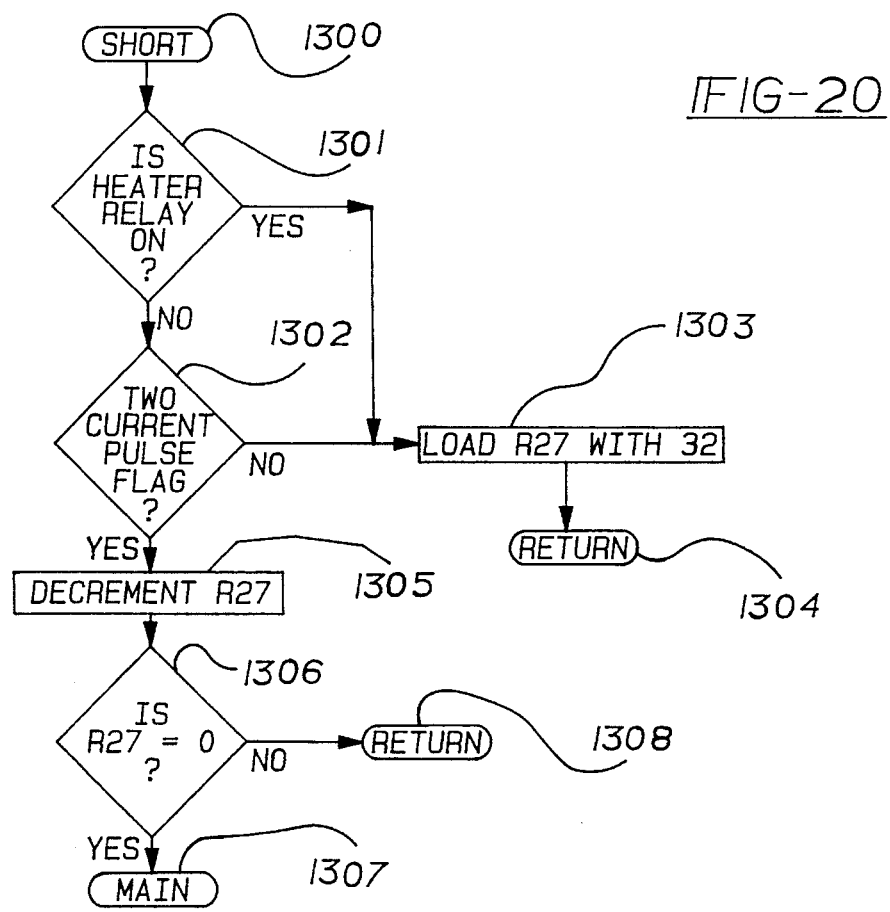
FIG. 20 is a flow chart for the SHORT routine called once per each line half cycle by the phase monitoring routine whenever the motor is ON to abort the present cycle if the heater element is conducting current when the heater relay is supposed to be OPEN.

A flow chart for the SHORT routine 1300 is shown in FIG. 20. The SHORT routine 1300 is called once per each line half cycle by the phase monitoring routine PMR 1125 whenever the motor 18 is ON, that is, whenever the output line 170 of microcomputer 134 is LOW. The SHORT routine 1300 aborts the cycle if the heater 34 is conducting current when the heater relay 74 is supposed to be OPEN. In other words, the SHORT routine 1300 aborts the cycle if the heater relay 74 is shorted. More specifically, decision step 1301 branches to step 1303 if the heater relay 74 is ON via microcomputer 134 output line 182 being LOW. It is not possible to check for a shorted heater relay 74 when the relay is supposed to be CLOSED. Program step 1303 loads the shorted heater relay count register R27 with thirty-two, and, the program returns to the phase monitoring routine PMR 1125 at step 1304. Otherwise, the heater relay 74 is supposed to be OFF, and the program falls through to decision step 1302. Decision step 1302 branches to step 1303 if the heater 34 is not conducting current, that is, if the two current pulse flag is CLEAR. Otherwise, there is a condition wherein the heater current pulse did occur and the heater was supposed to be OFF, and, the program falls through to step 1305. The shorted heater relay count is decremented at step 1305. Decision step 1306 branches to the MAIN program 1000 at step 1307 to terminate the present cycle if the shorted heater relay count has decremented to zero. Otherwise, the program returns to the phase monitoring routine PMR 1125 at step 1308. The shorted heater relay count of thirty-two allows plenty of time for the heater relay 74 to OPEN after the microcomputer output line goes HIGH, say, when the TRIP routine 1575 has determined that the exhaust air temperature is above threshold.

Figure 21:
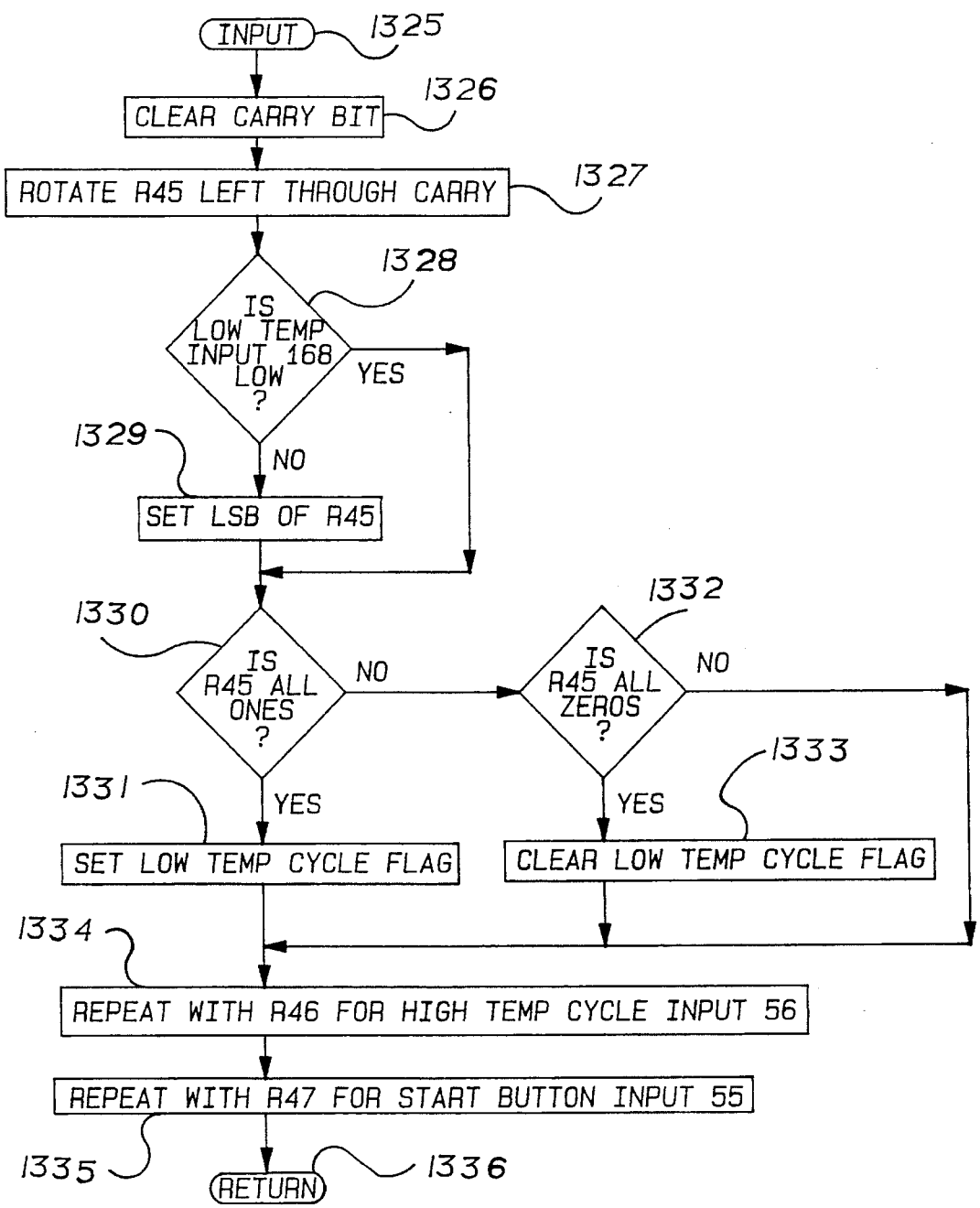
FIG. 21 is a flow chart for the INPUT routine called once per each line half cycle by the phase monitoring routine to provide electrical noise filtering by input switch debounce software.

A flow chart for the INPUT routine 1325 is shown in FIG. 21. The INPUT routine 1325 is called once per each line half cycle by the phase monitoring routine PMR regardless of whether the motor 18 is ON or OFF. The INPUT routine 1325 provides digital electrical noise filtering and input switch contact debounce software for each input switch contact. More specifically, the INPUT routine 1325 clears the microcomputer 134 carry bit at step 1326. The low temperature cycle input 168 sample register R45 is rotated left through the carry bit at step 1327. This loads the least significant bit of register R45 with a ZERO. Decision step 1328 checks the low temperature cycle input line 168 to the microcomputer 134. If the input 168 is LOW the program branches to decision step 1330. Otherwise, the input 168 is HIGH and the program falls through to step 1329 wherein the least significant bit of register R45 is SET. The low temperature flag will be SET if the sample register R45 contains all ZEROs. Or, the low temperature flag will be CLEARED if the sample register R45 contains all ONEs. If the sample register R45 does not contain all ONEs or all ZEROs, the low temperature flag will be unaffected. In other words, the low temperature cycle flag will not be toggled unless consistent input 140 information has been obtained for eight consecutive line half cycles. This implies that a brief electrical noise burst on input line 140 will have no effect on the operation of the program. Specifically, decision step 1330 branches to decision step 1332 if the sample register R45 does not contain all ONEs. Otherwise, if the sample register R45 does contain all ONEs, the program falls through to step 1331 wherein the low temperature cycle flag is SET. Decision step 1332 branches to step 1334 if the sample register R45 does not contain all ZEROs. Otherwise, the sample register R45 does contain all ZEROs and the program falls through to step 1333 wherein the low temperature cycle flag is CLEARED. Similarly, a data memory sample register R46 and R47 is allocated for the high temperature cycle input 166 and the start button input 164, and, a high temperature cycle flag and start button flag are set or cleared whenever registers R46 or R47 contain all ZEROs or ONEs, respectively. After passing through these similar procedures denoted by steps 1334 and 1335, the program returns to the phase monitoring routine at step 1336. Throughout the remaining routines, whenever a decision step calls for an input to be read, it is really the status of the appropriate input flag that is interrogated.

Figure 22:
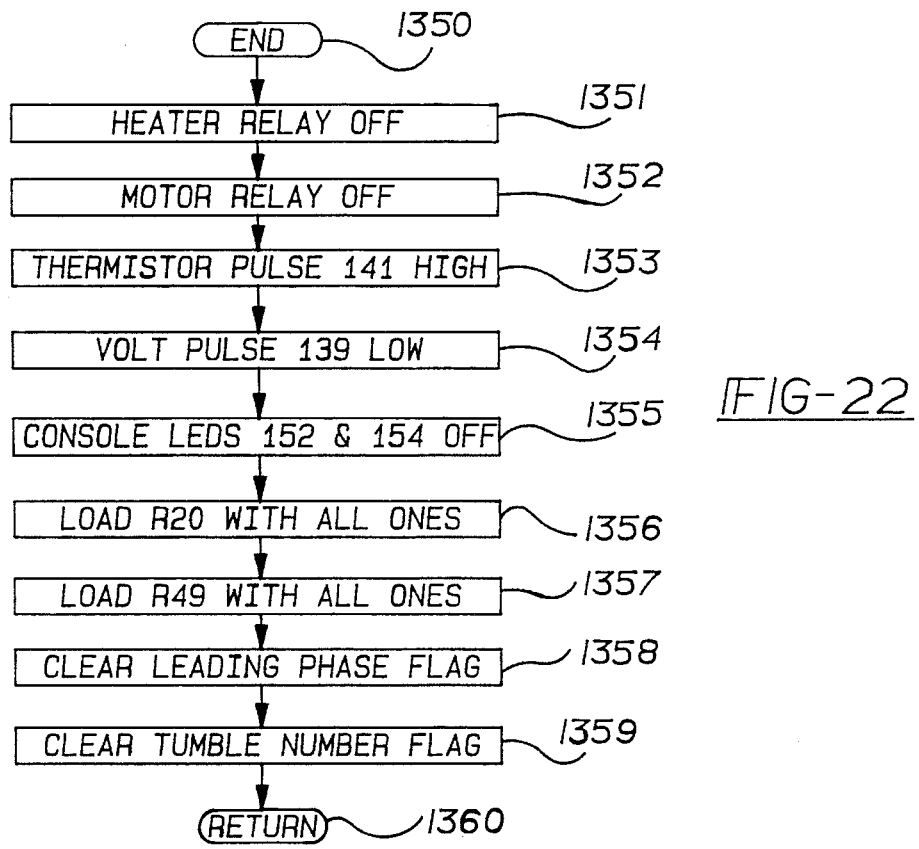
FIG. 22 is a flow chart for the END routine called by the MAIN program to powerdown all outputs from the previous cycle and initialize parameters for the start of the next dryer cycle.

A flow chart for the END routine 1350 is shown in FIG. 22. The END routine 1350 is called by the MAIN program 1000 to powerdown all outputs from the previous cycle and initialize parameters for the start of the next dryer cycle. More specifically, the END routine 1350 turns the heater relay 74 OFF by driving microcomputer output line 182 HIGH at step 1351. Similarly, the motor relay 62 is cycled OFF by driving microcomputer output line 170 HIGH at step 1352. The microcomputer thermistor pulse output line 139 is driven HIGH at step 1353, and, the volt pulse output line 141 is driven LOW at step 1354. Steps 1353 and 1354 disable the temperature sensing mode and activate the normal motor phase monitoring mode of the volt pulse circuit 138. Console light emitting diode output lines 152 and 154 are driven HIGH at step 1355 to extinguish the LEDs from the previous cycle. The safety thermostat trip threshold in register R20 is temporarily loaded with a high number at step 1356, and, the lint screen trip threshold in register R49 is temporarily loaded with a high number at step 1357. Both thresholds R20 and R49 will be defined early in the next cycle by the VOLT routine 1460. The leading phase flag is CLEARED at step 1358, and, the tumble number flag is cleared at step 1359 in preparation for the start of the next cycle. The END routine 1350 returns to the MAIN program 1000 at step 1360.

Figure 23:
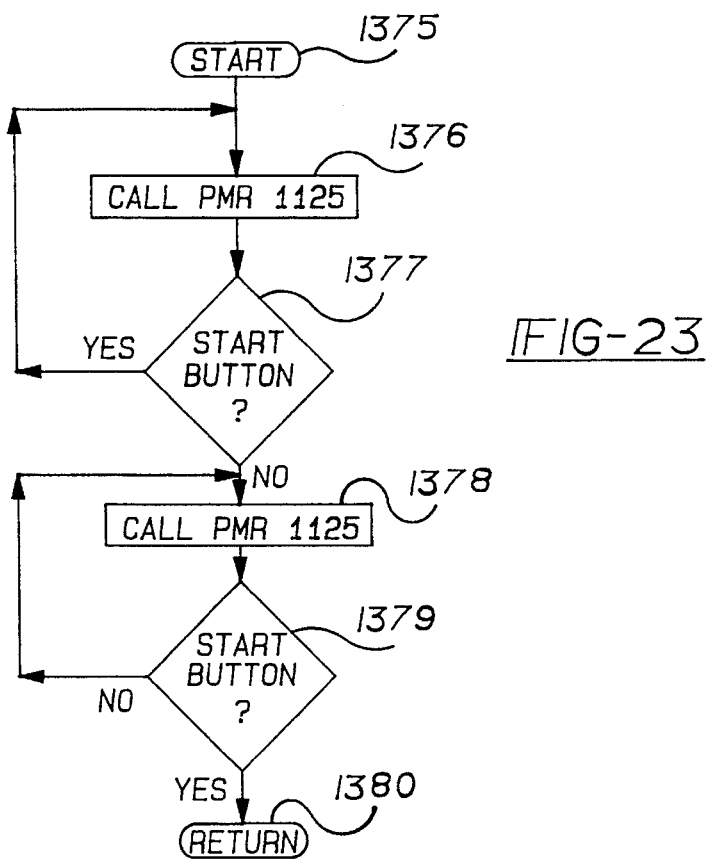
FIG. 23 is a flow chart for the START routine called by the MAIN program to pause, if necessary, until the user has released the start button from the previous cycle, and to pause until the user has pressed the start button to initiate the next clothes drying cycle.

A flow chart for the START routine 1375 is shown in FIG. 23. The START routine 1375 is called by the MAIN program 1000 to pause, if necessary, until the user has released the start button from the previous cycle, and, pause until the user has pressed the start button to initiate the next clothes drying cycle. Numerous diagnostic conditions are monitored at the start of each new cycle, and, it is possible that a cycle may be aborted before the user has had time to release the start button.

More specifically, the phase monitoring routine PMR 1125 is called at step 1376 to provide a one half cycle delay with the motor 18 and the heater 34 OFF, and, to interrogate the input lines 156 to the microcomputer 134 via the INPUT routine 1325. Decision step 1377 loops back to step 1376 if the start button flag indicates that the user has not released the momentary start button from the previous cycle. Otherwise, as is normally the case, the user has released the start button from the previous cycle, and, the program falls through to step 1378. The phase monitoring routine 1125 is called at step 1376 to provide a one half cycle delay with the motor 18 and the heater 34 OFF, and, to interrogate the input lines 156 to the microcomputer 134 via the INPUT routine 1325. Decision step 1379 loops back to step 1378 if the start button flag indicates that the user is not pressing the start button. Otherwise, the user has pressed the start button, and, the program falls through to step 1380 to return to the MAIN program 1000.

Figure 24:
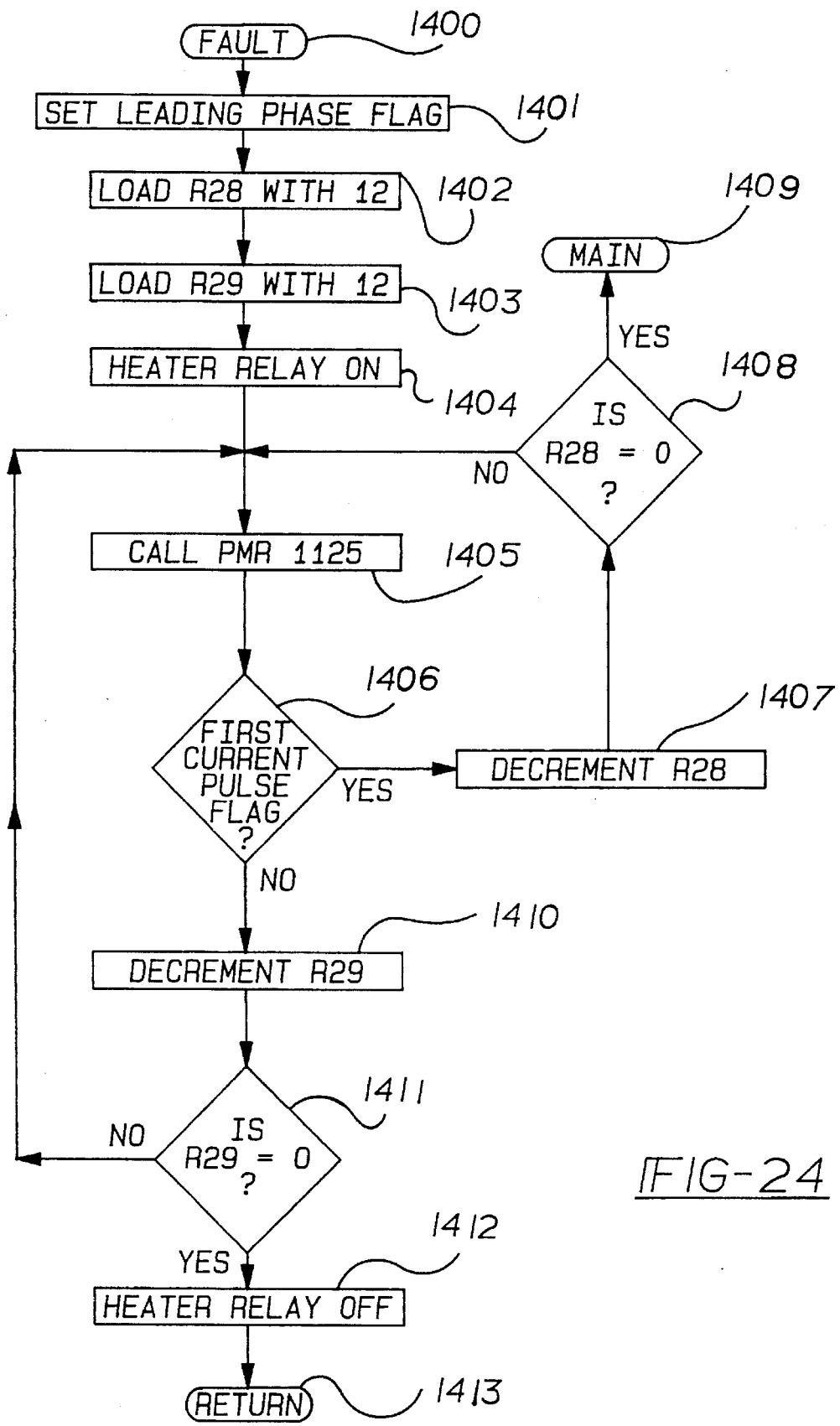
FIG. 24 is a flow chart for the FAULT routine called by the MAIN program immediately after a new cycle has been started to toggle the heater relay and abort the cycle if any ground fault current is detected at the neutral service wire.

A flow chart for the FAULT routine 1400 is shown in FIG. 24. The FAULT routine 1400 is called by the MAIN program 1000, immediately after a new cycle has been started, to toggle the heater relay 74 and abort the cycle if any ground fault current flows to the neutral side N through wire 68 and, hence, ferrite core 102. Such a ground fault current might occur if the heater 34 brakes or sags as to make contact with the heater box.

More specifically, the FAULT routine 1400 sets the leading phase flag at step 1401. The leading phase flag causes the phase monitoring routine PMR 1125 to look for a possible heater current pulse with a leading phase angle as may be the case when the dryer is used with a 208 VAC service. A fault count register R28 is loaded with twelve at step 1402. A no-fault count register R29 is loaded with twelve at step 1403. The heater relay 74 is toggled ON at step 1404 by driving microcomputer output line 182 LOW. The phase monitoring routine PMR 1125 is called with the leading phase flag set at step 1405. At this time there should be no current flowing through either the motor 18 or the heater 34 circuits because the motor relay 62 is OPEN and the centrifugal switch contact 70 is OPEN. Hence, there should be no current pulse or pulses 63 from either ferrite core sensor 102 or 104. If there is a current pulse, it will likely be due to heater ground fault current flowing from a broken or sagging heater 34 through the ground return wire 19 and the motor primary winding 68 of ferrite core 102 to neutral N. Decision step 1406 branches to step 1407 if the phase monitoring routine PMR 1125 returns with the first current pulse flag SET. The fault count register R28 is decremented at step 1407, and, decision step 1408 branches at step 1409 to the MAIN program 1000 at step 1002 if the fault count register has been decremented to zero. Otherwise, the fault count register has not been decremented to zero, and, the program loops back to step 1405 for another sample. If the phase monitoring routine PMR 1125 returns with the first current pulse flag CLEAR the program falls through to step 1410 wherein the no-fault count register R29 is decremented. Decision step 1411 loops back to step 1405 if the no-fault count register R29 has not decremented to zero. Otherwise, the no-fault count register R29 has decremented to zero before the fault count register R28 has decremented to zero, and, the program falls through to step 1412 wherein the heater relay is toggled OFF by driving microcomputer output line 182 HIGH. The FAULT routine 1400 returns to the MAIN program 1000 in a normal manner having detected no ground fault condition at step 1413. The FAULT routine will also abort the cycle if the centrifugal switch contact 70 is shorted.

Figure 25:
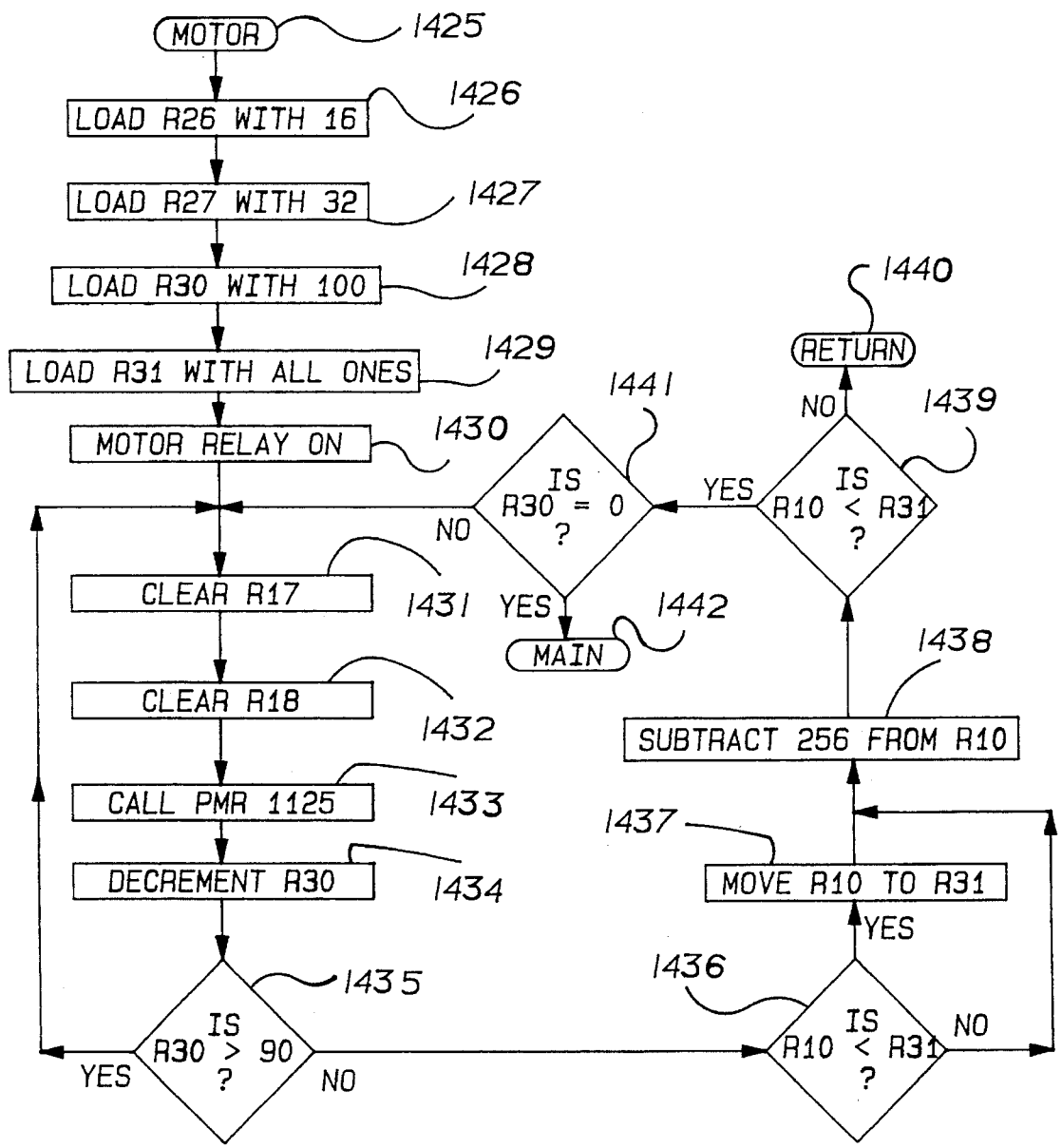
FIG. 25 is a flow chart for the MOTOR routine called by the MAIN program at the start of each cycle immediately after determining the absence of a heater ground fault condition to abort the cycle if the motor phase information indicates that the motor has failed to start within a prescribed time limit.

A flow chart for the MOTOR routine 1425 is shown in FIG. 25. The MOTOR routine 1425 is called by the MAIN program 1000 at the start of each cycle, immediately after determining the absence of a heater ground fault condition, to abort the cycle if the motor phase information indicates that the motor 18 has failed to start within a prescribed time limit.

More specifically, the MOTOR routine 1425 loads the open door count in register R26 with sixteen at step 1426. The shorted heater relay count in register R27 is loaded with thirty-two at step 1427. Steps 1426 and 1427 assure proper operation of the DOOR routine 1275 and the SHORT routine 1300 at the start of the cycle by initializing parameters. A motor 18 start time limit of one hundred line half cycles is loaded in register R30 at step 1428. The minimum sum of two motor phase number register R31 is initialized with a high number by loaded register R31 with all ones at step 1429. The motor relay 62 is turned ON at step 1430 by driving microcomputer output line 170 LOW. The BELT routine 1225 parameters are initialized at steps 1431 and 1432 to assure proper operation of the BELT routine 1225 at the start of the cycle. Specifically, the last/fifth last absolute sum of differences register R17 is cleared at step 1431 and, the comparison count register R18 is cleared at step 1432. Steps 1431 and 1432 briefly inhibit the detection of a broken belt during the start procedure of the motor 18. The phase monitoring routine PMR 1125 is called at step 1433. After allowing sufficient time for the motor relay contact 62 to make, and, for the phase monitoring routine PMR 1125 to accumulate good motor phase data for the last two line half cycles, the phase monitoring routine PMR 1125 will return with the sum of the last two motor phase numbers in register R10. Specifically, the motor start time limit in register R30 is decremented at step 1434. Decision step 1435 branches back to step 1431 for the first nine passes to allow time for the motor relay contact 62 to make, and, for the phase monitoring routine PMR 1125 to accumulate good motor phase data for at least two line half cycles. Otherwise, when the motor start time limit has decreased below ninety-one, the program falls through to decision step 1436 to test for a new minimum sum of the last two motor phase numbers.

Specifically, decision step 1436 branches to step 1438 if the sum of the last two motor phase numbers in register R10 is not below the minimum sum of two motor phase numbers in register R31. Otherwise, a new minimum sum has been found and the program falls through to step 1437. The sum of the last two motor phase numbers in register R10 is moved to the minimum sum of the last two motor phase number register R31 at step 1437. Note that the program will always fall through to step 1437 on the first pass through decision step 1436 because register R31 was preloaded with a very high number at step 1429. The motor phase angle always increases abruptly when the RPM increases sufficiently as to cause the centrifugal switch contact 56 to OPEN. A motor start phase threshold is defined at step 1438 by subtracting a fixed bias number from the sum of the last two motor phase numbers in register R10.

Decision step 1439 determines whether or not the motor 18 has started by comparing the motor start threshold in register R10 to the minimum sum of two motor phase numbers in register R31. If the threshold in register R10 is not less than the minimum in register R31, an abrupt increase in motor phase numbers has occurred, and, the inference can be made that the centrifugal switch contact 50 has opened and the motor 18 has started. Decision step 1439 branches to return at step 1440 to the MAIN program 1000 if the start threshold in register R10 is not less than the minimum sum of two motor phase numbers in register R31. Otherwise, the program falls through to decision step 1441 wherein the cycle is aborted at step 1442 if the motor start time limit in register R30 has been decremented to zero. If the motor start time limit in Register R30 has not been decremented to zero, the start time limit has not expired, and, the program loops back to step 1431 for the next motor phase sample. Under normal conditions, the MOTOR routine 1425 returns to the MAIN program 1000 with the motor 18 started and the minimum sum of two motor phase numbers available for use by the DRUM routine 1450 in register R31.

Figure 26:
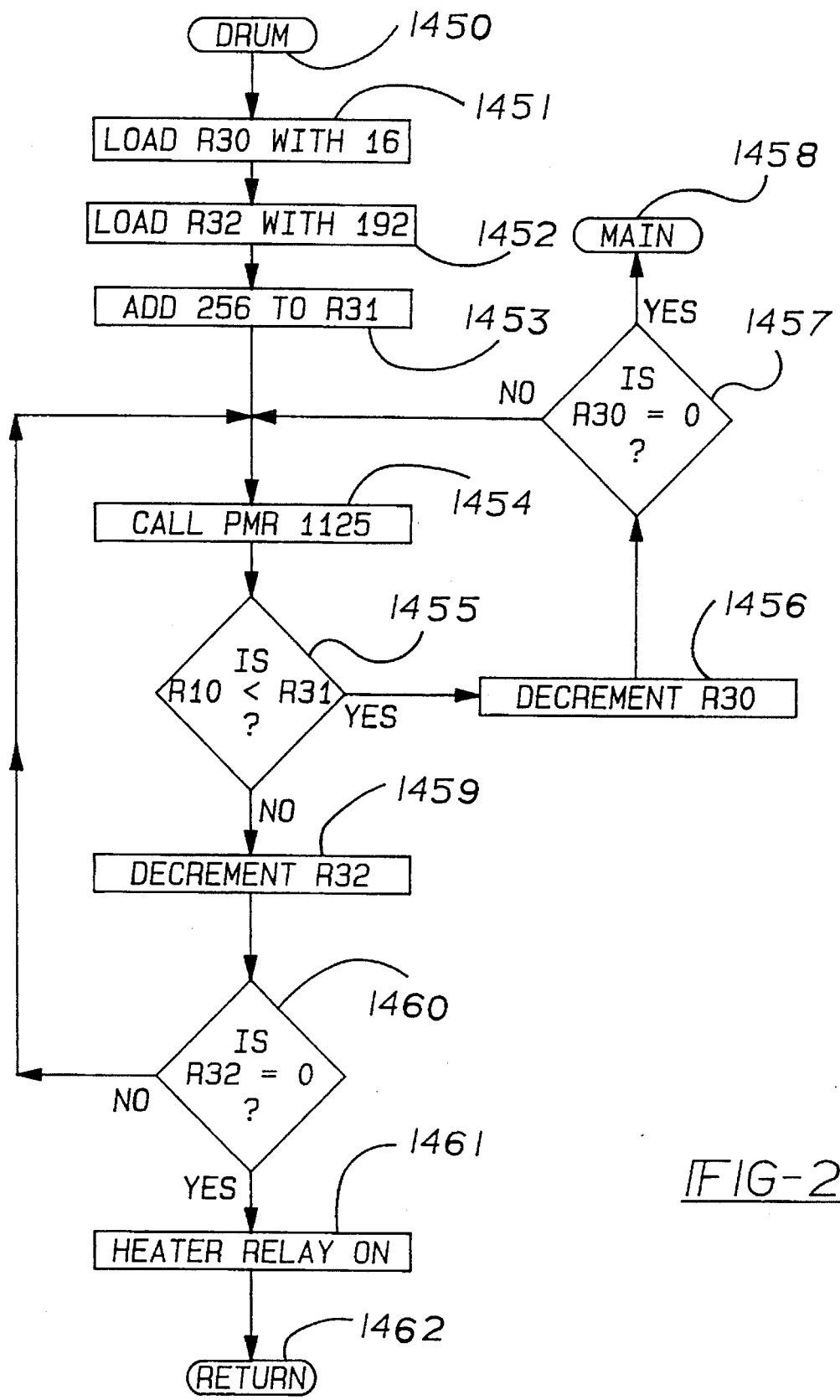
FIG. 26 is a flow chart for the DRUM routine called by the MAIN program at the start of each cycle immediately after the motor has started to abort the cycle if the motor phase information indicates that the motor centrifugal switch is cycling excessively during the clothes drum acceleration period.

A flow chart for the DRUM routine 1450 is shown in FIG. 26. The DRUM routine 1450 is called by the MAIN program 1000 at the start of each cycle, immediately after the motor has started, to abort the cycle if the motor phase information indicates that the motor centrifugal switch 56 is cycling excessively during the clothes drum acceleration period.

More specifically, the drum routine loads the motor start time limit register R30 with sixteen at step 1451. The cycle will be aborted if the motor centrifugal switch cycles for sixteen half cycles during the drum acceleration period. The drum test time register R32 is loaded with 192 at step 1452. The drum test threshold is computed at step 1453 as an offset from the minimum sum of two motor phase numbers in register R31 monitored by the MOTOR routine 1425. The phase monitoring routine PMR 1125 is called at step 1454. The phase monitoring routine PMR 1125 returns to the DRUM routine 1450 with the sum of the last two motor phase numbers in register R10. This sum includes one sample from a positive line voltage half cycle and one sample from a negative line voltage half cycle, thereby eliminating a systematic bias which may otherwise have occurred due to the effects of asymmetry in the line voltage on the natural motor phase angle. Decision step 1455 asks the question, is the sum of the last two motor phase numbers in register R10 below the drum test threshold in register R31. If so, the motor 18 has slowed sufficiently as to cause centrifugal switch contact 50 to CLOSE, and decision step 1455 branches to step 1456. The motor start time limit in register R30 is decremented at step 1456. Decision step 1457 branches at step 1458 to the MAIN program 1000 at step 1101 if the motor start time limit in register R30 has been decremented to zero. Otherwise, the program loops back to step 1454 for the next motor phase sample. Now, if the sum of the last two motor phase numbers in register R10 is not below the drum test threshold in register R31, the program falls through decision step 1455 to step 1459 wherein the drum test time in register R32 is decremented. Decision step 1460 loops back to step 1454 for the next motor phase sample unless the drum test time has decremented to zero whereupon the program falls through to step 1461. The heater relay 74 is turned ON at step 1461 by driving microcomputer output line 182 LOW. In other words, the heater 34 is not turned ON until after both the motor 18 and the drum 16 with the clothes load have come up to speed. The DRUM routine 1450 returns to the MAIN program 1000 at step 1462 with the drum up to speed and the heater relay contact 74 about to close.

Figure 27:
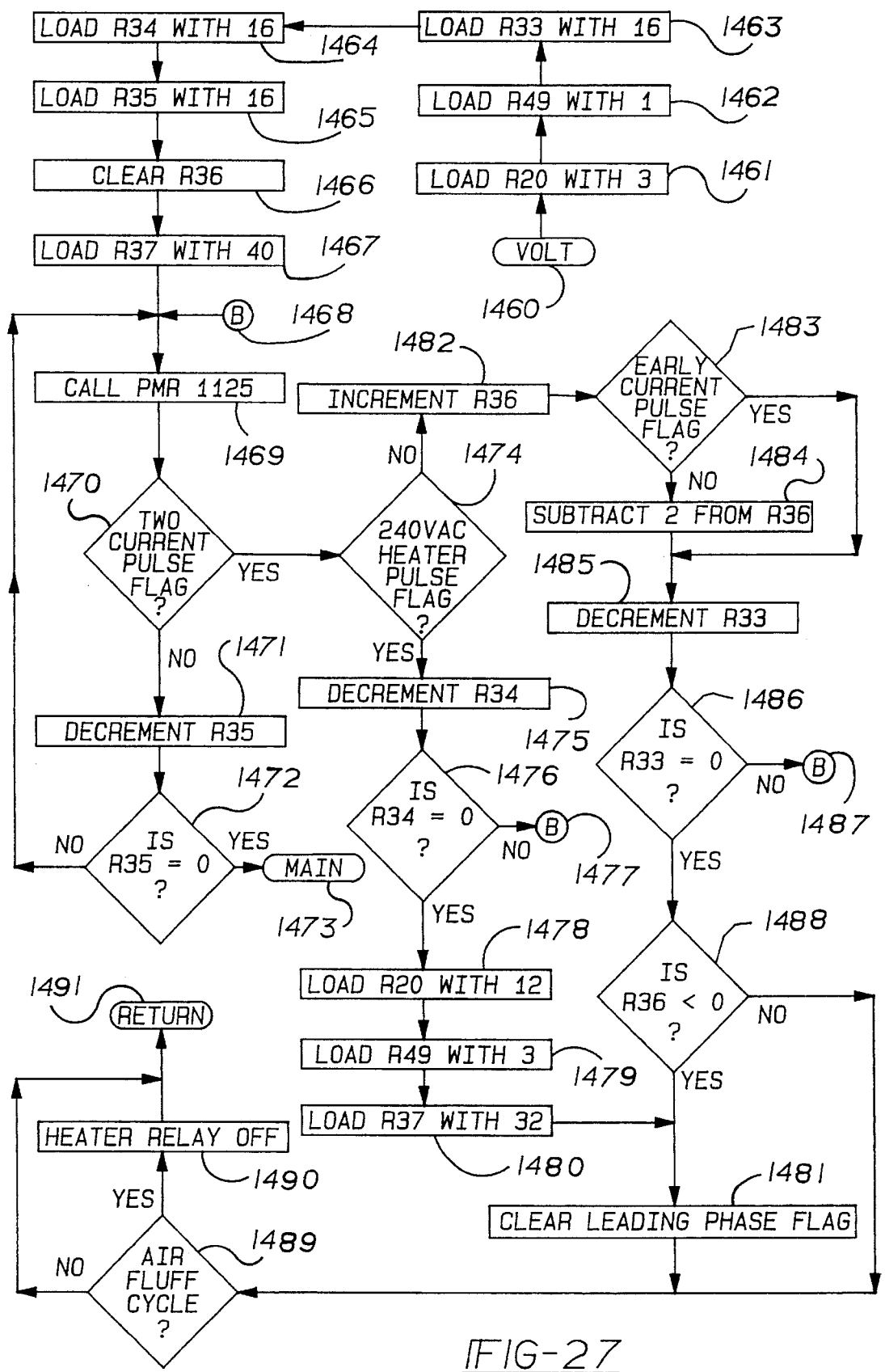
FIG. 27 is a flow chart for the VOLT routine called by the MAIN program at the start of each cycle, immediately after verifying that the drum is up-to-speed, to abort the cycle if the heater circuit is OPEN, to identify the service voltage, and to determine whether the heater current leads or lags the motor voltage when the service voltage is 208 VAC.

A flow chart for the VOLT routine 1460 is shown in FIG. 27. The VOLT routine 1460 is called by the MAIN program 1000 at the start of each cycle, immediately after verifying that the drum is up-to-speed, to abort the cycle if the heater circuit is OPEN, to identify the service voltage as 240 or 208 VAC, and, to determine whether the heater current Ih leads or lags the motor voltage Vm when the service voltage is 208 VAC.

More specifically, the VOLT routine 1460 anticipates, for the moment, that the service voltage will be 208 VAC, and, loads the safety thermostat trip threshold in register R20 with three. The lint screen trip threshold in register R49 is loaded with one at step 1462, also with the momentary assumption that the service voltage will be 208 VAC. A 208 VAC count register R33 is loaded with sixteen at step 1463. A 240 VAC count register R34 is loaded with sixteen at step 1464. An open heater relay 74 count register R35 is loaded with sixteen at step 1465. A leading phase count register R36 is cleared at step 1466. And, the tumble sample time register R37 is loaded with forty at step 1467, with the momentary assumption that the service voltage will be 208 VAC. The phase monitoring routine PMR 1125 is called at step 1469 with the leading phase sequence flag set previously by the FAULT routine 1400. The phase monitoring routine PMR 1125 returns with the two current pulse flag SET if both a motor 18 and a heater 34 current pulse was detected, the 240 VAC heater pulse flag SET if a current pulse occurred during the volt pulse 140; i.e., if the service voltage is a true 240 VAC source, and, the early current pulse flag is SET if a heater current pulse occurred before the arrival of the volt pulse 140. Decision step 1470 branches to decision step 1474 if the two current pulse flag is set. Otherwise, a heater current pulse did not occur, continuity was not established by the heater relay 74 in the heater circuit, and, the program falls through to step 1471. The open heater relay count register R35 is decremented at step 1471. Decision step 1472 terminates the cycle at step 1473 by branching to the MAIN program 1000 at step 1002 if the open heater relay count register R35 has been decremented to zero. Otherwise, the program loops back to step 1469 for the next sample. It is not uncommon for the program to loop through decision step 1472 a few times before continuity is established by heater relay contact 74.

The heater relay was activated at the end of the DRUM routine 1450. Decision step 1474 branches to step 1475 if the 240 VAC heater pulse flag is SET. The 240 VAC count register R34 is decremented at step 1475. Decision step 1476 branches from point "B" at step 1477 to point "B" at step 1468 if the 240 VAC count register R34 has not been decremented to zero. Otherwise, the 240 VAC count register R34 has been decremented to zero, the service voltage has been positively identified as a true 240 VAC source, and, the program falls through to steps 1478, 1479 and 1480 wherein the parameters defined previously under the assumption that the service voltage would be 208 VAC are redefined. Specifically, the safety thermostat trip threshold in register R20 is loaded with twelve at step 1478. The lint screen trip threshold in register R49 is loaded with three at step 1479. The tumble sample time register R37 is loaded with thirty-two at step 1480. Since the service voltage has been positively established to be a true 240 VAC source, it is no longer necessary for the phase monitoring routine PMR 1125 to check for a heater current pulse 135 before the arrival of a volt pulse 140. Hence, the leading phase flag is cleared at step 481.

Before returning to the MAIN program 1000, steps 1489 and 1490 cycle the heater relay 74 OFF if the user has selected the air fluff cycle. Specifically, decision step 1489 branches to step 1491 if the user has not selected the air fluff cycle. Otherwise, the user has selected the air fluff cycle and the program falls through to step 1490 wherein the heater relay 74 is cycled OFF by driving microcomputer output line 182 HIGH. The air fluff cycle is inferred if the high temperature cycle 165 and low temperature cycle 168 inputs are both HIGH. The program returns to the MAIN program 1000 at step 1491.

Hence, the heater relay 74 is toggled ON throughout the VOLT routine 1460 test procedure even in the air fluff cycle wherein the heater 34 will not be used. The reason for this is to identify the voltage source in the event that the user changes the cycle selection at a later time in the cycle. Now, decision step 1474 branches to step 1482 if the phase monitoring routine PMR 1125 returns with the 240 VAC heater pulse flag not set. Steps 1482, 1483 and 1484 use the leading phase sequence count register R36, which was cleared at step 1466, to monitor whether the heater current pulse 135 leads or lags the motor voltage Vm for a 208 VAC service. By the time that the 208 VAC count register R33 decrements to zero, the leading phase sequence register R36 will be positive or negative depending on whether the heater 34 current leads or lags the motor 18 voltage Vm, respectively. At step 1482, the temporary assumption is made that the heater current leads the motor voltage Vm, and, the leading phase sequence count register R36 is incremented. Decision step 1483 branches to step 1485 if the phase monitoring routine PMR 1125 returned with the early current pulse flag set. Otherwise, the heater current lags the motor voltage Vm, and, the program falls through to step 1484 wherein the leading phase sequence count register R36 is decremented by two. The 208 VAC count register R33 is decremented at step 1486. Decision step 1486 branches from point "B" at step 1487 to point "B" at step 1468 if the 208 VAC count register R33 has not been decremented to zero. Otherwise, the program falls through to decision step 1488. Steps 1488 and 1481 clear the leading phase flag if the heater In current lags the motor voltage Vm. Specifically, decision step 1488 branches to step 1489 if the leading phase sequence count register R36 is positive or zero. Otherwise, the heater current lags the motor 18 voltage Vm, and, the leading phase sequence flag is cleared at step 1481. The program completes the VOLT routine 1460 program at decision step 1489 as before. The VOLT routine 1460 returns to the MAIN program 1000 with the leading phase sequence flag SET only if the voltage source is 208 VAC, and, the heater 34 current leads the motor 18 voltage Vm. The safety thermostat trip threshold in register R20, the lint screen trip threshold in register R49, and, the tumble sample time in register R37 are all adjusted for the effect of service voltage on the heater wattage.

A flow chart for the STACK routine 1500 is shown in FIG. 28. The STACK routine 1500 is called by the tumble number routine TNR 1600, four times per drum revolution, to adjust the data memory stack of the last five drum sector sums and clear the last drum sector sum in preparation for the next sample. A drum sector sum is the sum of all the motor phase numbers during the time required for an average dryer drum 16 to traverse one quarter of a drum revolution. The drum sector sums are inversely related to the average motor 18 torque during the sample period.

More specifically, the STACK routine 1500 moves the old fourth last drum sector sum in register R24 to the new fifth last drum sector sum in register R25 at step 1501. The old third last drum sector sum in register R23 becomes the new fourth last drum sector sum in register R24 at step 1502. The old second last drum sector sum in register R22 becomes the new third last drum sector sum in register R23 at step 1503. The old last drum sector sum in register R21 becomes the new second last drum sector sum in register R22. Register R21 is cleared at step 1505 in preparation for the accumulation of a new last sector sum in register R21. The STACK routine 1500 returns to the tumble number routine TNR 1600 at step 1506. Four times per each drum revolution, the tumble number routine TNR 1600 accumulates a clothes tumble number in register R40 by adding the absolute value of the difference between the last and the fifth last drum sector sum to the clothes tumble number. Such absolute differences represent variation in the way that the clothes load is tumbling from one drum revolution to the next revolution while canceling repetitive variation due to uneven drum friction.

A flow chart for the TEMP routine 1525 is shown in FIG. 29. The TEMP routine 1525 is called by the tumble number TNR 1600 once per each line half cycle to accumulate the sum of each volt or thermistor pulse 140 number for one complete drum revolution, and, to toggle the dedicated microcomputer volt pulse 139 and thermistor pulse 141 output lines in a predetermined and repetitive sequence to facilitate comparison of an unknown NTC thermistor resistor RS6 to a known circuit resistor RS4.

More specifically, the TEMP routine 1525 uses decision step 1526 to branch to step 1528 if the thermistor pulse output line 141 was LOW on the last calling of the phase monitoring routine PMR 1125. The width of the last thermistor pulse in register R16 is added to the thermistor pulse sum in register R43. Otherwise, the volt pulse output line 139 was LOW throughout the last calling of the phase monitoring routine PMR 1125, and, the program falls through to step 1527 wherein the width of the last volt pulse in register R16 is added to the volt pulse sum in register R44. The volt/thermistor pulse sequence register R39 is rotated one bit position in the right direction at step 1529. The carry bit is SET if the bit rotated out of the least significant bit position is a ONE, otherwise the carry bit is CLEAR. Register R39 is initialized by the EMPTY routine 1625. Register R39 is used to define a preset, repetitive sequence for the sampling volt pulses with output lines 139 or 141 LOW.

The sequence repeats with every four passes through the TEMP routine 1525, and, involves monitoring two consecutive volt pulses and two consecutive thermistor pulses to avoid introducing a systematic bias in the data due to possible asymmetry in positive and negative line voltage half cycles. Decision step 1530 branches to step 1533 if the microcomputer carry bit is SET. Otherwise, the program falls through to step 1531 wherein the volt pulse output line 141 is toggled. Toggling an output line means that the output is driven HIGH if it was LOW, or, the output is driven LOW if it was HIGH. Similarly, the thermistor pulse output line 139 is toggled at step 1532. The volt pulse and thermistor pulse output lines 141 and 139 are never LOW or HIGH together, rather, they alternate. The program returns to the tumble number routine TNR 1600 at step 1533 with the appropriate volt pulse or thermistor pulse 139 or 141 output line LOW, in preparation for the next volt pulse and motor phase sample by the phase monitoring routine PMR 1125.

Figure 30:
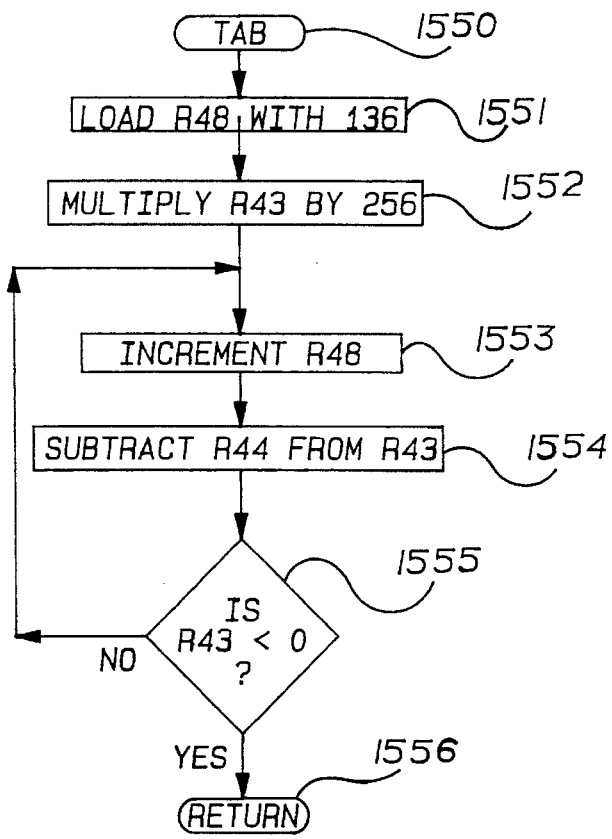
FIG. 30 is a flow chart for the tabulation routine called by the tumble number routine once per each drum revolution to compute the exhaust air temperature from the thermistor pulse sum and the volt pulse sum accumulated by the TEMP routine throughput the most recent drum revolution.

A flow chart for the tabulation routine TAB 1550 is shown in FIG. 30. The tabulation routine TAB 1550 is called by the tumble number routine TNR 1600 once per each drum revolution to compute the exhaust air temperature from the thermistor pulse sum in register R43 and the volt pulse sum in register R44 accumulated by the TEMP routine 1525 throughout the most recent drum revolution. The preferred tabulation routine TAB 1550 in FIG. 30 uses an iterative, divide-by-successive-subtraction routine which minimizes programming step and is easy to understand. However, the preferred tabulation routine 1550 requires considerable time to execute, and, some microcomputers 134 will not be able to complete the required number of iterations before the arrival of heater current, or, volt pulse 140 information for the next half cycle. Those who are skilled in the art will know how to employ a more time efficient, albeit more code consuming, tabulation routine TAB 1550, involving shift registers, which will allow a slower microcomputer 134 to complete the required computation before the arrival of any information for the next line half cycle.

More specifically, the tabulation routine TAB 1550, loads the exhaust air temperature register R48 with 136. Register R48 is an 8-bit register which will roll over from a count of 255 to zero one time before the completion of the the tabulation routine TAB 1550. The purpose of preloading register R48 with 136 is to cause the computed exhaust air temperature in register R48 to be approximately equal to the actual exhaust air temperature in degrees Fahrenheit when the preferred Texas Instruments TMS7040 microcomputer 134 is used with a 5 megahertz ceramic resonator. Register R43, the thermistor pulse sum, is multiplied by 256 at step 1552. Multiplication by any exact multiple of two is easily accomplished by most 8-bit microcomputers 134. Program steps 1553, 1554 and 1555 define a program loop wherein the exhaust air temperature in register R48 is incremented and the volt pulse sum in register R44 is subtracted from the thermistor pulse sum times 256 in register R43 until the result is negative. Specifically, the exhaust air temperature register is incremented at step 1553. The volt pulse sum in register R44 is subtracted from the thermistor pulse sum times 256 in register R43. Decision step 1555 loops back to step 1553 until the result is negative. The 8-bit register R48 will roll over from 255 to zero one time during this procedure. The tabulation routine TAB returns to the tumble number routine TNR 1600 at step 1556 with the computed exhaust air temperature as sampled over the most recent drum revolution in register R48. This parameter is available for use by the TRIP routine 1575 to simulate the trip and reset temperatures of high and low temperature operating thermostats which have been replaced by the exhaust air NTC thermistor resistor RS6 by cycling the heater relay 74.

Figure 31:
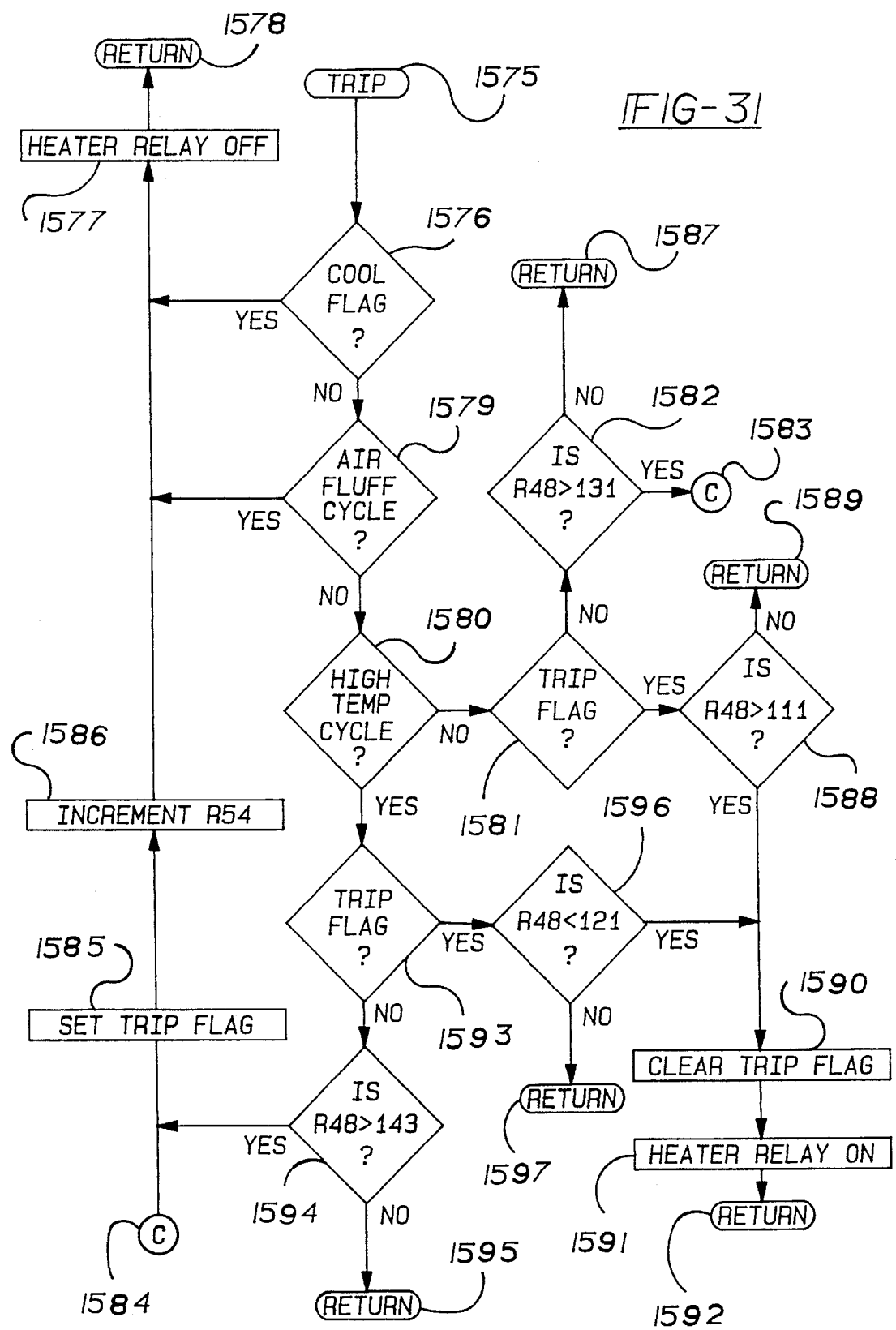
FIG. 31 is a flow chart for the TRIP routine called by the tumble number routine once per each drum revolution to determine whether or not the heater relay should be toggled in accordance with the exhaust air temperature as computed by the tabulation routine, the user cycle selection, and the previous "trip" condition of the heater element.

A flow chart for the TRIP routine 1575 is shown in FIG. 31. The TRIP routine 1575 is called by the tumble number routine TNR 1600 once per each drum revolution to determine whether or not the heater relay 74 should be toggled in accordance with the exhaust air temperature as computed by the tabulation routine TAB 1550, the user cycle selection, and, the previous "trip" condition of the heater 34. The user is free to change the cycle selection at any time before or during the cycle. The preferred embodiment cycle selections are the high temperature cycle 166, the low temperature cycle 168, and, the air fluff cycle which is inferred when inputs 166 and 168 are both HIGH. The heater 34 is not used during the air fluff cycle. The heater 34 is also not used during the cooldown period.

More specifically, the TRIP routine 1575 uses decision step 1576 to branch to step 1577 if the cycle is in the cooldown period. The heater relay 74 is cycled OFF by driving microcomputer output line 182 HIGH at step 1577. The program returns the the tumble number routine TNR 1600 at step 1578. Otherwise, the program falls through to decision step 1579 wherein the program branches to step 1577 as before if the air fluff cycle is active. Otherwise, the program falls through to decision step 1580 wherein the program branches to decision step 1581 if the high temperature cycle flag, controlled by the INPUT routine 1325, is CLEAR. Decision step 1581 branches to decision step 1582 if the trip flag is CLEAR, that is, if the heater 34 has not been cycled OFF by the heater relay 74. Decision step 1582 branches from point "C" at step 1583 to point "C" at step 1584 if the exhaust air temperature in register R48 is greater than 131. The trip flag is set at step 1585 and the heater element trip count in register R54 is incremented at step 1586. The program than cycles the heater relay 74 OFF at step 1577 and returns to the tumble number routine TNR 1600 at step 1578 as before. Otherwise, the exhaust air temperature as not exceeded the low temperature cycle threshold, and the program falls through decision step 1582 to return to the tumble number routine TNR 1600 at step 1587 without affecting the ON status of the heater 34. Otherwise, the trip flag is set, and, the program falls through decision step 1581 to decision step 1588.

The question now is, did the exhaust air temperature fall enough to cycle the heater 34 back ON? If the exhaust air temperature in register R48 is not below 111, the program branches to step 1589 to return to the tumble number routine TNR 1600 without affecting the OFF status of the heater 34. Otherwise, the exhaust air temperature in register R48 has fallen below the RESET threshold for the low temperature cycle and the program falls through decision step 1588 to step 1590. The trip flag is CLEARed at step 1590, and, the heater relay 74 is activated at step 1591 by driving microcomputer output line 182 LOW. The program returns to the tumble number routine TNR 1600 at step 1592 with the heater relay 74 cycled ON. If the high temperature cycle is selected, the program falls through decision step 1580 to decision step 1593. If the trip flag is SET, the heater element is OFF, the heater relay 74 is OPEN, and, the question becomes, has the exhaust air temperature dropped below the RESET threshold for the high temperature cycle? Decision step 1596 branches to step 1597 to return to the tumble number routine TNR 1600 without affecting the OFF status of the heater 34 if the exhaust air temperature in register R48 is less than 121. Otherwise, the program falls through to step 1590. Steps 1590 and 1591 clear the trip flag and activate the heater relay as before. The program is returned to the tumble number routine TNR 1600 at step 1592. If the trip flag at step 1593 is clear, the heater 34 is ON and the program falls through to decision step 1594. The question now becomes, has the exhaust air temperature reached the trip threshold for the high temperature cycle? Decision step 1594 branches to step 1585 if the exhaust air temperature in register R4E is above 143. The trip flag is set and the heater 34 is toggled off (described above). Otherwise, the exhaust air temperature is below the trip threshold and the program falls through decision step 1594 to step 1595 to return to the tumble number routine 1600.

Figure 32:
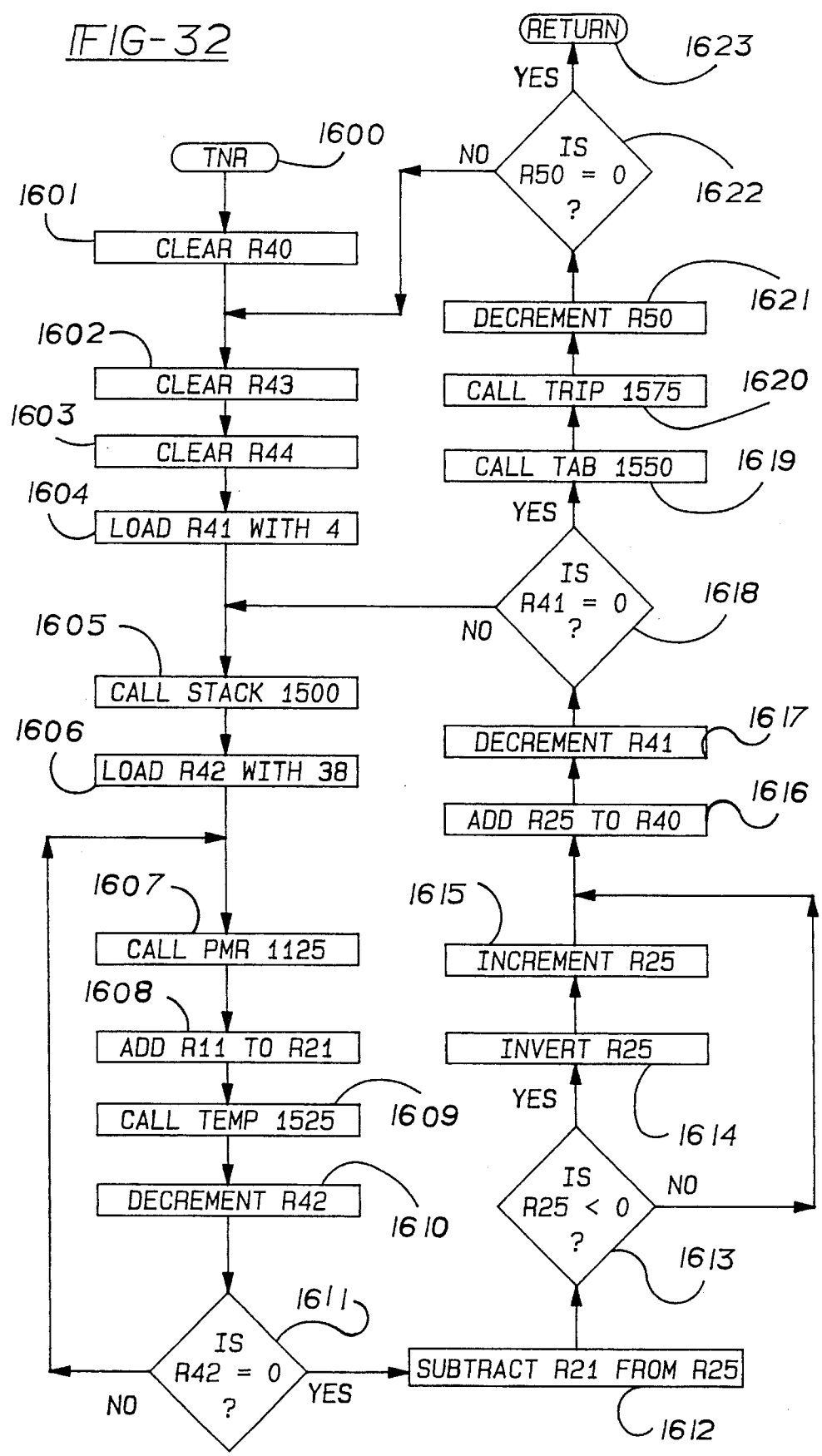
FIG. 32 is a flow chart for the tumble number routine called by the EMPTY routine, the NEXT routine and the COOL routine to accumulate a clothes tumble number responsive to variation in motor torque due to any minute difference in the way that the clothes load is tumbling from one drum revolution to the next revolution, while substantially ignoring cyclical, repetitive variation due to uneven drum rotational friction according to the present invention.

A flow chart for the tumble number routine TNR 1600 is shown in FIG. 32. The tumble number routine TNR 1600 is called by the EMPTY routine 1625, the NEXT routine 1675 and the COOL routine 1825 to accumulate a clothes tumble number in register R40 responsive to the variation in motor 18 torque due to any minute difference in the way that the clothes load is tumbling from one drum revolution to the next revolution; while substantially ignoring cyclical, repetitive variation due to uneven drum rotational friction. Wet clothes tumble more forcibly than dry clothes. When the variation in motor torque due to clothes tumbling is no longer decreasing, the clothes are dry. The tumble number routine TNR 1600 accumulates a clothes tumble number in register R40 over a sample period defined by the calling routine. Other routines such as the VOTE routine 1750, the SLOPE routine 1775 and the TEST routine 1800 interpret the clothes tumble numbers in register R40 provided by the tumble number routine TNR 1600 for the purpose of determining when the clothes load has reached the appropriate, user defined, state of dryness.

More specifically, calling routine has preloaded the tumble number sample time, or drum revolutions, in register R50. The calling routine than calls the tumble number routine TNR 1600. The tumble number routine TNR begins by clearing the clothes tumble number in register R40 at step 1601. The thermistor pulse sum in register R43 is cleared at step 1602. The volt pulse sum in register R44 is cleared at step 1603. An outer loop count register R41 is loaded with four at step 1605. The STACK routine 1500 is called at step 1605 to adjust the data stack of the last five drum sector sums and clear the last drum sector sum in register R21.

An inner loop count register R42 is loaded with a predetermined number, in this case thirty-eight, at step 1606. The number loaded in register R42 reflects the number of samples taken per quadrant of drum rotation, which for the dryer used in prototyping the present invention was approximately 38. Since the dryer rotated at 48 revolutions per minute. It will be appreciated by those skilled in the art that this number may be programmed into the microcomputer 134 or may be determined by calculating this number from the cyclical rotational characteristics of an empty drum.

The phase monitoring routine PMR 1125 is called at step 1607. The phase monitoring routine PMR 1125 returns with the last motor phase number in register R11 and the last volt or thermistor pulse number in register R16. The last motor phase number in register R11 is added to the last drum sector sum in register R21 at step 1608. The TEMP routine 1525 is called at step 1609 to add the last thermistor or volt pulse number in register R16 to the thermistor or volt pulse sum in register R43 or R44, respectively. The inner count number in register R42 is decremented at step 1610. This count defines the approximate time for the drum to traverse one quarter of a revolution. Decision step 1611 loops back to step 1607 until the inner loop count has been decremented to zero whereupon the program falls through to step 1612. Program steps 1612, 1613, 1614, 1615 and 1616 are used to compute and add the absolute value of the difference between the last and the fifth last drum sector sum to the clothes tumble number in register R40.

Specifically, the last drum sector sum in register R21 is subtracted from the fifth last drum sector sum in register R25 with the difference in register R25. Decision step 1613 branches directly to step 1616 if the result is positive or zero. Otherwise, the result in register R25 is inverted at step 1614 and incremented at step 1615 to convert the difference to an absolute value. The absolute value of the difference between the last and the fifth last drum sector sums in register R25 is added to the clothes tumble number in register R40. The outer loop count in register R41 is decremented at step 1617. Decision step 1618 branches back to step 1605 for the next drum sector sum if the outer loop count in register R41 has not been decremented to zero. Otherwise, the program falls through to step 1619 wherein the tabulation routine TAB 1550 is called to tabulate the average exhaust air temperature in register R48 using the thermistor and volt pulse sums in registers R43 and R44 accumulated by the TEMP routine 1525 over the previous drum revolution. The TRIP routine 1575 is called at step 1620 to determine whether the heater relay 74 should be toggled as per the exhaust air temperature computed by the tabulation routine TAB 1550, the user cycle selection, and, the present trip status of the heater 34. The tumble number routine sample time in register R50 is decremented at step 1621. Decision step 1622 branches back to step 1602 for the next drum revolution until the sample time in register R50 has been decremented to zero whereupon the tumble number routine TNR 1600 returns to the calling routine at step 1623 with the clothes tumble number in register R40.

Figure 33:
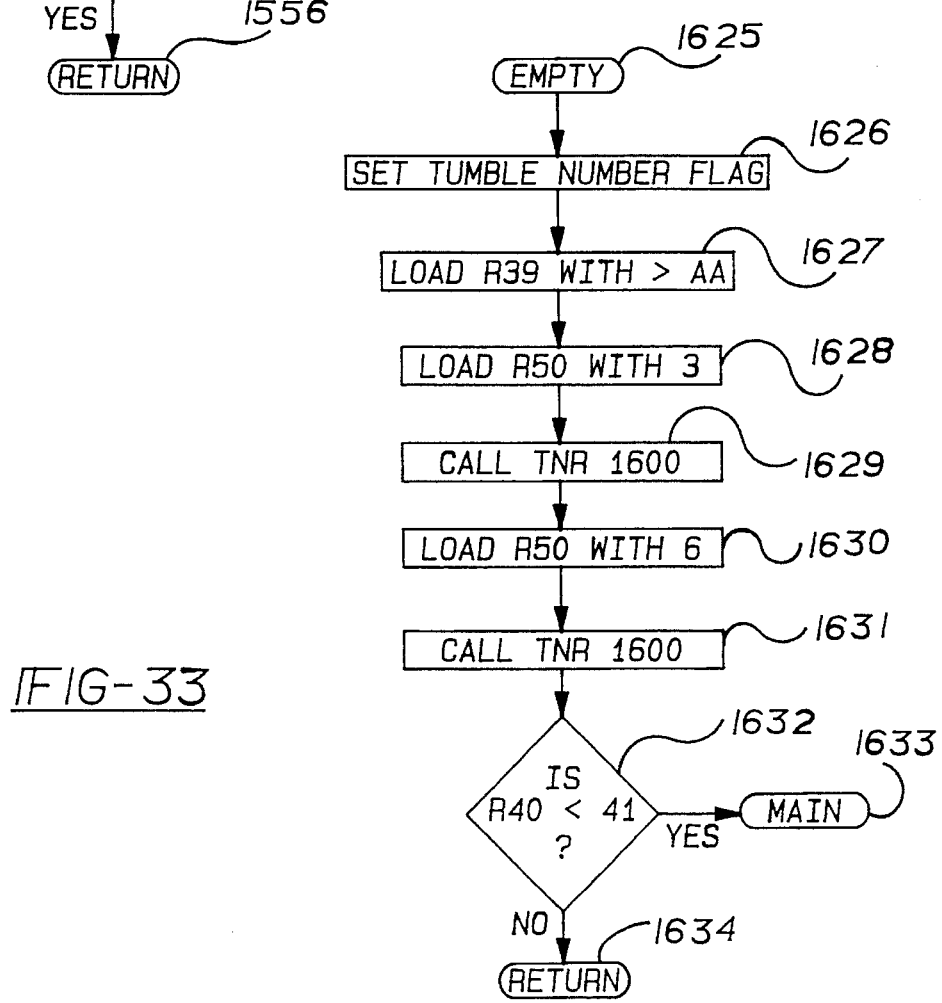
FIG. 33 is a flow chart for the EMPTY routine called by the MAIN program at the start of each cycle, immediately after identifying the service voltage, to abort the cycle if the drum is empty.

A flow chart for the EMPTY routine 1625 is shown in FIG. 33. The EMPTY routine 1625 is called by the MAIN program 1000 at the start of each cycle, immediately after identifying the service voltage, to abort the cycle if the drum is empty. The EMPTY routine 1625 calls the tumble number routine TNR 1600 a first time to load the drum sector sum data stack, and, a second time to determine whether the resulting clothes tumble number is large enough to indicate that there is at least one wet clothes item tumbling in the drum.

More specifically, the EMPTY routine 1625 SETs the tumble number flag at step 1626. The tumble number flag is used by the BELT routine 1225 to decide where to place the program in the event that a broken belt is detected. The volt/thermistor pulse sequence register R39 is loaded with alternating ONEs and ZEROs at step 1627 to define the sequence of volt pulse and thermistor pulse samples for the remainder of the cycle; two consecutive volt pulses followed by two consecutive thermistor pulses. The tumble number sample time register R50 is loaded with three at step 1628. The tumble number routine TNR 1600 is called a first time at step 1629 to purge bad data and load current data in the drum sector sum data stack, and, to allow a few seconds for secondary effects due to the heater 34 startup transient to dissipate. The tumble number sample time register R50 is loaded with six at step 1630. The tumble number routine TNR 1600 is called a second time at step 1631. The tumble number routine TNR 1600 returns with good information in the clothes tumble number register R40. Decision step 1632 branches at step 1633 to the MAIN program 1000 at step 1002 to terminate the present cycle if the clothes tumble number in register R40 is less than forty-one. Hence, the cycle is aborted because there are no wet clothes in the drum. Otherwise, the program falls through to step 1634 to return to the MAIN program 1000.

It will be apparent to those skilled in the art that the EMPTY routine 1625 could alternatively be used to infer the presence of a stationary drying rack. Instead of aborting the cycle as shown at step 1633, an alternative dryness detection procedure such as taught by U.S. Pat. No. 3,203,679 could be used to complete the cycle.

Figure 34:
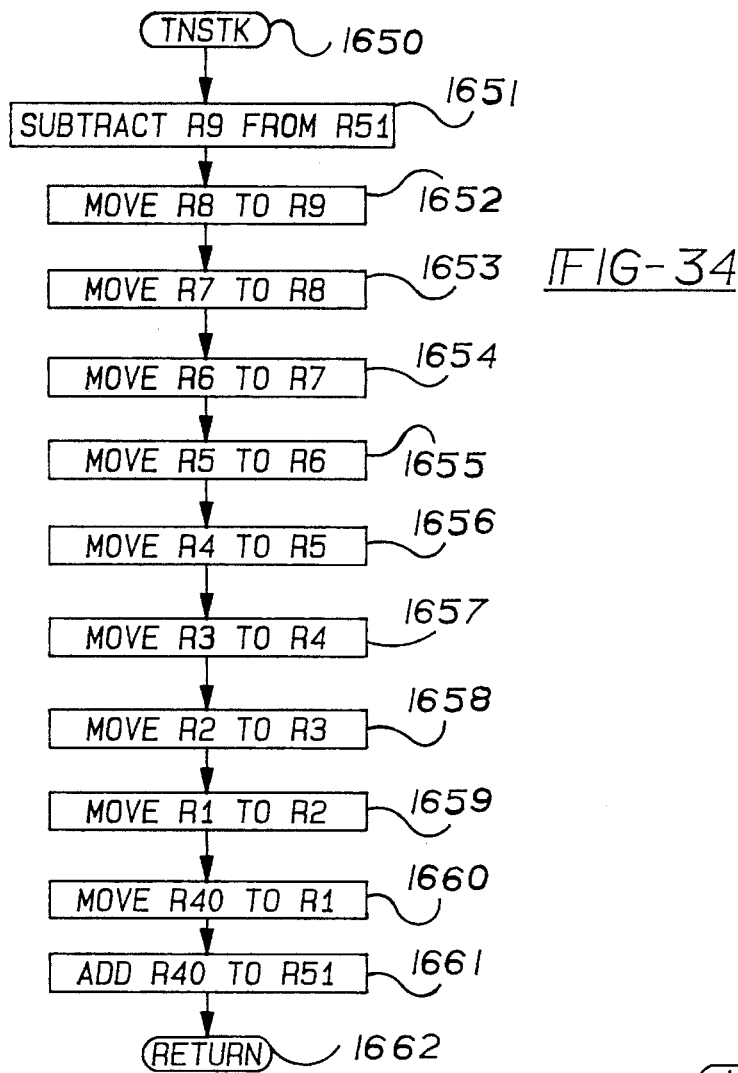
FIG. 34 is a flow chart for the tumble number stack routine called by the NEXT routine to adjust the data stack of the last nine clothes tumble numbers, to load the newest clothes tumble number onto the stack and to maintain a sum of the entire data stack.

A flow chart for the tumble number stack routine TNSTK 1650 is shown in FIG. 34. The tumble number stack routine TNSTK 1650 is called by the NEXT routine 1675 to adjust the data stack of the last nine clothes tumble numbers, load the newest clothes tumble number onto the stack, and, maintain a sum of the entire data stack in register R51. The clothes tumble number data stack is used by the SLOPE routine 1775 to compute the slope of the last six, seven, eight and nine clothes tumble numbers for the purpose of detecting whether or not the clothes tumble numbers are generally decreasing.

More specifically, the oldest clothes tumble number on the stack in register R9 is subtracted from the data stack sum in register R51 at step 1651. The old eighth last clothes tumble number in register R8 becomes the new ninth last clothes tumble number at step 1652. The old seventh last clothes tumble number in register R7 becomes the new eighth last clothes tumble number in register R8 at step 1653. The old sixth last clothes tumble number in register R6 becomes the new seventh last clothes tumble number in register R7 at step 1654. The old fifth last clothes tumble number in register R5 becomes the new sixth last clothes tumble number in register R6 at step 1655. The old fourth last clothes tumble number in register R4 becomes the new fifth last clothes tumble number in register R5 at step 1656. The old third last clothes tumble number in register R3 becomes the new fourth last clothes tumble number in register R4 at step 1657. The old second last clothes tumble number in register R2 becomes the new third last clothes tumble number in register R3 at step 1658. The old last clothes tumble number in register R1 becomes the new second last clothes tumble number in register R2 at step 1659. And, the latest clothes tumble number in register R40 becomes the new last clothes tumble number in register R1 at step 1660. The last clothes tumble number in register R40 is added to the tumble number data stack sum in register R51 at step 1661.

The program returns to the NEXT routine 1675 at step 1662 with the last nine clothes tumble numbers in registers R1 through R9, respectively, and, the sum of all nine clothes tumble numbers in register R51. Of course, the tumble number data stack is not full until the tumble number stack routine TNSTK 1650 has been called nine or more times in any cycle.

Figure 35:
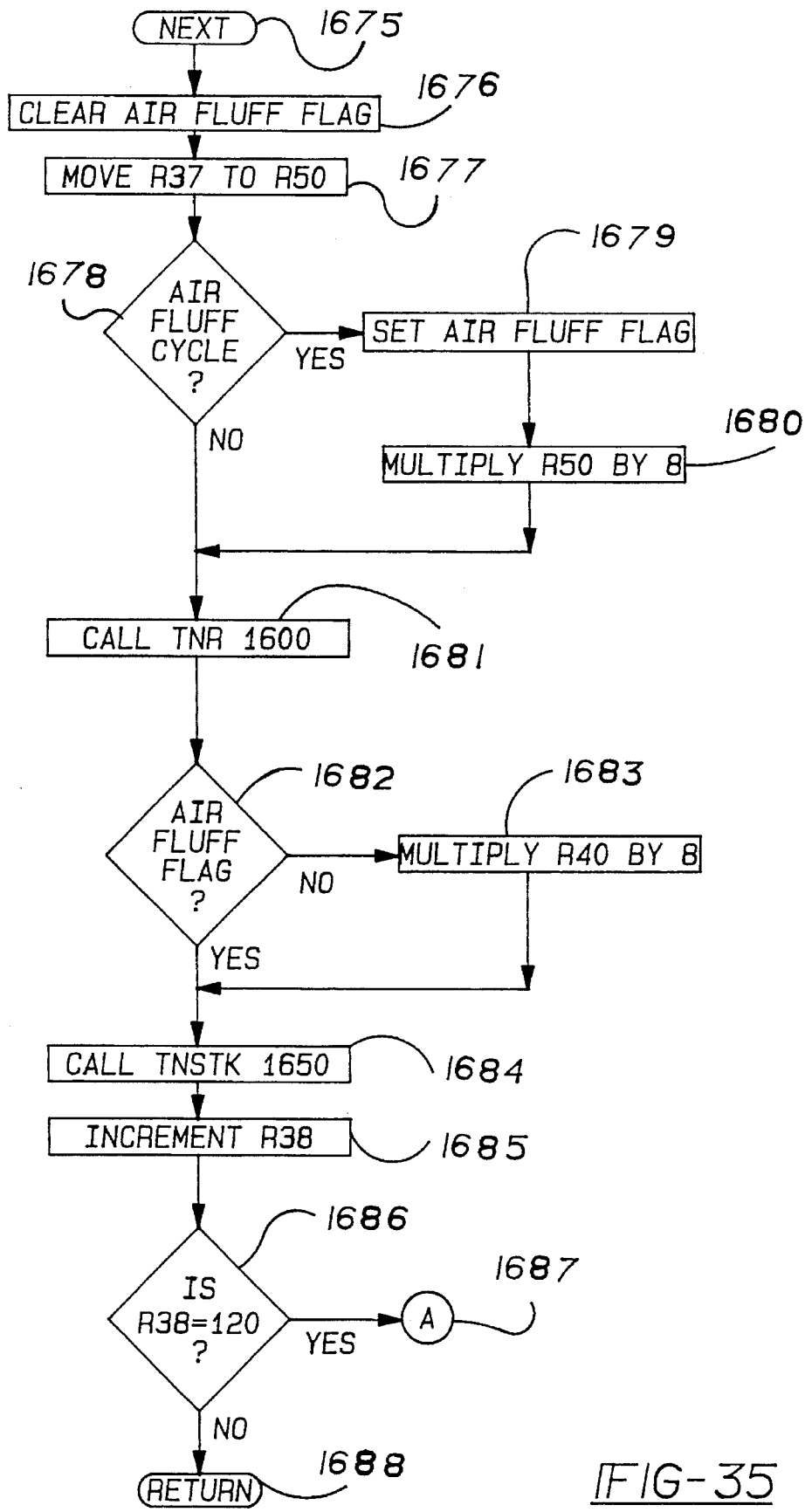
FIG. 35 is a flow chart for the NEXT routine called by the LOAD routine, DAMP routine, and the TEST routine to call the tumble number routine and the tumble number stack routine once per each pass.

A flow chart for the NEXT routine 1675 is shown in FIG. 35. The NEXT routine 1675 is called by the LOAD routine 1700, the DAMP routine 1725, and, the TEST routine 1800 to perform common program steps required by each routine. The NEXT routine 1675 calls the tumble number routine TNR 1600 and the tumble number stack routine TNSTK 1650 once per each pass.

More specifically, the NEXT routine 1675 CLEARs the air fluff flag at step 1676, momentarily anticipating that the air fluff cycle has not been involved by the user. The tumble sample time in register R37 is loaded in the tumble number routine sample time register R50 at step 1677. The tumble sample time in register R37 was defined by the volt routine 1460 at the start of the present cycle. Decision step 1678 branches directly to step 1681 if the air fluff cycle is not active. Otherwise, the air fluff cycle is presently active, the heater 34 is OFF, the clothes load is drying slowly, and, the program falls through to step 1679. The air fluff cycle flag is set at step 1679, and, the tumble number routine sample time in register R50 is multiplied by eight to take into account the longer anticipated clothes drying time when the electric resistance heater 34 is not used. The tumble number routine TNR 1600 is called at step 1681. The tumble number routine returns with a clothes tumble number in register R40. Decision step 1682 branches to step 1683 if the air fluff flag is not SET. The last clothes tumble number in register R40 is multiplied by eight at step 1683. If it were not for program steps 1682 and 1683, clothes tumble numbers accumulated while the air fluff cycle is active would be approximately eight times larger than clothes tumble numbers accumulated while a heat dry cycle is active because the air fluff sample time is eight times longer than the heat dry sample time.

Now, the user is free to change the cycle selection at any time during the cycle. Hence, the heat dry clothes tumble numbers are scaled up by a factor of eight by program steps 1682 and 1683 so that the data stack of the last nine clothes tumble numbers in registers R1 through R9 will be valid in the event of one or more user cycle changes during a clothes drying cycle.

The tumble number stack routine TNSTK 1650 is called at step 1684 to adjust the data stack of the last nine clothes tumble numbers, load the last clothes tumble number onto the stack, and, maintain a sum of all nine numbers on the stack. The cycle time in register R38 is incremented at step 1685. Decision step 1686 advances the present cycle to the cooldown period by branching from point "A" at step 1687 to point "A" at step 1024 of the MAIN program 1000 if the cycle time limit in register has been incremented to 120. Otherwise, the NEXT routine 1675 returns to the calling routine at step 688 with the stack of the last nine clothes tumble numbers adjusted, the last clothes tumble number loaded onto the stack, and, the sum of all nine clothes tumble numbers in register R51.

Figure 36:
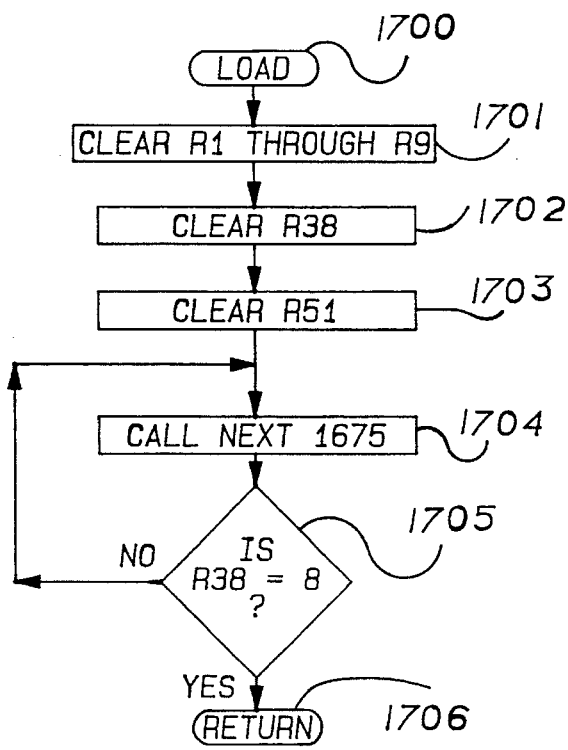
FIG. 36 is a flow chart for the LOAD routine called by the MAIN program at the start of each cycle immediately after determining that the drum is not empty to initialize parameters and loop through the NEXT routine eight times, such that the next pass through the NEXT routine will fully load the data stack of the last nine clothes tumble numbers.

A flow chart for the LOAD routine 1700 is shown in FIG. 36. The LOAD routine 1700 is called by the MAIN program 1000 at the start of each cycle, immediately after determining that the drum is not empty, to initialize parameters and loop through the NEXT routine 1675 eight times, such that the next pass through the NEXT routine 1675 will fully LOAD the data stack of the last nine clothes tumble numbers.

More specifically, the LOAD routine 1700 clears registers R1 through R9 at step 1701. Thus, the last through the ninth last clothes tumble number in registers R1 through R9 are cleared. This step is necessary to facilitate code efficient computation of the sum of all nine clothes tumble numbers, R1 through R9, by the tumble number stack routine TNSTK 1650. The cycle time in register R38 is cleared at step 1702. The data stack sum of all nine clothes tumble numbers in register R51 is cleared at step 1703. The NEXT routine 1675 is called at step 1704 to call the tumble number routine TNR 1600, the tumble number stack routine TNSTK 1650, and, increment the cycle time in register R38. Decision step 1705 loops back to step 1704 until the cycle time in register R38 has been incremented to eight; whereupon, the program falls through to step 1706 to return to the MAIN program 1000. The microcomputer data memory stack of the last nine clothes tumble numbers will be fully loaded with the next calling of the NEXT routine 1675 by the DAMP routine 1725.

Figure 37:
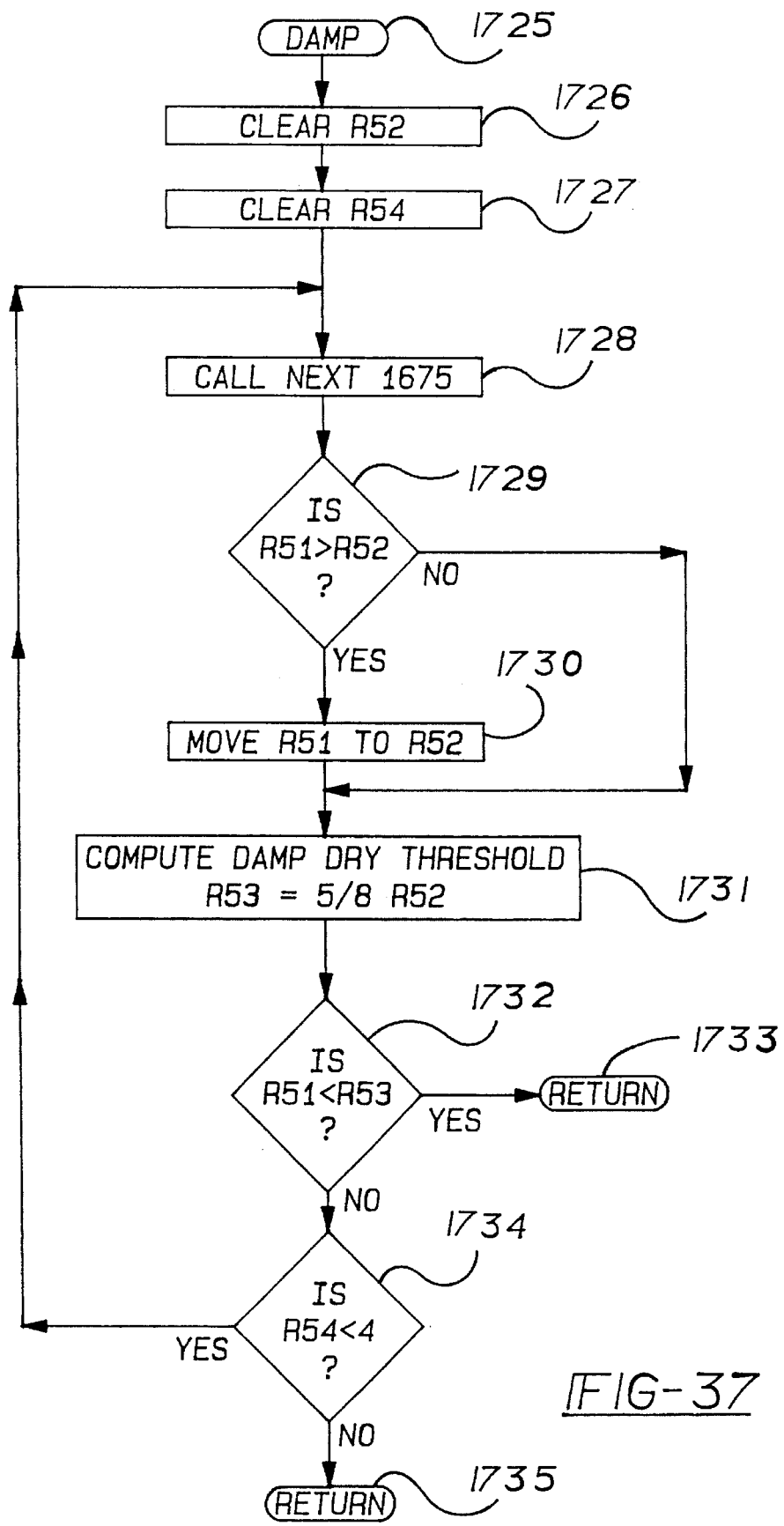
FIG. 37 is a flow chart for the DAMP routine called by the MAIN program after loading the data stack of the last nine clothes tumble numbers to return to the MAIN program when the clothes are damp dry and ready for ironing.

A flow chart for the DAMP routine 1725 is shown in FIG. 37. The DAMP routine 1725 is called by the MAIN program 1000 after loading the stack of the last nine clothes tumble numbers. The DAMP routine 1725 returns to the MAIN program 1000 when the clothes are damp dry and ready for ironing. The DAMP routine 1725 loops repeatedly through the NEXT routine 1675 and returns to the MAIN program 1000 when the sum of the last nine clothes tumble numbers in register R51 drops below a threshold referenced from the maximum tumble number stack sum in register R52, or, when the heater relay has cycled four times, whichever comes first.

More specifically, the DAMP routine 1725 clears the maximum tumble number stack sum in register R52 at step 1726. The heater trip count in register R54 is cleared at step 1727. The NEXT routine 1675 is called at step 1728 to call the tumble number routine TNR 1600, the tumble number stack routine TNSTK 1650, and, increment the cycle time in register R38. The NEXT routine 1675 returns to the DAMP routine 1725 with the sum of all nine clothes tumble numbers, R1 through R9, in register R51. Decision step 1729 branches to step 1731 if the sum of the last nine clothes tumble numbers in register R51 is not greater than the maximum tumble number stack sum in register R52. Otherwise, the program falls through to step 1730 wherein the new maximum sum is moved from register R51 to register R52. Note that the program will always fall through to step 1730 on the first pass because register R52 was cleared at step 1726. A damp dry threshold is computed at step 1731 in register R53. The damp dry threshold is five eighths of the maximum tumble number stack sum in register R52. This fraction is computed approximately by moving the number in register R52 to register R53; dividing the number in register R53 by two, three times; and adding the result to register R52 four times.

Decision step 1732 returns to the MAIN program 1000 at step 1733 with the clothes load in a damp dry condition if the sum of the last nine clothes tumble numbers in register R51 is below the damp dry threshold in register R53. Otherwise, the program falls through to decision step 1734 wherein the program loops back to step 1728 if the heater element trip count in register R54 is less than four. Furthermore, the program returns to the MAIN program 1000 at step 1735 with the clothes load in a damp dry condition. The clothes tumble numbers generally decrease throughout the cycle as the clothes load becomes progressively more dry. Using the sum of all nine numbers on the clothes tumble number stack to define and test for a damp dry condition provides some beneficial averaging to avoid the possibility that one unusually low data point will cause a premature declaration that the clothes load has reached the damp dry condition. For very small clothes loads, the threshold may not be reached until the clothes load has dryed beyond the damp dry point, hence, the number of heater cyclings is also tested.

A flow chart for the VOTE routine 1750 is shown in FIG. 38. The VOTE routine 1750 is called four times by the SLOPE routine 1775 to vote for or against the clothes load being dry by adding or subtracting from a dry count in register R55. The decisions are based on whether the slope of the last six, seven, eight or nine clothes tumble numbers is increasing or decreasing, respectively.

More specifically, the VOTE routine 1750 branches to step 1753 if the slope number in register R56 is positive. The dry count in register R55 is decremented at step 1753 because a positive slope number indicates that the clothes tumble numbers are still generally decreasing and the clothes load is not dry. Otherwise, the slope number is zero or negative and the program falls through to step 1752 wherein the slope number in register R55 is incremented by two. The program returns to the SLOPE routine 1775 at step 1754 with the slope number in register R55 either incremented by two if the clothes load is dry, or, decremented by one if the clothes load is still wet.

A flow chart for the SLOPE routine 1775 is shown in FIG. 39. The SLOPE routine 1775 is called by the TEST routine 1800 to compute the slope of the last six, seven, eight or nine clothes tumble numbers on the clothes tumble number data stack, and, to call the VOTE routine 1750 immediately after each computation to vote for or against the clothes load being dry in accordance with whether the computed slope is negative or positive, respectively. More specifically, the SLOPE routine 1775 computes a first slope number in register R56 using the last six clothes tumble numbers in registers R1 through R6. The first slope number in register R56 is the sixth last clothes tumble number in register R6, plus the fifth last clothes tumble number in register R5, plus the fourth last clothes tumble number in register R4, minus the third last clothes tumble number in register R3, minus the second last clothes tumble number in register R2, minus the last clothes tumble number in register R1. The VOTE routine 1750 is called at step 1777 to decrement the dry count in register R55 if the slope number in register R56 is positive, or, the increment the dry count in register R55 otherwise. Similarly, a new slope number is computed at step 1778 using the last seven clothes tumble numbers with the exception of the fourth last clothes tumble number in register R4. The VOTE routine 1750 is called again at step 1779 to vote for or against the clothes load being dry based on the slope of the last seven clothes tumble numbers. A new slope number is computed at step 1780 using the last eight clothes tumble numbers.

The VOTE routine 1750 is called again at step 1781 to vote for or against the clothes load being dry based on the slope of the last eight clothes tumble numbers. A new slope number is computed at step 1782 using the entire stack of the last nine clothes tumble numbers with the exception of the fifth last clothes tumble number in register R5. The VOTE routine 1750 is called again at step 1783 to vote for or against the clothes load being dry based on the slope of the last nine clothes tumble numbers. Note that this procedure emphasizes the more recent data on the clothes tumble number data stack and progressively de-emphasizes the older numbers on the stack. This results in rapid detection of a clothes dryness condition without false, or premature, declaration of a state of dryness. Decision step 1784 branches to step 1786 if the dry count is not negative. Otherwise, the dry count is negative and the program falls through to step 1785 wherein the dry count in register R55 is cleared. In other words, the dry count in register R55 is not permitted to decrease below zero. The SLOPE routine 1775 returns to the TEST routine 1800 with the dry count in register R55 at step 1786.

Figure 40:
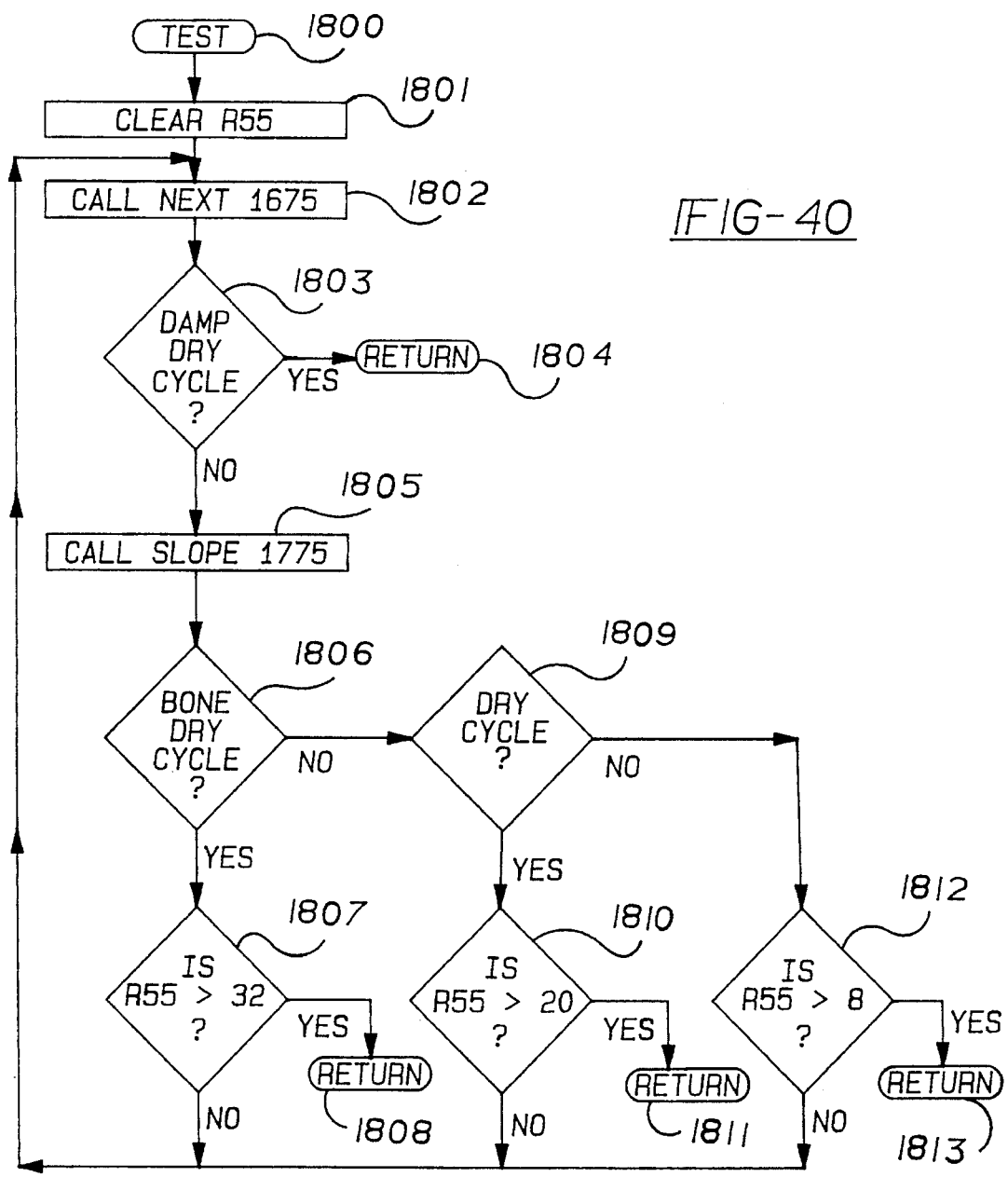
FIG. 40 is a flow chart for the TEST routine called by the MAIN program immediately after the clothes load has been determined to have reached the damp dry condition to determine when the clothes load is dry in accordance with the user dryness selection, that is, when a dry count maintained in data memory exceeds a threshold defined by the user dryness selection.

A flow chart for the TEST routine 1800 is shown in FIG. 40. The TEST routine 1800 is called by the MAIN program 1000, immediately after the clothes load has been determined to have reached the damp dry condition, to determine when the clothes load is dry in accordance with the user dryness selection. The TEST routine 1800 loops repeatedly through the NEXT routine 1675 and the SLOPE routine 1775, and, returns to the MAIN program 1000 when a dry count maintained in register R55 exceeds a threshold defined by the user dryness selection. The user may change the dryness selection at any time before, or during, the cycle.

More specifically, the TEST routine 1800 clears the dry count in register R55 at step 1801. The NEXT routine 1675 is called at step 1675 to call the tumble number routine TNR 1600, the tumble number stack routine TNSTK 1650, and, increment the cycle time in register R38. Decision step 1803 branches to return to the MAIN program 1000 at step 1804 in the event that the user has changed the cycle selection to the damp dry cycle. It is likely that the clothes load has already passed the normal damp dry condition, however, this is the best that can be done under the conditions. Otherwise, the program falls through to step 1805 wherein the SLOPE routine 1775 is called to compute the slope of the last six, seven, eight or nine clothes tumble numbers on the clothes tumble number data stack, register R1 through R9, and, to call the VOTE routine 1750 immediately after each computation to vote for or against the clothes load being dry in accordance with whether the computed slope is negative or positive, respectively.

Decision step 1806 falls through to step 1807 if the user has selected the bone dry cycle wherein the program branches back to the MAIN program 1000 at step 1808 if the dry count in register R55 is greater than thirty-two. Otherwise, the program loops back to step 1802 for the next calling of the NEXT routine 1675. If the bone dry cycle is not active, decision step 1806 branches to decision step 1809 wherein the program falls through to decision step 1810 if the dry cycle is active. Decision step 1810 branches back to the MAIN program 1000 at step 1811 if the dry count in register R55 is greater than twenty. Otherwise, the program loops back to step 1802 for the next calling of the NEXT routine 1675. If the dry cycle is not active, the less dry cycle is implied, and, decision step 1809 branches to decision step 1812 wherein the program branches back to the MAIN program 1000 at step 1813 if the dry count in register R55 is greater than eight. Otherwise, the program loops back to step 1802 for the next calling of the NEXT routine 1675. Note that more than three different states of dryness could be provided by using more user defined dryness inputs 156 on the console 14. The TEST routine 1800 returns to the MAIN program 1000 with the clothes load at the user defined state of dryness, and, ready for the cooldown period.

A flow chart for the COOL routine 1825 is shown in FIG. 41. The COOL routine 1825 is called by the MAIN program 1000 after the TEST routine 1800 has determined that the clothes load is dry, or, after the DAMP routine 1725 has determined that the clothes load is damp dry for a damp dry cycle selection. The COOL routine 1825 provides a clothes cooldown period with the motor 18 ON and the heater 34 OFF. The cooldown period lasts until the exhaust air temperature is no longer decreasing, the exhaust air temperature is below 63 degrees, or, a maximum time limit has expired; whichever comes first. Also, the COOL routine 1825 provides a minimum cooldown time. And, to prevent excessive clothes load moisture regain during the cooldown period, the time that the COOL routine 1825 waits for a new minimum exhaust air temperature, before terminating the cycle is determined by the user dryness cycle selection with the shortest wait time in the bone dry cycle.

More specifically, the COOL routine 1825 cycles the heater relay 74 OFF at step 1826 by driving the microcomputer output line 182 HIGH. The cooldown time register R57 is cleared at step 1827. The minimum cooldown temperature in register R58 is loaded with a very high number at step 1828. The tumble number routine sample time register R50 is loaded with ONE at step 1829. The cool flag is SET at step 1830 to inhibit the TRIP routine 1575 when the tumble number routine TNR 1600 is called for one drum revolution at step 1831. The tumble number routine TNR 1600 returns with the average exhaust air temperature for the previous drum revolution in register R48. The cool flag is CLEARed at step 1832 so that the COOL routine 1825 will eventually return to the MAIN program 1000 with the cool flag CLEAR. Decision step 1833 compares the exhaust air temperature in register R48 to the previous minimum exhaust air temperature in register R58. If the exhaust air temperature in register R48 is less than the previous minimum exhaust air temperature in register R58, decision step 1833 branches to step 1834 wherein the cool trip time in register R59 is cleared. The new minimum exhaust air temperature in register R48 is moved to register R58 at step 1835. Otherwise, a new minimum exhaust air temperature has not occurred and the program falls through to step 1836 wherein the cool trip time in register R59 is incremented. The cooldown time in register R57 is incremented at step 1837. Decision step 1838 loops back to step 1829 to define a minimum cooldown time if the cooldown trip time in register R57 is less than ninety-six.

Otherwise, the program falls through to decision step 1839 wherein the program branches back to the MAIN program at step 1840 if the exhaust air temperature in register R48 is below 63 degrees. Otherwise, the program falls through to decision step 1841 which defines a maximum cooldown time. Decision step 1841 branches back to the MAIN program 1000 at step 1842 if the cooldown time in register R57 is greater than 720. The cooldown time number in register R57 represents the number of drum revolutions during the cooldown period. Otherwise, the program falls through decision step 1841 to decision step 1843 wherein the program branches to decision step 1844 if the user has selected the bone dry cycle. Decision step 1844 branches back to the MAIN program 1000 if the cool trip time in register R59 is greater than eleven. Otherwise, the program loops back to step 1829 for the next exhaust air temperature sample. If the user has not selected the bone dry cycle, the program falls through decision step 1843 to decision step 1846 wherein the program branches to decision step 1847 if the user has selected the dry cycle. Decision step 1847 branches back to the MAIN program 1000 if the cool trip time in register R59 is greater than twenty-three, that is, if the drum has made twenty-three revolutions without establishing a new minimum exhaust air temperature. Otherwise, the program loops back to step 1829 for the next exhaust air temperature sample. If the user has not selected the dry cycle, the less dry cycle is implied and the program falls through decision step 1846 to decision step 1848 wherein the program branches back to the MAIN program 1000 if the cool trip time in register R59 is greater than thirty-five. Otherwise, the program loops back to step 1829 for the next exhaust air temperature sample. Thus, the cooldown time tends to be shorter in the bone dry cycle than the dry cycle, and, shorter in the dry cycle than the less dry cycle, to minimize moisture regain when the user has selected a cycle requiring a high degree of moisture removal from the clothes. The MAIN program 1000 than calls the END routine 1350 at step 1002 to terminate the cycle and the START routine 1375 at step 1004 to wait for the user to activate the next cycle.

Table I shows data for a bone dry, high temperature cycle with a clothes load comprising four large cotton towels. The cycle time in register R38 is shown in the first column. The corresponding clothes tumble number in register R40 is shown in the second column. The data stack sum of all nine clothes tumble numbers in register R51 is shown in the third column, where available. The dry count in register R55 is shown in the fourth column beginning with data processed by the TEST routine 1800. The first eight clothes tumble numbers were processed by the LOAD routine 1700. With the next calling of the tumble number routine TNR 1600 by the DAMP routine 1725 at data point nine, the data stack of the last nine clothes tumble numbers was fully loaded. Note that a maximum clothes tumble number of 16166 occurred at the third data point. This is not unusual because a couple minutes of tumbling are often required for the clothes load to spread out, or untangle, from having been transferred from the washer to the dryer. The first stack sum in register R51 at data point nine also happen to be the maximum stack sum in register R52 for this cycle. This established a damp threshold of approximately five eights of 137615, or 86005, for this cycle. The sum of all nine clothes tumble numbers in register R51 did not drop below the damp threshold of 86005 until the twenty-seventh data point whereupon the DAMP routine 1725 returned to the MAIN program 1000. At data point twenty-eight the TEST routine 1800 begins to accumulate a dry count in register R55. However, the first non-zero dry count in register R55 did not occur until the forty-sixth data point. The less dry cycle would have been advanced to the cooldown period at point fifty-three whereupon the dry count in register R55 exceeded the less dry cycle threshold of eight for the first time. The dry cycle would have been advanced to the cooldown period at point fifty-four whereupon the dry count in register R55 exceeded the dry cycle threshold of twenty for the first time. However, this was the bone dry cycle, and, the bone dry cycle dry count threshold of thirty-two was not exceeded until the sixtieth data point. Note that the bone dry cycle was almost advanced to the cooldown period at data point fifty-six were it not for an exceptionally low clothes tumble number of 3318. Note that the last two clothes tumble numbers of 4132 and 4031 are significantly larger than the previous numbers. This is because some of the clothes load had overdryed whereupon the clothes stiffen somewhat, and, the resulting clothes tumble numbers show more motor torque variation. After all, this was the bone dry cycle. Note that the minimum clothes tumble number of 3318 at data point fifty-six was 4.8 times less than the maximum clothes tumble number of 16166 at data point three. By contrast, the decrease in the long-term average motor torque throughout a similar cycle is only thirty percent. Hence, the present technique for processing motor phase information to infer clothes load dryness is considerably more sensitive than the algorithm disclosed in Bashark I.

TABLE I

| CYCLE TIME | TUMBLE NUMBER | STACK SUM | DRY COUNT |
|---|---|---|---|
| 1 | 15687 | | |
| 2 | 15769 | | |
| 3 | 16166 | | |
| 4 | 15561 | | |
| 5 | 15721 | | |
| 6 | 15538 | | |
| 7 | 14648 | | |
| 8 | 14832 | | |
| 9 | 13693 | 137615 | |
| 19 | 12043 | | |
| 20 | 11796 | | |
| 21 | 10415 | | |
| 22 | 9883 | | |
| 23 | 9119 | | |
| 24 | 7336 | | |
| 25 | 7160 | | |
| 26 | 7717 | | |
| 27 | 6519 | 81988 | |
| 28 | | | 0 |
| 29 | | | 0 |
| 30 | | | 0 |
| 31 | | | 0 |
| 32 | | | 0 |
| 33 | | | 0 |
| 34 | | | 0 |
| 35 | | | 0 |
| 36 | | | 0 |
| 37 | | | 0 |
| 38 | | | 0 |
| 39 | | | 0 |
| 40 | | | 0 |
| 41 | | | 0 |
| 42 | | | 0 |
| 43 | | | 0 |
| 44 | | | 0 |
| 45 | | | 0 |
| 46 | | | 5 |
| 47 | | | 4 |
| 48 | | | 3 |
| 49 | | | 0 |
| 50 | | | 0 |
| 51 | | | 5 |
| 52 | 3347 | | 7 |
| 53 | 3780 | | 15 |
| 54 | 3691 | | 23 |
| 55 | 3369 | | 28 |
| 56 | 3318 | | 27 |
| 57 | 3541 | | 23 |
| 58 | 3475 | | 19 |
| 59 | 4132 | | 24 |
| 60 | 4031 | 32684 | 32 |

A listing of the data memory registers of the microcomputer 134 is shown below. Although the preferred Texas Instruments TMS7040 microcomputer 134 has an 8-bit word size, to avoid unnecessary complication of the preceding flow charts, it has been assumed that the data memory registers have double or triple precision word size capability as needed. Those who are skilled in the art will know how to include the necessary additional program steps to achieve double or triple precision, when necessary with two or three 8-bit data memory registers. And, those who are skilled in the art will recognize opportunities to combine data memory registers which are not used concurrently.

| | DATA MEMORY ALLOCATION |
|---|---|
| R1 | LAST CLOTHES TUMBLE NUMBER |
| R2 | SECOND LAST CLOTHES TUMBLE NUMBER |
| R3 | THIRD LAST CLOTHES TUMBLE NUMBER |
| R4 | FOURTH LAST CLOTHES TUMBLE NUMBER |
| R5 | FIFTH LAST CLOTHES TUMBLE NUMBER |
| R6 | SIXTH LAST CLOTHES TUMBLE NUMBER |
| R7 | SEVENTH LAST CLOTHES TUMBLE NUMBER |
| R8 | EIGHTH LAST CLOTHES TUMBLE NUMBER |
| R9 | NINTH LAST CLOTHES TUMBLE NUMBER |
| R10 | SUM OF THE LAST TWO MOTOR PHASE NUMBERS |
| R11 | LAST MOTOR PHASE NUMBER |
| R12 | SECOND LAST MOTOR PHASE NUMBER |
| R13 | THIRD LAST MOTOR PHASE NUMBER |
| R14 | FOURTH LAST MOTOR PHASE NUMBER |
| R15 | FIFTH LAST MOTOR PHASE NUMBER |
| R16 | LAST VOLT PULSE NUMBER |
| R17 | LAST/FIFTH LAST ABSOLUTE SUM OF DIFFERENCES |
| R18 | COMPARISON COUNT |
| R19 | SAFETY THERMOSTAT SAMPLE REGISTER |
| R20 | SAFETY THERMOSTAT TRIP THRESHOLD |
| R21 | LAST DRUM SECTOR SUM |
| R22 | SECOND LAST DRUM SECTOR SUM |
| R23 | THIRD LAST DRUM SECTOR SUM |
| R24 | FOURTH LAST DRUM SECTOR SUM |
| R25 | FIFTH LAST DRUM SECTOR SUM |
| R26 | OPEN DOOR COUNT |
| R27 | SHORTED HEATER RELAY COUNT |
| R28 | FAULT COUNT REGISTER |
| R29 | NO-FAULT COUNT REGISTER |
| R30 | MOTOR START TIME LIMIT |
| R31 | MINIMUM SUM OF TWO MOTOR PHASE NUMBERS |
| R32 | DRUM TEST TIME |
| R33 | 208 VAC COUNT REGISTER |
| R34 | 240 VAC COUNT REGISTER |
| R35 | OPEN HEATER RELAY COUNT REGISTER |
| R36 | LEADING PHASE COUNT REGISTER |
| R37 | TUMBLE SAMPLE TIME |
| R38 | CYCLE TIME |
| R39 | VOLT/THERMISTOR PULSE SEQUENCE |
| R40 | CLOTHES TUMBLE NUMBER |
| R41 | OUTER LOOP COUNT |
| R42 | INNER LOOP COUNT |
| R43 | THERMISTOR PULSE SUM |
| R44 | VOLT PULSE SUM |
| R45 | LOW TEMPERATURE CYCLE INPUT SAMPLE REGISTER |
| R46 | HIGH TEMPERATURE CYCLE INPUT SAMPLE REGISTER |
| R47 | START BUTTON INPUT SAMPLE REGISTER |
| R48 | EXHAUST AIR TEMPERATURE |
| R49 | LINT SCREEN TRIP THRESHOLD |
| R50 | TUMBLE NUMBER SAMPLE TIME |
| R51 | DATA STACK SUM OF ALL NINE CLOTHES TUMBLE NUMBERS |
| R52 | MAXIMUM TUMBLE NUMBER STACK SUM |
| R53 | DAMP DRY THRESHOLD |
| R54 | HEATER ELEMENT TRIP COUNT |
| R55 | DRY COUNT |
| R56 | SlOPE NUMBER |
| R57 | COOLDOWN TIME |
| R58 | MINIMUM COOLDOWN TEMPERATURE |
| R59 | COOL TRIP TIME |

In summary, the operator of the dryer 10 selects an air temperature and dryness level and starts the dryer by operating the controls on the console 14. Once each half line cycle, the microcomputer 134 runs through the phase monitoring routine 1125 and detects a pulse width indicative of a fixed or variable circuit resistor, a pulse relationship between the motor voltage and the heater current, and, a motor phase angle and determines the status of the clothes, the heater, the dryer drying drum belt. The microcomputer 134 uses the information to make decisions about the duration of cover dryer operation and the of console LED S44 and 46.

The control of the present invention also provides additional features at no extra manufacturing cost by their creative inclusion as additional programming steps. It will be appreciated by those skilled in the art that the circuitry, techniques and logic described above for controlling a dryer may be used in whole or in part to control other types of motors or heaters or to control appliances other than dryers.

The above provides a detailed description of the best mode contemplated for carrying out the present invention at the time of filing the present application by the inventor thereof. It will be appreciated by those skilled in the art that many modifications and variations may be made without departing from the spirit of the invention. For example, the principals of the present invention may be applied to a horizontal axis washing machine. These and other modifications and variations are included within the intended scope of the claims appended hereto.

I claim:

1. A method of detecting temperature of an environment, said method comprising the steps of:

disposing a thermistor in said environment, said thermistor having an unknown resistance value determined by the temperature of the environment;

electrically connecting said thermistor and a circuit resistor having a known resistance value to the inverting input of a comparator;

alternatively supplying a source of DC power to either said thermistor or said circuit resistor in a predetermined sequence for a predetermined period of time;

supplying a full wave rectified signal to the non-inverting input of said comparator;

monitoring a pulse width produced at the output of said comparator at each zero-crossing of the AC line voltage;

accumulating the pulse widths occurring during a predetermined period of time; and processing said information to compare said unknown resistance value of the thermistor to the known resistance value of the circuit resistor by comparison of the said accumulated pulse widths corresponding to said resistor with said accumulated pulse widths corresponding to said thermistor such that the temperature of said environment may be determined from said accumulated pulse widths.

2. A method of claim 1:

wherein said source of DC power comprises a means for converting AC line voltage into DC voltage and further wherein said predetermined time in said step of alternatively supplying said source of DC power to either said thermistor or said circuit resistor comprises at least two consecutive line half cycles of said AC line voltage to eliminate bias due to possible voltage asymmetry between consecutive line half cycles.

3. The method of claim 1 wherein said environment consists of the exhaust air line of a clothes dryer.

4. A temperature measuring device comprising:

a comparator having an inverting input, a non-inverting input, and an output;

a thermistor having an unknown resistance value determined by its temperature, connected to said inverting input of said comparator;

a resistor of known resistance also connected to said inverting input of said comparator;

means for alternatively supplying a source of DC power to said resistor and to said thermistor in a predetermined sequence;

means for supplying a full wave rectified signal to said non-inverting input of said comparator, such that said output of said comparator is a pulse train wherein the relative width of the pulses is determined by the the respective resistance value of said thermistor and said resistor; and means for accumulating output pulse information from said comparator such that the temperature of said thermistor may be determined by comparing the accumulated output pulse information corresponding to said thermistor to the accumulated output pulse information corresponding to said resistor.

5. The device of claim 4:

wherein said source of DC power comprises a means for convening AC line voltage into DC voltage and further wherein said means for alternatively supplying a source of DC power to said resistor and to said thermistor in a predetermined sequence supplies each with the source of DC power for at least two consecutive line half cycles to eliminate bias due to possible voltage asymmetry between consecutive line half cycles.

* * * * *